(12) United States Patent
Basrur et al.

(10) Patent No.: US 12,506,130 B2
(45) Date of Patent: Dec. 23, 2025

(54) DISPLAY DEVICE

(71) Applicant: Samsung Display Co., LTD., Yongin-si (KR)

(72) Inventors: Veidhes Basrur, Yongin-si (KR); Ki Nyeng Kang, Sejong-si (KR); Ock Soo Son, Seoul (KR); Jong Hwan Cha, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 609 days.

(21) Appl. No.: 17/943,297

(22) Filed: Sep. 13, 2022

(65) Prior Publication Data
US 2023/0260981 A1 Aug. 17, 2023

(30) Foreign Application Priority Data
Feb. 11, 2022 (KR) .................. 10-2022-0018216

(51) Int. Cl.
*H01L 25/16* (2023.01)
*H10H 20/831* (2025.01)
(52) U.S. Cl.
CPC ......... *H01L 25/167* (2013.01); *H10H 20/831* (2025.01)
(58) Field of Classification Search
CPC .................... H01L 25/167; H10H 20/831
See application file for complete search history.

(56) References Cited

U.S. PATENT DOCUMENTS

| 11,120,739 B2 * | 9/2021 | Cho ............... H10H 20/825 |
| 11,798,926 B2 | 10/2023 | Ryu et al. | |
| 2014/0292622 A1 | 10/2014 | Lee | |
| 2020/0013841 A1 * | 1/2020 | Lee ............... H10K 59/131 |
| 2021/0242381 A1 * | 8/2021 | Lee ............... H01L 25/0753 |
| 2021/0335892 A1 * | 10/2021 | Lee ............... H10K 59/38 |

(Continued)

FOREIGN PATENT DOCUMENTS

| KR | 10-2021-0008252 | 1/2021 |
| KR | 10-2021-0098313 | 8/2021 |

(Continued)

*Primary Examiner* — Samuel Park
*Assistant Examiner* — Andrew John Zabel
(74) *Attorney, Agent, or Firm* — Womble Bond Dickinson (US) LLP

(57) ABSTRACT

A display device includes first group electrodes and the second group electrodes spaced apart from second group electrodes in a first direction, respectively, light emitting elements disposed on the first group electrodes and the second group electrodes, a first connection electrode and a second connection electrode disposed on the first group electrodes and extending in the first direction, a third connection electrode and a fourth connection electrode disposed on the first group electrodes and the second group electrodes and extending in the first direction, and a fifth connection electrode disposed on at least two electrodes of the second group electrodes and spaced apart from the first connection electrode and the second connection electrode in the first direction. Each of the first connection electrode, the second connection electrode, and the fifth connection electrode is disposed between the third connection electrode and the fourth connection electrode in a second direction.

17 Claims, 25 Drawing Sheets

(56) References Cited

U.S. PATENT DOCUMENTS

| | | | | |
|---|---|---|---|---|
| 2021/0359167 | A1* | 11/2021 | Lee | H10H 29/142 |
| 2021/0366888 | A1 | 11/2021 | Kim et al. | |
| 2021/0384252 | A1* | 12/2021 | Lee | H10D 30/6755 |
| 2021/0391503 | A1* | 12/2021 | Lee | H10H 20/857 |
| 2022/0052031 | A1* | 2/2022 | Kang | H01L 24/24 |
| 2022/0093652 | A1* | 3/2022 | Park | H10D 86/451 |
| 2022/0140196 | A1* | 5/2022 | Kim | H10H 20/857 |
| | | | | 257/79 |
| 2022/0149079 | A1* | 5/2022 | Kang | H10D 86/60 |
| 2022/0149244 | A1* | 5/2022 | Lee | H10H 20/8316 |
| 2022/0157917 | A1* | 5/2022 | Park | H10K 59/1213 |
| 2022/0158052 | A1* | 5/2022 | Lee | H10H 20/01 |
| 2022/0158054 | A1* | 5/2022 | Cha | H10H 20/857 |
| 2022/0173158 | A1* | 6/2022 | Lee | G09G 3/32 |
| 2022/0189939 | A1* | 6/2022 | Lee | H10D 86/441 |
| 2022/0208936 | A1* | 6/2022 | Kim | H10K 59/353 |
| 2022/0278173 | A1* | 9/2022 | Kong | H10K 59/38 |
| 2022/0384402 | A1* | 12/2022 | Lee | H01L 24/82 |
| 2023/0045654 | A1* | 2/2023 | Moon | H10D 86/481 |
| 2023/0057723 | A1* | 2/2023 | Li | H01L 21/768 |
| 2023/0155067 | A1 | 5/2023 | Im et al. | |

FOREIGN PATENT DOCUMENTS

| | | |
|---|---|---|
| KR | 10-2021-0132259 | 11/2021 |
| KR | 10-2021-0143350 | 11/2021 |
| KR | 10-2022-0004849 | 1/2022 |

* cited by examiner

DISPLAY DEVICE

CROSS-REFERENCE TO RELATED APPLICATION(S)

This application claims priority to and benefits of Korean Patent Application No. 10-2022-0018216 under 35 U.S.C. § 119, filed on Feb. 11, 2022, in the Korean Intellectual Property Office (KIPO), the entire contents of which are incorporated herein by reference.

BACKGROUND

1. Technical Field

Embodiments relate to a display device.

2. Description of the Related Art

The importance of display devices has increased with the development of multimedia. Various types of display devices such as an organic light emitting display (OLED) and a liquid crystal display (LCD) have been used in various fields.

The display devices include a self-light emitting display device including a light emitting element as a device displaying an image of the display device. The self-light emitting display device includes an organic light emitting display device using an organic material as a light emitting material, an inorganic light emitting display device using an inorganic material as a light emitting material, or the like.

SUMMARY

Embodiments provide a display device capable of improving luminance by specific arrangement structures of electrodes and light emitting elements.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a plurality of first group electrodes extending in a first direction and spaced apart from each other in a second direction, a plurality of second group electrodes extending in the first direction and spaced apart from each other in the second direction, the plurality of second group electrodes spaced apart from the plurality of first group electrodes in the first direction, respectively, a plurality of light emitting elements disposed on the plurality of first group electrodes and the plurality of second group electrodes, the plurality of light emitting elements spaced apart from each other in the second direction, a first connection electrode and a second connection electrode disposed on at least one of the plurality of first group electrodes and extending in the first direction, a third connection electrode and a fourth connection electrode disposed on at least one of the plurality of first group electrodes and at least one of the plurality of second group electrodes and extending in the first direction, and a fifth connection electrode disposed on at least two electrodes of the plurality of second group electrodes and spaced apart from the first connection electrode and the second connection electrode in the first direction, wherein each of the first connection electrode, the second connection electrode, the third connection electrode, the fourth connection electrode, and fifth connection electrode is in contact with at least one of the light emitting elements, and each of the first connection electrode, the second connection electrode, and the fifth connection electrode is disposed between the third connection electrode and the fourth connection electrode in the second direction.

A width of the fifth connection electrode in the second direction may be greater than widths of the first connection electrode, the second connection electrode, the third connection electrode, and the fourth connection electrode in the second direction.

Lengths of the third connection electrode and the fourth connection electrode in the first direction may be greater than lengths of the first connection electrode, the second connection electrode, and the fifth connection electrode in the first direction.

The display device may further include a bank layer surrounding an emission area in which the light emitting elements are disposed and including portions extending in the first direction and the second direction, wherein the first connection electrode and the second connection electrode may extend from the emission area beyond the bank layer in the first direction.

The plurality of first electrodes may include a first electrode, a second electrode spaced apart from the first electrode toward a forward direction of the second direction, a third electrode spaced apart from the first electrode toward a backward direction of the second direction, and a fourth electrode spaced apart from the second electrode toward the forward direction of the second direction, and the plurality of second group electrodes may include a fifth electrode spaced apart from the first electrode in the first direction, a sixth electrode spaced apart from the second electrode in the first direction, a seventh electrode spaced apart from the third electrode in the first direction, and an eighth electrode spaced apart from the fourth electrode in the first direction.

The first connection electrode may be disposed on the first electrode, the second connection electrode may be disposed on the second electrode, the third connection electrode may be disposed on the third electrode and the seventh electrode, the fourth connection electrode may be disposed on the fourth electrode and the eighth electrode, and the fifth connection electrode may be disposed on the fifth electrode and the sixth electrode.

The display device may further include a first wall and a second wall extending in the first direction and spaced apart from each other in the second direction, and a third wall disposed between the first wall and the second wall, wherein the light emitting elements may be disposed between the first wall and the third wall or between the third wall and the second wall.

The first electrode, the second electrode, the fifth electrode, and the sixth electrode may overlap the third wall, the third electrode and the seventh electrode may overlap the first wall, and the fourth electrode and the eighth electrode may overlap the second wall.

The light emitting elements may include first light emitting elements disposed on the first electrode and the third electrode, second light emitting elements disposed on the second electrode and the fourth electrode, third light emitting elements disposed on the fifth electrode and the seventh electrode, and fourth light emitting elements disposed on the sixth electrode and the eighth electrode.

The first light emitting elements and the second light emitting elements may include first end portions oriented toward the forward direction of the second direction, and the third light emitting elements and the fourth light emitting elements may include first end portions oriented toward the backward direction of the second direction.

The first connection electrode may be in contact with first end portions of the first light emitting elements, the second connection electrode may be in contact with second end portions of the second light emitting elements, the third connection electrode may be in contact with second end portions of the first light emitting elements and first end portions of the third light emitting elements, the fourth connection electrode may be in contact with first end portions of the second light emitting elements and second end portions of the fourth light emitting elements, and the fifth connection electrode may be in contact with second end portions of the third light emitting elements and first end portions of the fourth light emitting elements.

The display device may further include a first signal line and a second signal line extending in the second direction and spaced apart from each other in the first direction, wherein each of the plurality of first group electrodes and the plurality of second group electrodes may be electrically connected to the first signal line or the second signal line.

One electrode of two adjacent electrodes, among the plurality of first group electrodes and the plurality of second group electrodes, adjacent to each other in the second direction may be electrically connected to the first signal line, and another electrode of the two adjacent electrodes may be electrically connected to the second signal line.

A pair of electrodes, among the plurality of first group electrodes and the plurality of second group electrodes, parallel to each other in the first direction, one electrode of the pair of electrodes may be electrically connected to the first signal line, and another electrode of the pair of electrodes may be electrically connected to the second signal line.

The first connection electrode, the second connection electrode, and the fifth connection electrode may be disposed on a layer different from a layer on which the third connection electrode and the fourth connection electrode are disposed.

The first connection electrode, the second connection electrode, the third connection electrode, the fourth connection electrode, and the fifth connection electrodes may be disposed on a same layer.

According to an embodiment, a display device may include a plurality of pixels arranged in a first direction and a second direction intersecting the first direction, wherein each of the plurality of pixels may include a plurality of electrode pairs each including a pair of electrodes extending in the first direction and spaced apart from each other in the first direction, a plurality of light emitting elements disposed on the plurality of electrodes spaced apart from each other in the second direction, first-type connection electrodes disposed on one electrode of the pair of electrodes of each of the plurality of electrode pairs, second-type connection electrodes disposed on another electrode of the pair of electrodes of each of the plurality of electrode pairs, and a third-type connection electrode spaced apart from the first-type connection electrodes in the first direction, the first-type connection electrodes and the third-type connection electrode are disposed between the second-type connection electrodes in the second direction, the first-type connection electrodes are in contact with end portions of some of the light emitting elements, the second-type connection electrodes are disposed on the pair of electrodes of each of the plurality of electrode pairs and are in contact with the light emitting elements spaced apart from each other in the first direction, and the third-type connection electrode is disposed on two different electrode pairs and is in contact with the light emitting elements spaced apart from each other in the second direction.

The plurality of electrode pairs may include a first electrode pair, a second electrode pair spaced apart from the first electrode pair toward a forward direction of the second direction, a third electrode pair spaced apart from the first electrode pair toward a backward direction of the second direction, and a fourth electrode pair spaced apart from the second electrode pair toward the forward direction of the second direction, and the light emitting elements may include first light emitting elements disposed on one electrode of each of the first electrode pair and the third electrode pair, second light emitting elements disposed on one electrode of each of the second electrode pair and the fourth electrode pair, third light emitting elements disposed on another electrode of each of the first electrode pair and the third electrode pair, and fourth light emitting elements disposed on another electrode of each of the second electrode pair and the fourth electrode pair.

The first-type connection electrodes may include a first connection electrode in contact with the first light emitting elements and a second connection electrode in contact with the second light emitting elements, the second-type connection electrodes may include a third connection electrode in contact with the first light emitting elements and the third light emitting elements, and a fourth connection electrode in contact with the second light emitting elements and the fourth light emitting elements, and the third-type connection electrode may be in contact with the third light emitting elements and the fourth light emitting elements.

The plurality of pixels may include a first pixel row in which first end portions of the first light emitting elements and first end portions of the second light emitting elements are oriented toward the forward direction of the second direction and first end portions of the third light emitting elements and first end portions of the fourth light emitting elements are oriented toward the backward direction of the second direction.

The plurality of pixels may include a second pixel row adjacent to the first pixel row, the second pixel row in which first end portions of the first light emitting elements and first end portions of the second light emitting elements are oriented toward the backward direction of the second direction and first end portions of the third light emitting elements and first end portions of the fourth light emitting elements are oriented toward the forward direction of the second direction.

The plurality of pixels may include a first pixel row in which the first-type connection electrodes are disposed on one side of the third-type connection electrode in the first direction, and a second pixel row in which the first-type connection electrodes are disposed on another side of the third-type connection electrode in the first direction.

In a display device according to embodiments, electrodes disposed in each of pixels may be connected to signal lines, respectively, and orientation directions of light emitting elements may be different from each other according to connections between the electrodes and the signal lines. The light emitting elements may be disposed so that connection electrodes with which both end portions (e.g., opposite end portions) of the light emitting elements are in contact may have linear pattern shapes, and the display device has an advantage that a space in which the connection electrodes are disposed is decreased. Accordingly, a large number of light emitting elements per unit area may be electrically connected to the connection electrodes, and the display device has an advantage that luminance is improved.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
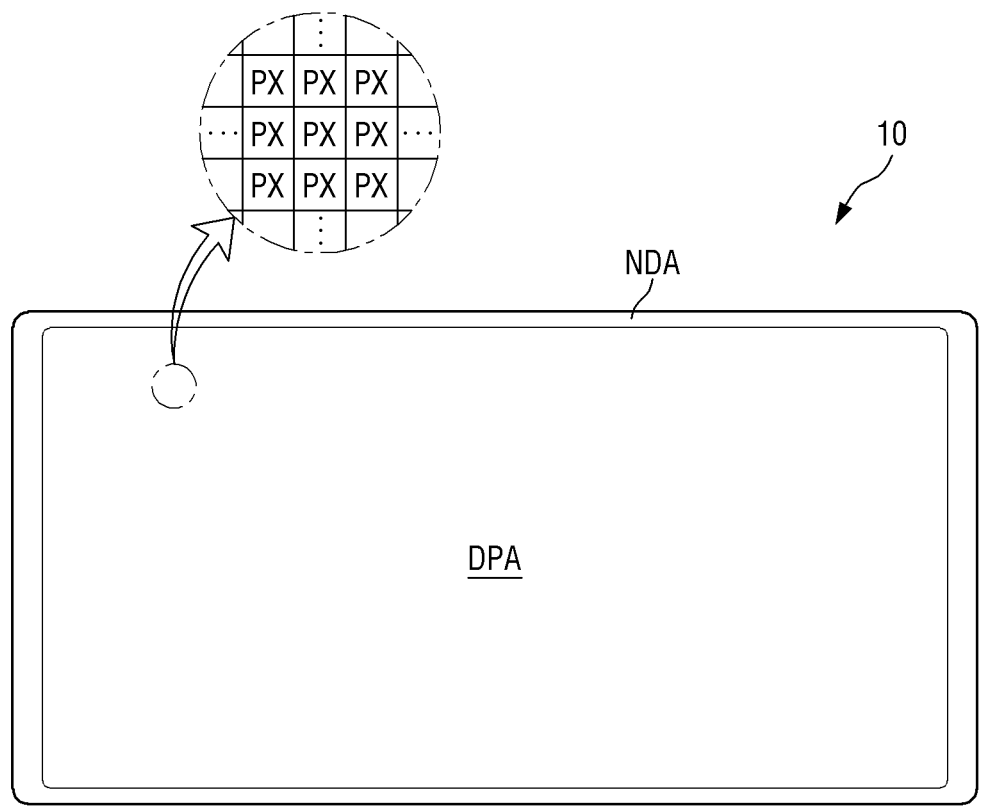
FIG. 1 is a schematic plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments will be described with reference to the accompanying drawings.

FIG. 1 is a schematic plan view of a display device according to an embodiment.

Referring to FIG. 1, a display device 10 may display a moving image or a still image. The display device 10 may refer to all electronic devices including display screens. For example, the display device 10 may include televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like.

The display device 10 may include a display panel including the display screen. The display panel may include an inorganic light emitting diode display panel, an organic light emitting display panel, a quantum dot light emitting display panel, a plasma display panel, a field emission display panel, and the like. Hereinafter, a case where an inorganic light emitting diode display panel as an example of the display panel will be described by way of example, but embodiments are not limited thereto.

A shape of the display device 10 may be variously modified. For example, the display device 10 may have a shape such as a rectangular shape with a width greater than a length, a rectangular shape with a length greater than a width, a square shape, a rectangular shape with rounded corners (or rounded vertices), other polygonal shapes, or a circular shape. A shape of a display area DPA of the display device 10 may also be similar to an overall shape of the display device 10. In FIG. 1, the display device 10 having a rectangular shape with a great length in a second direction DR2 is illustrated.

The display device 10 may include a display area DPA and non-display areas NDA. The display area DPA may be an area in which a screen may be displayed, and the non-display area NDA is an area in which the screen is not displayed. The display area DPA may also be referred to as an active area, and the non-display area NDA may also be referred to as a non-active area. The display area DPA may occupy substantially the center of the display device 10.

The display area DPA may include pixels PX. The pixels PX may be arranged in a matrix direction. A shape of each pixel PX may be a rectangular shape or a square shape in a plan view, but embodiments are not limited thereto, and may also be a rhombic shape of which each side is inclined with respect to a direction. The respective pixels PX may be alternately arranged in a stripe type or an island type. For example, each of the pixels PX may include one or more light emitting elements emitting light of a specific wavelength band to display a specific color.

The non-display areas NDA may be disposed around the display area DPA. The non-display areas NDA may entirely or partially surround the display area DPA. The display area DPA may have a rectangular shape, and the non-display areas NDA may be disposed adjacent to four sides of the display area DPA. The non-display areas NDA may form a bezel of the display device 10. Lines or circuit drivers included in the display device 10 may be disposed or external devices may be mounted in the non-display areas NDA.

Figure 2:
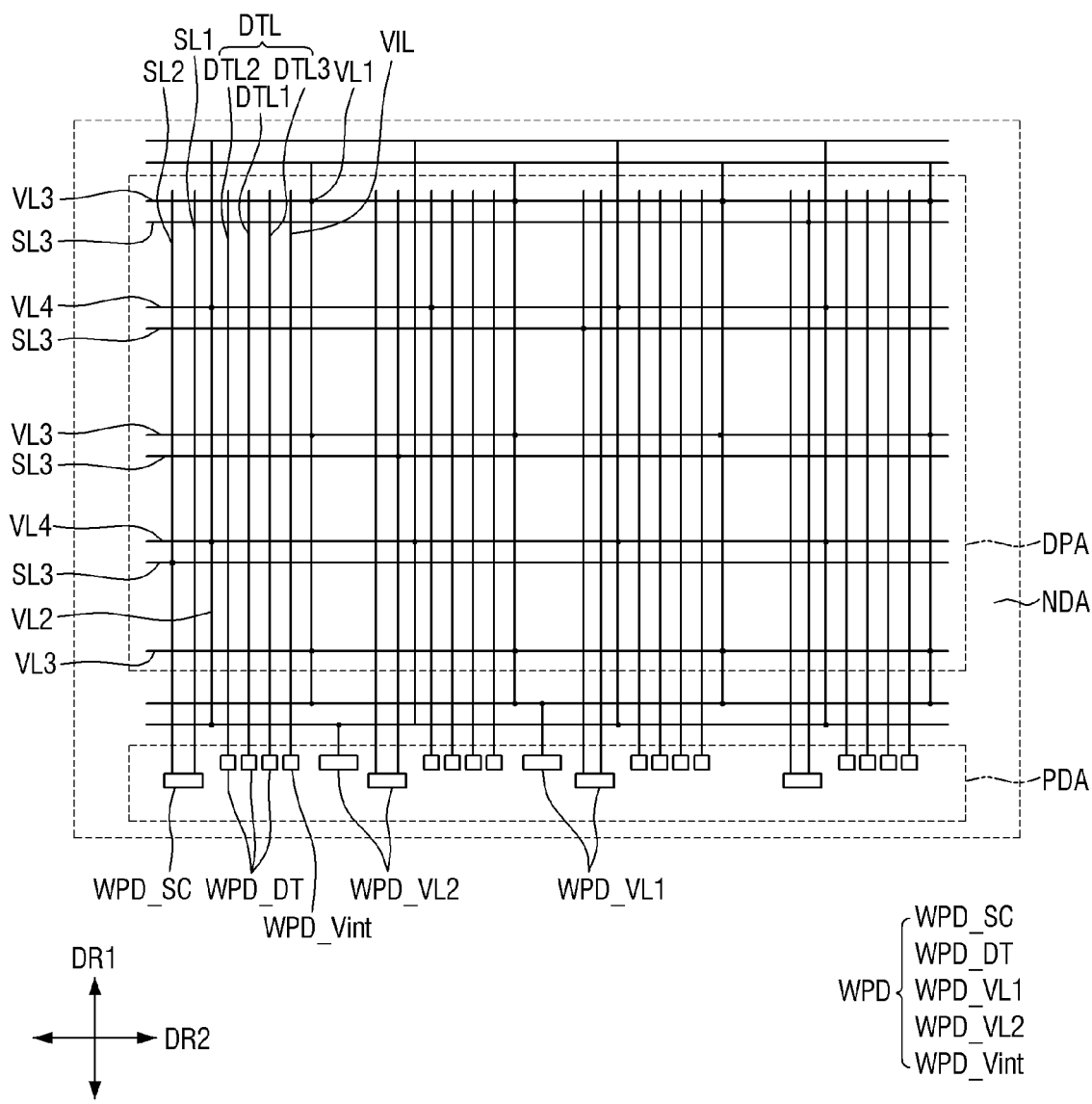
FIG. 2 is a schematic plan view illustrating a layout of lines included in the display device according to an embodiment.

FIG. 2 is a schematic plan view illustrating a layout of lines included in the display device according to an embodiment.

Referring to FIG. 2, the display device 10 may include lines. The display device 10 may include scan lines SL (e.g., SL1, SL2, and SL3), data lines DTL (e.g., DTL1, DTL2, and DTL3), initialization voltage lines VIL, and voltage lines VL (e.g., VL1, VL2, VL3, and VL4). For example, other lines may be further disposed in the display device 10. The lines may include some lines that are formed of a first conductive layer and extend in a first direction DR1 and the other lines that are formed of a third conductive layer and extend in the second direction DR2. However, extension directions of the respective lines are not limited thereto.

First scan lines SL1 and second scan lines SL2 may extend in the first direction DR1. The first scan line SL1 and the second scan line SL2 may be disposed in a state in which the first and second scan lines SL1 and SL2 are adjacent to each other, and may be spaced apart from the other first scan lines SL1 and the other second scan lines SL2 in the second direction DR2. The first scan lines SL1 and the second scan lines SL2 may be connected to scan wiring pads WPD_SC connected to a scan driver. The first scan lines SL1 and the second scan lines SL2 may extend from a pad area PDA disposed in the non-display area NDA to the display area DPA.

A third scan line SL3 may extend in the second direction DR2, and may be spaced apart from the other third scan lines SL3 in the first direction DR1. At least one of the third scan line SL3 may be connected to one or more first scan lines SL1 or one or more second scan lines SL2. The scan lines SL may have a mesh structure in the display area DPA, but embodiments are not limited thereto.

The data lines DTL may extend in the first direction DR1. The data lines DTL may include first data lines DTL1, second data lines DTL2, and third data lines DTL3. For example, each of the first, second, and third data lines DTL1, DTL2, and DTL3 may form one pair (or one group) and may be disposed adjacent to each other. Each of the data lines DTL1, DTL2, and DTL3 may extend from the pad area PDA disposed in the non-display area NDA to the display area DPA. However, embodiments are not limited thereto, and the data lines DTL may also be spaced apart from each other at substantially equal distances (or gaps) between a first voltage line VL1 and a second voltage line VL2 to be described below.

The initialization voltage lines VIL may extend in the first direction DR1. The initialization voltage line VIL may be disposed between the data lines DTL and the first voltage line VL1. The initialization voltage lines VIL may extend from the pad area PDA disposed in the non-display area NDA to the display area DPA.

First voltage lines VL1 and second voltage lines VL2 may be disposed to extend in the first direction DR1, and third voltage lines VL3 and fourth voltage lines VL4 may be disposed to extend in the second direction DR2. The first voltage lines VL1 and the second voltage lines VL2 may be alternately disposed in the second direction DR2, and the third voltage lines VL3 and the fourth voltage lines VL4 may be alternately disposed in the first direction DR1. The first voltage lines VL1 and the second voltage lines VL2 may extend in the first direction DR1 to cross the display area DPA, and some of each of the third voltage lines VL3 and the fourth voltage lines VL4 may be disposed in the display area DPA and the others of each of the third voltage lines VL3 and the fourth voltage lines VL4 may be disposed in the non-display areas NDA positioned on both sides (e.g., opposite sides) of the display area DPA in the first direction DR1. The first voltage line VL1 and the second voltage line VL2 may be formed of a first conductive layer, and the third voltage line VL3 and the fourth voltage line VL4 may be formed of a third conductive layer disposed at a different level from a level at which the first conductive layer is disposed. The first voltage line VL1 may be connected to at least one third voltage line VL3, and the second voltage line VL2 may be connected (e.g., electrically connected) to at least one fourth voltage line VL4. The voltage lines VL may have a mesh structure in the display area DPA. However, embodiments are not limited thereto.

The first scan line SL1, the second scan line SL2, the data line DTL, the initialization voltage line VIL, the first voltage line VL1 and the second voltage line VL2 may be connected (e.g., electrically connected) to at least one wiring pad WPD. Each wiring pad WPD may be disposed in the non-display area NDA. In an embodiment, each of the wiring pads WPD may be disposed in the pad area PDA positioned on the lower side of the display area DPA, which is the other side of the display area DPA in the first direction DR1. The first scan line SL1 and the second scan line SL2 may be connected to a scan wiring pad WPD_SC disposed in the pad area PDA, and the data lines DTL may be connected to different data wiring pads WPD_DT, respectively. The initialization voltage line VIL may be connected to an initialization line pad WPD_Vint, the first voltage line VL1 may be connected to a first voltage line pad WPD_VL1, and the second voltage line VL2 may be connected to a second voltage line pad WPD_VL2. An external device may be mounted on the wiring pad WPD. The external device may be mounted on the wiring pad WPD through an anisotropic conductive film, ultrasonic bonding, or the like. It has been illustrated in FIG. 2 that each of the wiring pads WPD is disposed in the pad area PDA disposed on the lower side of the display area DPA, but embodiments are not limited thereto. Some of wiring pads WPD may also be disposed on the upper side of the display area DPA or on any one of the left side and the right side of the display area DPA.

Each pixel PX or sub-pixel SPXn (where n is an integer of 1 to 3) of the display device 10 may include a pixel driving circuit. The above-described lines may apply driving signals to the respective pixel driving circuits with passing through the respective pixels PX or around the respective pixels PX. The pixel driving circuit may include a transistor and a capacitor. The numbers of transistors and capacitors in each pixel driving circuit may be variously modified. According to an embodiment, each sub-pixel SPXn of the display device 10 may have a 3T-1C structure in which the pixel driving circuit includes three transistors and one capacitor. Hereinafter, the pixel driving circuit will be described using the 3T-1C structure as an example, but embodiments are not limited thereto, and various other modified structures such as a 2T-1C structure, a 7T-1C structure, and a 6T-1C structure may be applied.

Figure 3:
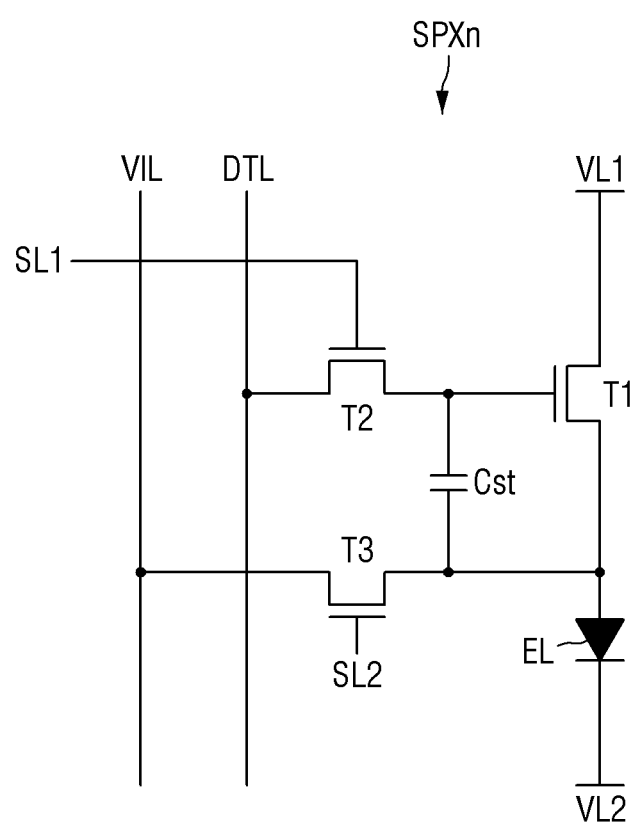
FIGS. 3 and 4 are schematic diagrams of equivalent circuits of a sub-pixel of the display device according to an embodiment.
Figure 4:
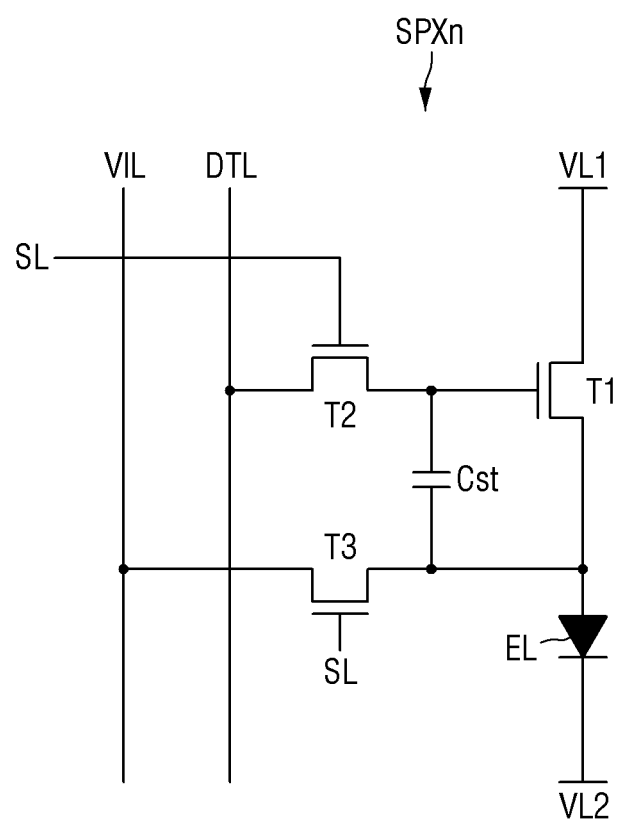

FIGS. 3 and 4 are schematic diagrams of equivalent circuits of a sub-pixel of the display device according to an embodiment.

Referring to FIG. 3, each sub-pixel SPXn of the display device 10 according to an embodiment may include three transistors T1, T2, and T3 and one storage capacitor Cst, in addition to a light emitting diode EL.

The light emitting diode EL emits light according to a current supplied through a first transistor T1. The light emitting diode EL may include a first electrode, a second electrode, and at least one light emitting element disposed between the first electrode and the second electrode. The light emitting element may emit light of a specific wavelength band by electrical signals transferred from the first electrode and the second electrode.

An end portion of the light emitting diode EL may be connected to a source electrode of the first transistor T1, and another end portion of the light emitting diode EL may be connected to the second voltage line VL2 to which a low potential voltage (hereinafter, referred to as a second source voltage) lower than a high potential voltage (hereinafter, referred to as a first source voltage) of the first voltage line VL1 is supplied.

The first transistor T1 may adjust a current flowing from the first voltage line VL1 to which the first source voltage is supplied to the light emitting diode EL according to a voltage difference between a gate electrode and the source electrode of the first transistor T1. As an example, the first transistor T1 may be a driving transistor for driving the light emitting diode EL. The gate electrode of the first transistor T1 may be connected to a source electrode of a second transistor T2, the source electrode of the first transistor T1 may be connected to the first electrode of the light emitting diode EL, and a drain electrode of the first transistor T1 may be connected to the first voltage line VL1 to which the first source voltage is applied.

The second transistor T2 may be turned on by a scan signal of the first scan line SL1 to connect the data line DTL to the gate electrode of the first transistor T1. A gate electrode of the second transistor T2 may be connected to the first scan line SL1, the source electrode of the second transistor T2 may be connected to the gate electrode of the first transistor T1, and a drain electrode of the second transistor T2 may be connected to the data line DTL.

A third transistor T3 may be turned on by a scan signal of the second scan line SL2 to connect the initialization voltage line VIL to an end portion of the light emitting diode EL. A gate electrode of the third transistor T3 may be connected to the second scan line SL2, a drain electrode of the third transistor T3 may be connected to the initialization voltage line VIL, and a source electrode of the third transistor T3 may be connected to an end portion of the light emitting diode EL or the source electrode of the first transistor T1.

In an embodiment, the source electrode and the drain electrode of each of the transistors T1, T2, and T3 are not limited to those described above, and vice versa. Each of the transistors T1, T2, and T3 may be formed as a thin film transistor. It has been described in FIG. 3 that each of the transistors T1, T2, and T3 is formed as an N-channel metal oxide semiconductor field effect transistor (MOSFET), but embodiments are not limited thereto. For example, each of the transistors T1, T2, and T3 may be formed as a P-channel MOSFET or some of the transistors T1, T2, and T3 may be formed as an N-channel MOSFET and the others of the transistors T1, T2, and T3 may be formed as a P-channel MOSFET.

The storage capacitor Cst may be formed between the gate electrode and the source electrode of the first transistor T1. The storage capacitor Cst may store a difference voltage between a gate voltage and a source voltage of the first transistor T1.

In an embodiment of FIG. 3, the gate electrode of the second transistor T2 may be connected to the first scan line SL1, and the gate electrode of the third transistor T3 may be connected to the second scan line SL2. The first scan line SL1 and the second scan line SL2 may be different scan lines, and the second transistor T2 and the third transistor T3 may be turned on by scan signals applied from different scan lines. However, embodiments are not limited thereto.

Referring to FIG. 4, the gate electrodes of the second transistor T2 and the third transistor T3 may be connected to the same scan line SL. The second transistor T2 and the third transistor T3 may be simultaneously turned on by a scan signal applied from the same scan line.

Hereinafter, a structure of a pixel PX of the display device 10 according to an embodiment will be described in detail with reference to other drawings.

Figure 5:
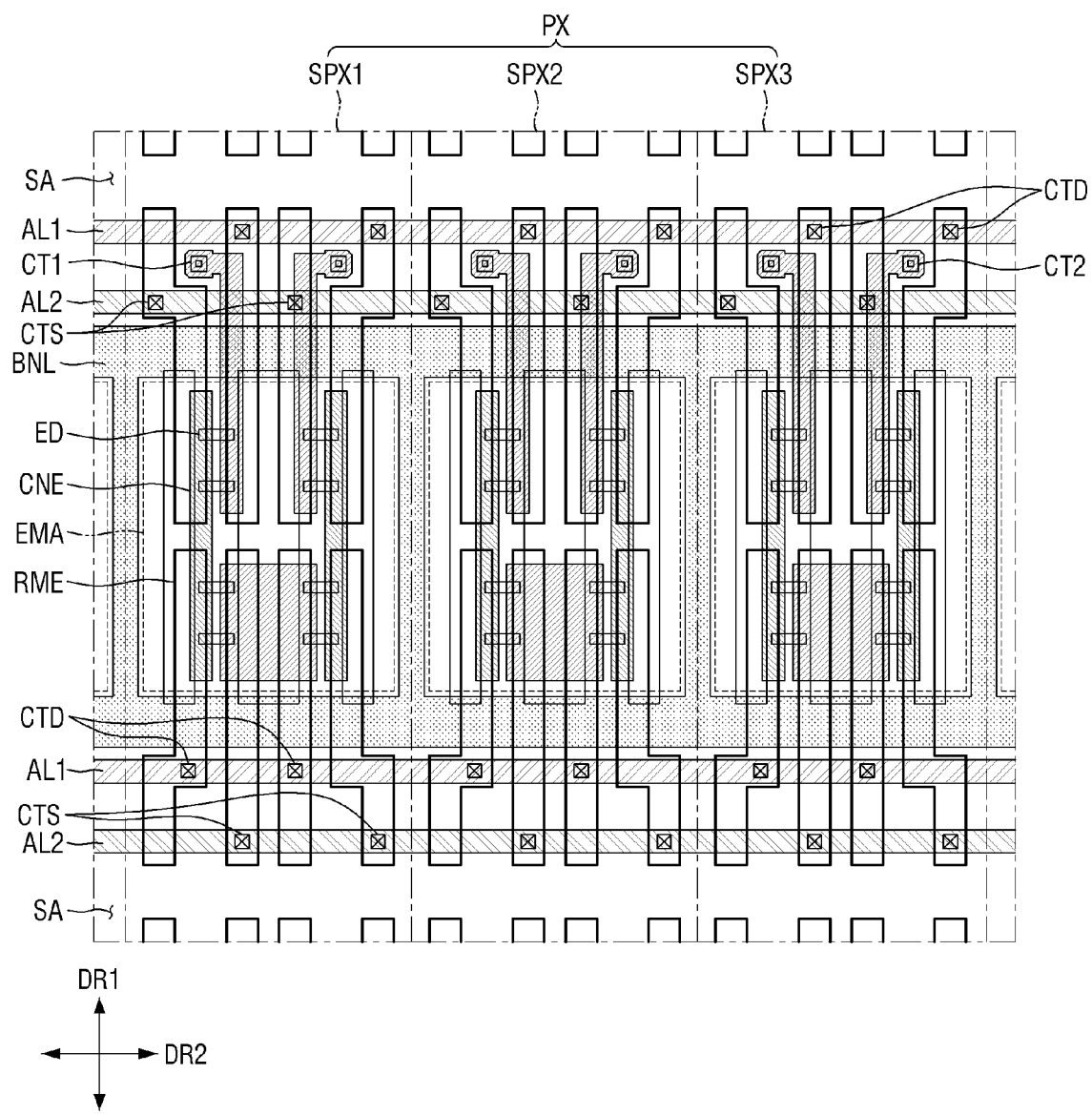
FIG. 5 is a schematic plan view illustrating a pixel of the display device according to an embodiment.
Figure 6:
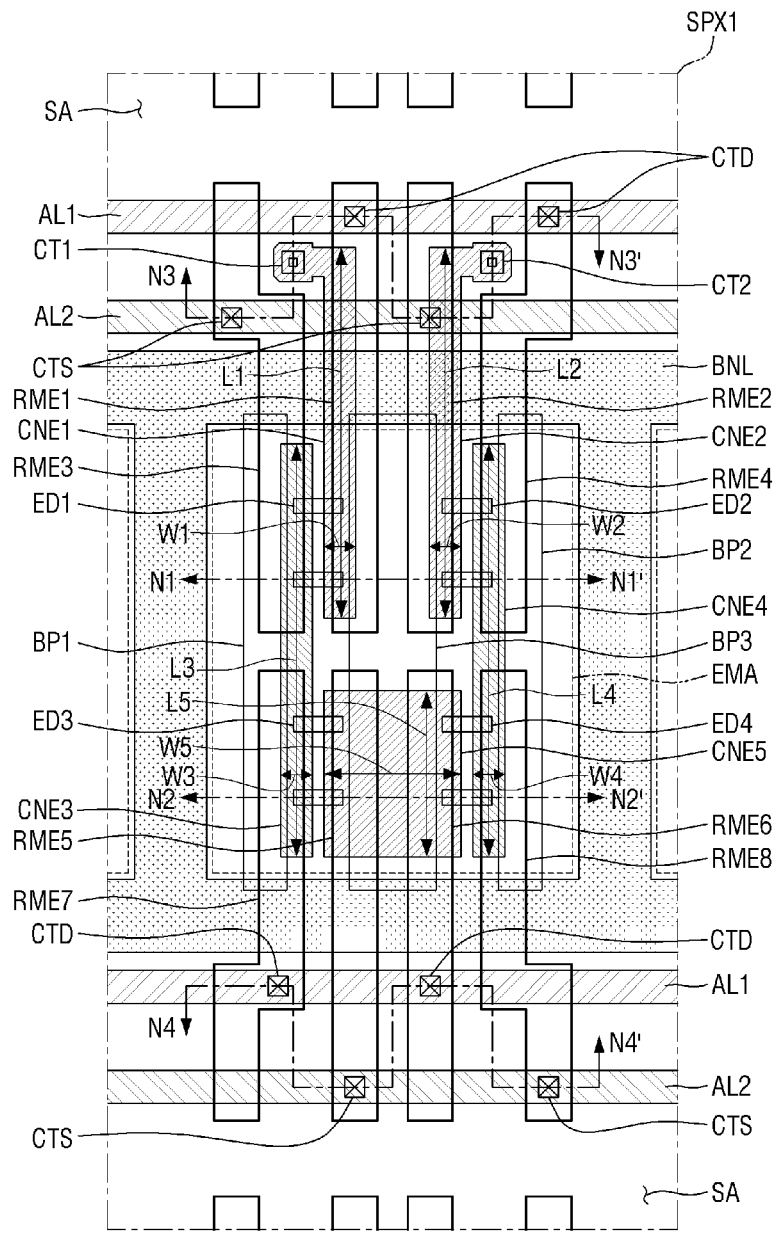
FIG. 6 is a schematic plan view illustrating a first sub-pixel of FIG. 5.

FIG. 5 is a schematic plan view illustrating a pixel of the display device according to an embodiment. FIG. 6 is a schematic plan view illustrating a first sub-pixel of FIG. 5.

FIG. 5 illustrates a layout, in a plan view, of electrodes RME (e.g., RME1, RME2, RME3, RME4, RME5, RME6, RME7, and RME8), walls BP1, BP2, and BP3, a bank layer BNL, light emitting elements ED (e.g., ED1, ED2, ED3, and ED4), and connection electrodes CNE (e.g., CNE1, CNE2, CNE3, CNE4, and CNE5) disposed in a pixel PX of the display device 10. FIG. 6 illustrates a layout of the electrodes RME, the light emitting elements ED, and the connection electrodes CNE disposed in a first sub-pixel SPX1 of FIG. 5.

Referring to FIGS. 5 and 6, each of the pixels PX of the display device 10 may include sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. As an example, the first color may be blue, the second color may be green, and the third color may be red. However, embodiments are not limited thereto, and the respective sub-pixels SPXn may also emit light of the same color. In an embodiment, the respective sub-pixels SPXn may emit blue light. It has been illustrated in FIG. 5 that the pixel PX includes three sub-pixels SPXn, but embodiments are not limited thereto, and the pixel PX may include a larger number of sub-pixels SPXn.

Each of the sub-pixels SPXn of the display device 10 may include an emission area EMA and a non-emission area. The emission area EMA may be an area in which the light emitting elements ED are disposed to emit light of a specific wavelength band. The non-emission area may be an area in which the light emitting elements ED are not disposed and light emitted from the light emitting elements ED may not arrive, and thus, the light may not be emitted.

The emission area EMA may include an area in which the light emitting elements ED are disposed and an area which is adjacent to the light emitting elements ED and in which the light emitted from the light emitting elements ED is emitted. For example, the emission area EMA may also include an area in which the light emitted from the light emitting elements ED is reflected or refracted by other members and emitted. The light emitting elements ED may be disposed in each sub-pixel SPXn, and an emission area including an area in which the light emitting elements ED are disposed and an area adjacent to the light emitting elements ED may be formed.

It has been illustrated in FIG. 5 that the emission areas EMA of the respective sub-pixels SPXn have a uniform area, but embodiments are not limited thereto. In some embodiments, the respective emission areas EMA of the respective sub-pixels SPXn may also have different areas according to colors or wavelength bands of light emitted from the light emitting elements ED disposed in the corresponding sub-pixels.

The pixel PX may further include a sub-area SA disposed in the non-emission area. The sub-area SA may be spaced apart from the emission area EMA in the first direction DR1. The emission areas EMA and the sub-areas SA may be alternately arranged along the first direction DR1, and the sub-area SA may be disposed between the emission areas EMA of different sub-pixels SPXn spaced apart from each other in the first direction DR1. For example, the emission areas EMA and the sub-areas SA may be alternately arranged in the first direction DR1, the emission areas EMA may be repeatedly arranged in the second direction DR2, and the sub-areas SA may extend in the second direction DR2. However, embodiments are not limited thereto, and the emission areas EMA and the sub-areas SA in the pixels PX may also have an arrangement different from that of FIG. 5.

The emission area EMA may be disposed for each sub-pixel SPXn, and the sub-area SA may be disposed across the sub-pixels SPXn. As described below, the emission area EMA and the sub-area SA may be divided by the bank layer BNL, the bank layer BNL may surround the emission area EMA so as to include the emission area EMA for each sub-pixel SPXn, and the sub-area SA may be disposed so as not to be divided between different sub-pixels SPXn.

Light may not be emitted in the sub-areas SA because the light emitting elements ED are not disposed in the sub-areas SA, but portions of electrodes RME disposed in each of the sub-pixels SPXn may be disposed in the sub-areas SA. The electrodes RME disposed in different sub-pixels SPXn may be separated from each other in a separation part ROP of the sub-area SA.

The display device 10 may include electrodes RME, the walls BP1, BP2, and BP3, the bank layer BNL, the light emitting elements ED, and the connection electrodes CNE.

Walls BP1, BP2, and BP3 may be disposed in the emission area EMA of each sub-pixel SPXn. The walls BP1, BP2, and BP3 may substantially extend in the first direction DR1, and may be spaced apart from each other in the second direction DR2.

For example, the walls BP1, BP2, and BP3 may include a first wall BP1 and a second wall BP2 spaced apart from each other in the second direction DR2 in the emission area EMA of each sub-pixel SPXn and a third wall BP3 disposed between the first wall BP1 and the second wall BP2. The first wall BP1 may be disposed on the left side, which is a side of the center of the emission area EMA in the second direction DR2, and the second walls BP2 may be spaced apart from the first wall BP1 and be disposed on the right side, which is the other side of the center of the emission area EMA in the second direction DR2. The third wall BP3 may be disposed at the center of the emission area EMA between the first wall BP1 and the second wall BP2. The first walls BP1, the third walls BP3, and the second walls BP2 may be alternately disposed along the second direction DR2 and be disposed in an island-shaped pattern in the display area DPA. The light emitting elements ED may be disposed between the first wall BP1 and the third wall BP3 and between the third wall BP3 and the second wall BP2.

A width of the third wall BP3 measured in the second direction DR2 may be greater than those of the first wall BP1 and the second wall BP2. As described below, the third wall BP3 may overlap a larger number of electrodes RME as compared with the other walls BP1 and BP2, and may thus have a greater width in the second direction DR2 than the other walls BP1 and BP2. However, embodiments are not limited thereto, and widths of the walls BP1, BP2, and BP3 may be also substantially the same as each other.

It has been illustrated in FIGS. 5 and 6 that each of the first wall BP1 and the second wall BP2 is disposed to correspond to the emission area EMA of the corresponding sub-pixel SPXn. However, embodiments are not limited thereto, and each of the first wall BP1 and the second wall BP2 may also be disposed across the emission areas EMA of the sub-pixels SPXn adjacent to each other in the second direction DR2. For example, the first wall BP1 and the second wall BP2 may also overlap portions of a bank layer BNL to be described below extending in the first direction DR1.

Lengths of the walls BP1, BP2, and BP3 in the first direction DR1 may be substantially the same as each other, and may be greater than a length, in the first direction DR1, of the emission area EMA surrounded by the bank layer BNL. The walls BP1, BP2, and BP3 may overlap portions of the bank layer BNL extending in the second direction DR2. However, embodiments are not limited thereto, and the walls BP1, BP2, and BP3 may also be integral with the bank layer BNL or be spaced apart from portions of the bank layer BNL extending in the second direction DR2. For example, lengths of the walls BP1, BP2, and BP3 in the first direction DR1 may be substantially the same as or smaller than the length, in the first direction DR1, of the emission area EMA surrounded by the bank layer BNL.

It has been illustrated in FIGS. 5 and 6 that three walls BP1, BP2, and BP3 are disposed for each sub-pixel SPXn, but embodiments are not limited thereto. The number and a shape of walls BP1, BP2, and BP3 may be changed according to the number or arrangement structures of electrodes RME.

The electrodes RME may have a shape extending in a direction, and may be disposed for each sub-pixel SPXn. The electrodes RME may extend in the first direction DR1 to be disposed in the emission area EMA and the sub-area SA of the sub-pixel SPXn, and may be spaced apart from each other in the first direction DR1 and the second direction DR2.

According to an embodiment, in the display device 10, the electrodes RME disposed in each sub-pixel SPXn may constitute different electrode groups RMG1 and RMG2 or electrode pairs RMP1, RMP2, RMP3, and RMP4. For example, the display device 10 may include a first electrode RME1, a second electrode RME2, a third electrode RME3, and a fourth electrode RME4 disposed on the upper side of the emission area EMA of the sub-pixel SPXn, which is a side of the emission area EAM of the sub-pixel SPXn in the first direction DR1. The display device 10 may include a fifth electrode RME5, a sixth electrode RME6, a seventh electrode RME7, and an eighth electrode RME8 disposed on the lower side of the emission area EMA of the sub-pixel SPXn, which is the other side of the emission area EAM of the sub-pixel SPXn in the first direction DR1.

The first electrode RME1 and the second electrode RME2 may be disposed at the center of the sub-pixel SPXn, respectively, and portions of the first electrode RME1 and the second electrode RME2 may be disposed on the third wall BP3. The first electrode RME1 and the second electrode RME2 may be spaced apart from each other in the second direction DR2, and may overlap (e.g., partially overlap) the third wall BP3, respectively. The third electrode RME3 may be spaced apart from the first electrode RME1 in the second direction DR2 and be disposed on the first wall BP1.

The third electrode RME3 may overlap (e.g., partially overlap) the first wall BP1. The fourth electrode RME4 may be spaced apart from the second electrode RME2 in the second direction DR2 and be disposed on the second wall BP2. The fourth electrode RME4 may overlap (e.g., partially overlap) the second wall BP2.

The fifth electrode RME5 and the sixth electrode RME6 may be disposed at the center of the sub-pixel SPXn, respectively, and portions of the fifth electrode RME5 and the sixth electrode RME6 may be disposed on the third wall BP3. The fifth electrode RME5 and the sixth electrode RME6 may be spaced apart from each other in the second direction DR2, and may overlap (e.g., partially overlap) the third wall BP3, respectively. The fifth electrode RME5 may be spaced apart from the first electrode RME1 in the first direction DR1, and the sixth electrode RME6 may be spaced apart from the second electrode RME2 in the first direction DR1.

The seventh electrode RME7 may be spaced apart from the fifth electrode RME5 in the second direction DR2 and be disposed on the first wall BP1. The seventh electrode RME7 may be spaced apart from the third electrode RME3 in the first direction DR1, and may overlap (e.g., partially overlap) the first wall BP1. The eighth electrode RME8 may be spaced apart from the sixth electrode RME6 in the second direction DR2 and be disposed on the second wall BP2. The eighth electrode RME8 may be spaced apart from the fourth electrode RME4 in the first direction DR1, and may overlap (e.g., partially overlap) the second wall BP2.

A distance (or a gap) between the electrodes RME spaced apart from each other in the second direction DR2 may be smaller than a distance (or a gap) between the walls BP1, BP2, and BP3 spaced apart from each other in the second direction DR2. For example, a distance (or a gap) between the first electrode RME1 and the third electrode RME3 may be smaller than a distance (or a gap) between the first wall BP1 and the third wall BP3. The respective electrodes RME may be disposed on the walls BP1, BP2, and BP3, but portions of the respective electrodes RME may be disposed so as not to overlap the walls BP1, BP2, and BP3.

Electrodes spaced apart from each other in the second direction DR2 among the electrodes RME may constitute one electrode group RMG1 or RMG2. For example, the first to fourth electrodes RME1, RME2, RME3, and RME4 may constitute a first electrode group RMG1 disposed on the upper side of the emission area EMA, the fifth to eighth electrodes RME5, RME6, RME7, and RME8 may constitute a second electrode group RMG2 disposed on the lower side of the emission area EMA. For example, the first electrode group RMG1 may include a plurality of first group electrodes (e.g., the first to fourth electrodes RME1, RME2, RME3, and RME4), and the second electrode group RMG2 may include a plurality of second group electrodes (e.g., the fifth to eighth electrodes RME5, RME6, RME7, and RME8). The electrodes of the first electrode group RMG1 may be disposed in the emission area EMA and the sub-area SA disposed on the upper side of the emission area EMA. The electrodes of the second electrode group RMG2 may be disposed in the emission area EMA and the sub-area SA disposed on the lower side of the emission area EMA.

Electrodes spaced apart from each other in the first direction DR1 among the electrodes RME may constitute one electrode pair RMP1, RMP2, RMP3, or RMP4. For example, the first electrode RME1 and the fifth electrode RME5 may constitute a first electrode pair RMP1, and the second electrode RME2 and the sixth electrode RME6 may constitute a second electrode pair RMP2. The third electrode RME3 and the seventh electrode RME7 may constitute a third electrode pair RMP3, and the fourth electrode RME4 and the eighth electrode RME8 may constitute a fourth electrode pair RMP4.

The electrodes of the first electrode group RMG1 and the second electrode group RMG2 disposed in each sub-pixel SPXn may be spaced apart from each other in the first direction DR1 in the emission area EMA. For example, the electrodes of any one of the electrode groups RMG1 and RMG2 may be spaced apart from electrodes of electrode groups RMG1 and RMG2 of another sub-pixel SPXn adjacent in the first direction DR1, in the first direction DR1 in the sub-area SA. For example, the first electrode group RMG1 of the first sub-pixel SPX1 illustrated in FIG. 6 may be spaced apart from the second electrode group RMG2 of the corresponding sub-pixel SPXn in the first direction DR1 in the emission area EMA. The first electrode group RMG1 may be spaced apart from a second electrode group RMG2 of a sub-pixel disposed on the upper side of the first sub-pixel SPX1, in the sub-area SA. For example, the second electrode group RMG2 of the first sub-pixel SPX1 illustrated in FIG. 6 may be spaced apart from a first electrode group RMG1 of a sub-pixel disposed on the lower side of the first sub-pixel SPX1, in the sub-area SA.

According to an embodiment, light emitting elements ED may be disposed on the electrodes RME of the display device 10, and the electrodes RME may be used to align the light emitting elements ED. The respective electrodes RME may be connected (e.g., electrically connected) to different signal lines AL1 and AL2 in the sub-area SA.

Signal lines AL1 and AL2 extending in the second direction DR2 may be disposed in the sub-area SA disposed between the emission areas EMA of the sub-pixels SPXn. The signal lines AL1 and AL2 may include a first signal line AL1 and a second signal line AL2 spaced apart from each other in the first direction DR1. The first signal line AL1 and the second signal line AL2 may be lines disposed below the electrodes RME. In an embodiment, each of the signal lines AL1 and AL2 may be any one of the third voltage line VL3 and the fourth voltage line VL4 of FIG. 2.

The first signal line AL1 may be dispose on the upper side of the second signal line AL2, and the first signal line AL1 and the second signal line AL2 may form a pair and may be disposed on each of the upper side and the lower side of the emission area EMA. In a pixel PX illustrated in FIG. 5, a pair of first and second signal lines AL1 and AL2 may be disposed on each of the upper side and the lower side of the emission area EMA of each of the sub-pixels SPXn. For example, even in pixels PX disposed on the upper side and the lower side of the pixel PX of FIG. 5, a pair of first and second signal lines AL1 and AL2 may be disposed on each of the upper side and the lower side of the emission area EMA. Accordingly, in the sub-area SA between different sub-pixels SPXn or pixels PX adjacent to each other in the first direction DR1, two pairs of first and second signal lines AL1 and AL2 may be spaced apart from each other in the first direction DR1.

The electrodes of the first electrode group RMG1 may be connected (e.g., electrically connected) to the signal lines AL1 and AL2 disposed on the upper side of the emission area EMA, respectively, and the electrodes of the second electrode group RMG2 may be connected (e.g., electrically connected) to the signal lines AL1 and AL2 disposed on the lower side of the emission area EMA, respectively. According to an embodiment, two different electrodes RME adjacent to each other in the second direction DR2 may be connected (e.g., electrically connected) to different signal lines AL1 and AL2, and two different electrodes RME constituting one electrode pair RMP1, RMP2, RMP3, or RMP4 may also be connected (e.g., electrically connected) to different signal lines AL1 and AL2.

For example, the first electrode RME1 may be connected (e.g., electrically connected) to the first signal line AL1 disposed on the upper side of the emission area EMA. Each of the second electrode RME2 and the third electrode RME3 adjacent the first electrode RME1 in the second direction DR2 may be connected (e.g., electrically connected) to the second signal line AL2. The fourth electrode RME4 adjacent to the second electrode RME2 in the second direction DR2 may be connected (e.g., electrically connected) to the first signal line AL1.

The electrodes of the second electrode group RMG2 constituting the electrode pairs RMP1, RMP2, RMP3, and RMP4 together with the electrodes of the first electrode group RMG1 may be connected (e.g., electrically connected) to the signal lines AL1 and AL2 different from the signal lines to which the electrodes of the first electrode group RMG1 are connected. The fifth electrode RME5 may be an electrode of the second electrode group RMG2 constituting the first electrode pair RMP1 together with the first electrode RME1, and may be connected (e.g., electrically connected) to the second signal line AL2. The sixth electrode RME6 may be an electrode of the second electrode group RMG2 constituting the second electrode pair RMP2 together with the second electrode RME2, and may be connected (e.g., electrically connected) to the first signal line AL1. For example, the seventh electrode RME7 and the eighth electrode RME8 may be connected (e.g., electrically connected) to the first signal line AL1 or the second signal line AL2, respectively.

As described below, electrical signals may be applied from the signal lines AL1 and AL2 to the respective electrodes RME, and electric fields may be generated on the electrodes RME connected (e.g., electrically connected) to the different signal lines AL1 and AL2. The light emitting elements ED may be disposed on the electrodes RME in case that their position and orientation directions are changed by the electric fields. Electrodes RME adjacent to each other in the second direction DR2 as electrodes in the same electrode groups RMG1 and RMG2 may be connected (e.g., electrically connected) to the different signal lines AL1 and AL2, and the light emitting elements ED may be disposed on two electrodes RME adjacent to each other in the second direction DR2. However, since the light emitting elements ED are disposed between the walls BP1, BP2, and BP3 spaced apart from each other, the light emitting elements ED may not be disposed on the electrodes RME adjacent to each other in the second direction DR2 but disposed on the same wall.

It has been illustrated in FIGS. 5 and 6 that eight electrodes RME have a shape substantially extending in the first direction DR1 for each sub-pixel SPXn, but embodiments are not limited thereto. For example, in the display device 10, a larger number of electrodes RME may be disposed in each sub-pixel SPXn. For example, each of the electrode groups RMG1 and RMG2 may include four or less electrodes RME or four or more electrodes RME. For example, the electrodes RME of each of the electrode groups RMG1 and RMG2 may be spaced apart from each other in the second direction DR2, and the electrodes RME of the different electrode groups RMG1 and RMG2 may be spaced apart from each other in the first direction DR1. For example, the electrodes RME may have a shape being partially bent and having widths different from each other according to positions.

The bank layer BNL may surround the sub-pixels SPXn, the emission areas EMA, and the sub-areas SA. The bank layer BNL may be disposed at boundaries between the sub-pixels SPXn adjacent to each other in the first direction DR1 and the second direction DR2, and may also be disposed at boundaries between the emission areas EMA and the sub-areas SA. The sub-pixels SPXn, the emission areas EMA, and the sub-areas SA of the display device 10 may be areas divided by an arrangement of the bank layer BNL. Distances (or gaps) between the sub-pixels SPXn, the emission areas EMA, and the sub-areas SA may be changed according to a width of the bank layer BNL.

The bank layer BNL may be disposed in a lattice-shaped pattern in the display area DPA by including portions extending in the first direction DR1 and the second direction DR2 in a plan view. The bank layer BNL may be disposed across boundaries between the respective sub-pixels SPXn to divide neighboring sub-pixels SPXn. For example, the bank layer BNL may surround the sub-area SA extending in the second direction DR2 with surrounding the emission area EMA disposed for each sub-pixel SPXn.

The light emitting elements ED may be disposed in the emission area EMA. The light emitting elements ED may be disposed between the walls BP1, BP2, and BP3 and be arranged to be spaced apart from each other in the first direction DR1 or the second direction DR2. In an embodiment, the light emitting elements ED may have a shape extending in a direction, and may have both end portions (e.g., opposite end portions) each disposed on different electrodes RME. The light emitting elements ED may have a length greater than the distance (or the gap) between the electrodes RME spaced apart from each other in the second direction DR2. The light emitting elements ED may be arranged so that an extension direction thereof may be substantially perpendicular to the first direction DR1 in which the electrodes RME extend. However, embodiments are not limited thereto, and the light emitting elements ED may be disposed so that the extension direction thereof may be the second direction DR2 or a direction obliquely inclined with respect to the second direction DR2.

According to an embodiment, the light emitting elements ED may be disposed on the electrodes RME spaced apart from each other in the second direction DR2 between the walls BP1, BP2, and BP3, and may be divided into light emitting elements ED (e.g., ED1, ED2, ED3, and ED4) disposed on the different electrodes RME. Some of the light emitting elements ED may be disposed between the first wall BP1 and the third wall BP3, and the others of the light emitting elements ED may be disposed between the third wall BP3 and the second wall BP2. According to an embodiment, the light emitting elements ED may include first light emitting elements ED1 and third light emitting elements ED3 disposed between the first wall BP1 and the third wall BP3 and second light emitting elements ED2 and fourth light emitting elements ED4 disposed between the third wall BP3 and the second wall BP2.

The first light emitting elements ED1 may be disposed on the first electrode RME1 and the third electrode RME3 of the first electrode group RMG1, and the second light emitting elements ED2 may be disposed on the second electrode RME2 and the fourth electrode RME4 of the first electrode group RMG1. The third light emitting elements ED3 may be disposed on the fifth electrode RME5 and the seventh electrode RME7 of the second electrode group RMG2, and the fourth light emitting elements ED4 may be disposed on the sixth electrode RME6 and the eighth electrode RME8 of the second electrode group RMG2. The first light emitting elements ED1 and the second light emitting elements ED2 may be disposed adjacent to the upper side in the emission area EMA of the corresponding sub-pixel SPXn, and the third light emitting element ED3 and the fourth light emitting element ED4 may be disposed adjacent to the lower side in the emission area EMA of the corresponding sub-pixel SPXn or the sub-area SA.

However, the respective light emitting elements ED may not be divided according to positions at which they are disposed in the emission area EMA, and may be divided according to connection relationships with connection electrodes CNE to be described below. The respective light emitting elements ED may be in contact (e.g., directly contact) with different connection electrodes CNE at both end portions (e.g., opposite end portions) thereof according to arrangement structures of the connection electrodes CNE, and may be divided into different light emitting elements ED according to types of connection electrodes CNE with which they are in contact.

The connection electrodes CNE (e.g., CNE1, CNE2, CNE3, CNE4, and CNE5) may be disposed on the electrodes RME and the walls BP1, BP2, and BP3. Connection electrodes CNE may each have a shape extending in a direction, and may be disposed to be spaced apart from each other. Each of the connection electrodes CNE may be in contact (e.g., directly contact) with the light emitting elements ED and be connected (e.g., electrically connected) to lower conductive layers.

The connection electrodes CNE may include a first connection electrode CNE1, a second connection electrode CNE2, a third connection electrode CNE3, a fourth connection electrode CNE4, and a fifth connection electrode CNE5 disposed in each sub-pixel SPXn.

The first connection electrode CNE1 may have a shape extending in the first direction DR1, and may be disposed on the first electrode RME1. The first connection electrode CNE1 may overlap (e.g., partially overlap) the first electrode RME1 and the third wall BP3, and may be disposed across the emission area EMA and the sub-area SA. The second connection electrode CNE2 may have a shape extending in the first direction DR1, and may be disposed on the second electrode RME2. The second connection electrode CNE2 may overlap (e.g., partially overlap) the second electrode RME2 and the third wall BP3, and may be disposed across the emission area EMA and the sub-area SA.

The third connection electrode CNE3 may have a shape extending in the first direction DR1, and may be disposed on the third electrode RME3 and the seventh electrode RME7. The third connection electrode CNE3 may overlap the first wall BP1, the third electrode RME3, and the seventh electrode RME7, and may be disposed in the emission area EMA. The fourth connection electrode CNE4 may have a shape extending in the first direction DR1, and may be disposed on the fourth electrode RME4 and the eighth electrode RME8. The fourth connection electrode CNE4 may overlap the second wall BP2, the fourth electrode RME4, and the eighth electrode RME8, and may be disposed in the emission area EMA. The fifth connection electrode CNE5 may have a shape extending in the first direction DR1, and may be disposed on the fifth electrode RME5 and the sixth electrode RME6. The fifth connection electrode CNE5 may be spaced apart from the first connection electrode CNE1 and the second connection electrode CNE2 in the first direction DR1, may overlap the third wall BP3, the fifth electrode RME5, and the sixth electrode RME6, and may be disposed within the emission area EMA.

Each of the first connection electrode CNE1, the second connection electrode CNE2, and the fifth connection electrode CNE5 may be disposed between the third connection electrode CNE3 and the fourth connection electrode CNE4 (e.g., in the second direction DR2). In the emission area EMA, the first connection electrode CNE1, the second connection electrode CNE2, and the fifth connection electrode CNE5 may be inner connection electrodes disposed inside, and the third connection electrode CNE3 and the fourth connection electrode CNE4 may be outer connection electrodes disposed outside.

According to an embodiment, the connection electrodes CNE may be divided into different types of connection electrodes according to their positions or shapes. The first connection electrode CNE1 and the second connection electrode CNE2 may be disposed on any one of the electrodes of the first electrode group RMG1, and may be disposed across the emission area EMA and the sub-area SA. The first connection electrode CNE1 and the second connection electrode CNE2 may be first-type connection electrodes. The first connection electrode CNE1 and the second connection electrode CNE2 may be in contact (e.g., directly contact) with or be connected (e.g., electrically connected) to a lower conductive layer through contact holes CT1 and CT2 formed in the sub-area SA.

The third connection electrode CNE3 and the fourth connection electrode CNE4 may be disposed across electrodes of the first electrode group RMG1 and the second electrode group RMG2 or any one of the electrode pairs RMP1, RMP2, RMP3, and RMP4 in the emission area EMA. The third connection electrode CNE3 may be disposed on the electrodes of the third electrode pair RMP3, and the fourth connection electrode CNE4 may be disposed on the electrodes of the fourth electrode pair RMP4. The third connection electrode CNE3 and the fourth connection electrode CNE4 may be second-type connection electrodes.

The fifth connection electrode CNE5 may be disposed on two electrodes of the second electrode group RMG2 adjacent to each other, for example, the fifth electrode RME5 and the sixth electrode RME6, in the emission area EMA. The fifth connection electrode CNE5 may have a width W5 greater, in the second direction DR2, than widths W1, W2, W3, and W4 of the first connection electrode CNE1, the second connection electrode CNE2, the third connection electrode CNE3, and the fourth connection electrode CNE4. The fifth connection electrode CNE5 may be a third-type connection electrode.

The different types of connection electrodes may be in contact (e.g., directly contact) with the light emitting elements ED, respectively, and may connect (e.g., electrically connect) different light emitting elements ED to each other. The first connection electrode CNE1 may be in contact (e.g., directly contact) with the first light emitting elements ED1, and the second connection electrode CNE2 may be in contact (e.g., directly contact) with the second light emitting elements ED2. The third connection electrode CNE3 may be in contact (e.g., directly contact) with the first light emitting elements ED1 and the third light emitting elements ED3, and the fourth connection electrode CNE4 may be in contact (e.g., directly contact) with the second light emitting elements ED2 and the fourth light emitting elements ED4. The fifth connection electrode CNE5 may be in contact (e.g., directly contact) with the third light emitting elements ED3 and the fourth light emitting elements ED4.

The different types of connection electrodes may be divided according to their shapes and connection relationships with other layers. For example, the lengths L1 and L2 of the first connection electrode CNE1 and the second connection electrode CNE2 (as the first-type connection electrodes) and the lengths L3 and L4 of the third connection electrode CNE3 and the fourth connection electrode CNE4 (as the second-type connection electrode) in the first direction DR1 may be smaller than the length L5 of the fifth connection electrode CNE5 (as the third-types connection electrode) in the first direction DR1. For example, the widths W1 and W2 of the first connection electrode CNE1 and the second connection electrode CNE2 (as the first-type connection electrodes) and the widths W3 and W4 of the third connection electrode CNE3 and the fourth connection electrode CNE4 (as the second-type connection electrodes) in the second direction DR2 may be smaller than the width W5 of the fifth connection electrode CNE5 (as the third-type connection electrode) in the second direction DR2. As described below, the first-types connection electrode and the third-type connection electrode may be connection electrodes disposed at a level different from a level at which the second-type connection electrodes are disposed. For example, the first-types connection electrode and the third-type connection electrode may be formed of a layer different from a layer of which and the second-type connection electrodes may be formed.

The first-type connection electrodes may be in contact (e.g., directly contact) with conductive pattern layers or lines of another conductive layer in the sub-area SA, and the second-type connection electrodes and the third-type connection electrode may be in contact (e.g., directly contact) with only the light emitting elements ED. The second-type connection electrodes and the third-type connection electrode may not be directly connected to another conductive layer, and may be in contact (e.g., directly contact) with the light emitting elements ED and may constitute electrical connection circuits of the light emitting elements ED together with the other connection electrodes CNE.

The light emitting elements ED may be divided into different light emitting elements ED according to the connection electrodes CNE with which both end portions (e.g., opposite end portions) thereof are in contact in response to the arrangement structures of the connection electrodes CNE. The first light emitting elements ED1 and the second light emitting elements ED2 may have both end portions (e.g., opposite end portions) in contact (e.g., directly contact) with the first-type connection electrodes and the second-type connection electrodes. The first light emitting elements ED1 may be in contact (e.g., directly contact) with the first connection electrode CNE1 and the third connection electrode CNE3, and the second light emitting elements ED2 may be in contact (e.g., directly contact) with the second connection electrode CNE2 and the fourth connection electrode CNE4. The third light emitting elements ED3 and the fourth light emitting elements ED4 may have both end portions (e.g., opposite end portions) in contact (e.g., directly contact) with the second-type connection electrodes and the third-type connection electrode. The third light emitting elements ED3 may be in contact (e.g., directly contact) with the third connection electrode CNE3 and the fifth connection electrode CNE5, and the fourth light emitting elements ED4 may be in contact (e.g., directly contact) with the fourth connection electrode CNE4 and the fifth connection electrode CNE5.

As described below, the light emitting elements ED may have both end portions (e.g., opposite end portions) distinguished from each other in a direction in which they extend, and may be connected to each other in series through the connection electrodes CNE with which the both end portions (e.g., opposite end portions) are in contact. The display device 10 may include a larger number of light emitting elements ED for each sub-pixel SPXn, and the series connection between the light emitting elements may be configured, such that an amount of light emitted per unit area may be increased.

In case that a first end portion of any one light emitting element ED is connected (e.g., electrically connected) to a second end portion of the other light emitting element ED, any one light emitting element ED and the other light emitting element ED may be connected to each other in series. An electrical connection between these light emitting elements ED may be implemented by bringing the connection electrodes CNE in contact (e.g., directly contact) with different light emitting elements ED into contact with different end portions of the two light emitting elements ED. This may be implemented by designing pattern shapes of the connection electrodes CNE or orientation directions of the light emitting elements ED. In the display device 10 according to an embodiment, the connection electrodes CNE may have pattern shapes in which they extend in a direction, and a serial connection between the light emitting elements ED may be configured by designing the orientation directions of the light emitting elements ED in contact (e.g., directly contact) with the connection electrodes CNE accordingly. For example, since the light emitting elements ED connected to each other in series are disposed to have different orientation directions, even though the connection electrodes CNE extend only in a direction and do not have pattern shapes being bent or bypassed, a series connection between the light emitting elements ED may be implemented. Since the connection electrodes CNE have a shape extending in a direction, the display device 10 may have an advantage in securing a space in consideration of the pattern shapes of the connection electrodes CNE in the emission area EMA. A detailed description thereof will be provided below with reference to other drawings.

Figure 7:
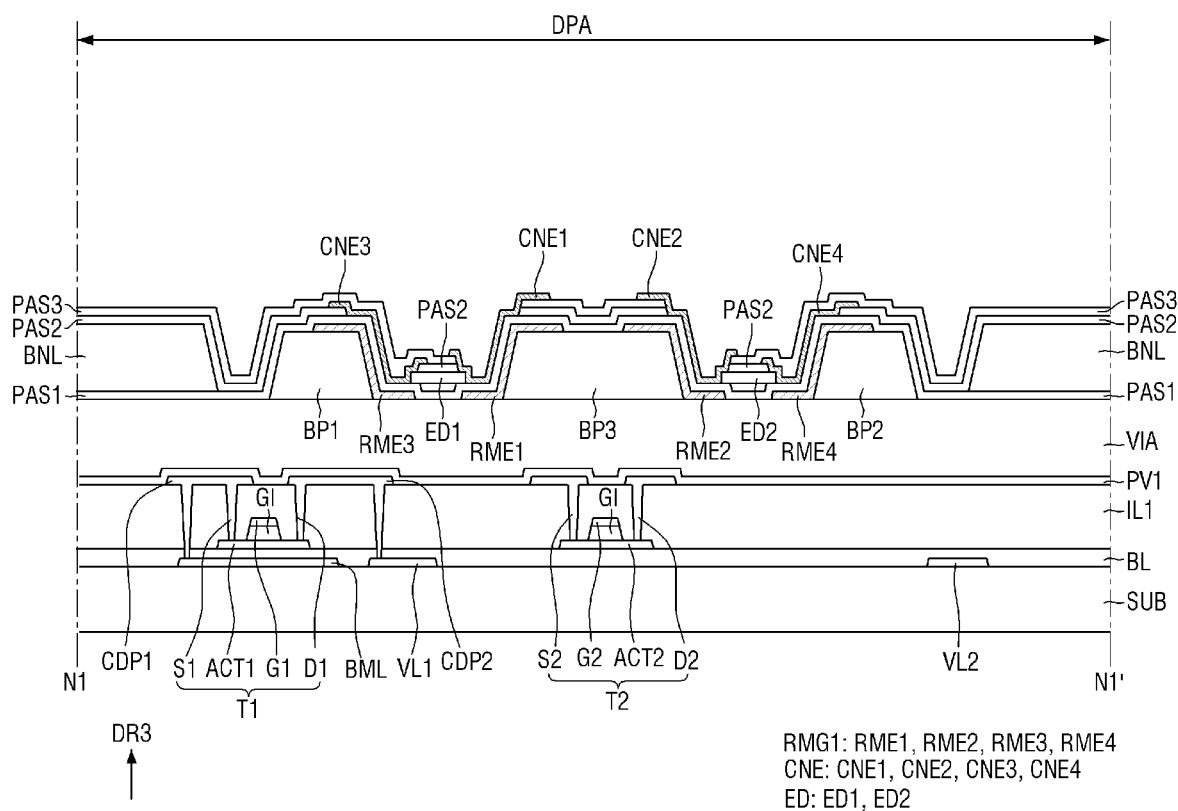
FIG. 7 is a schematic cross-sectional view taken along line N1-N1' of FIG. 6.
Figure 8:
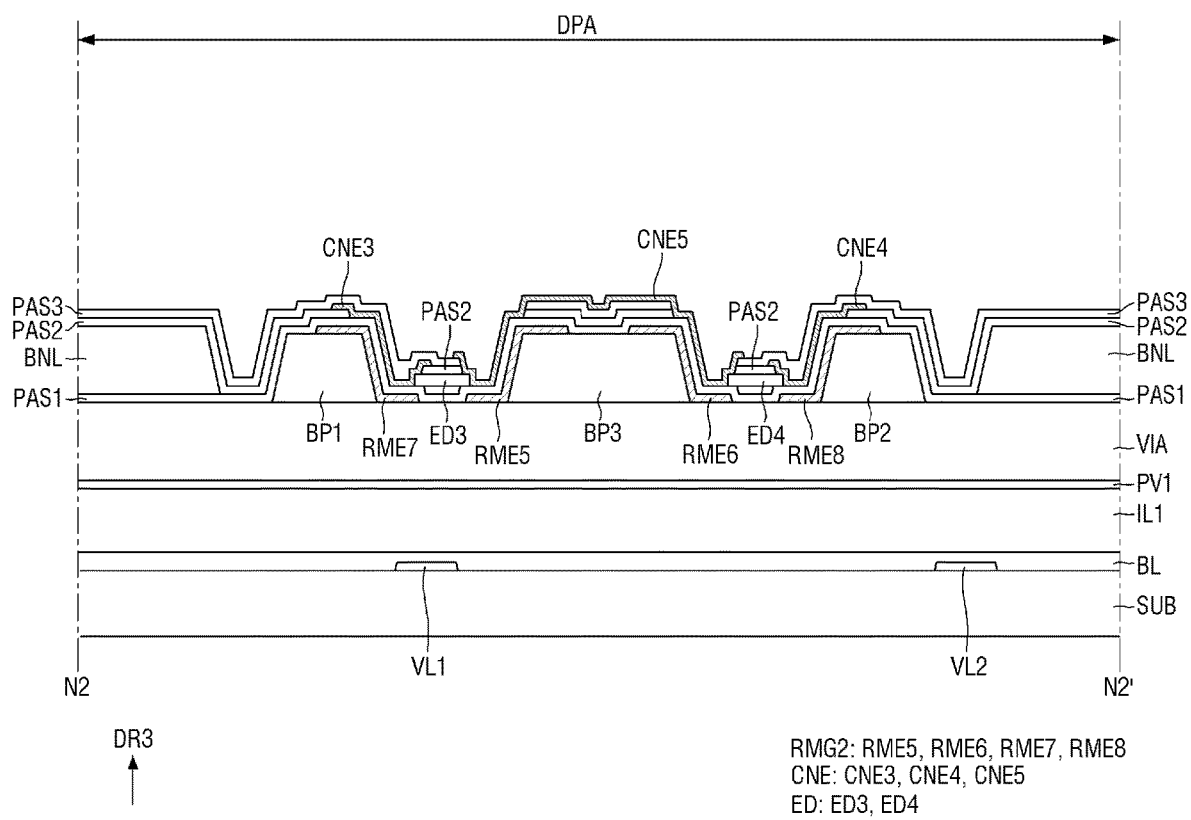
FIG. 8 is a schematic cross-sectional view taken along line N2-N2' of FIG. 6.
Figure 9:
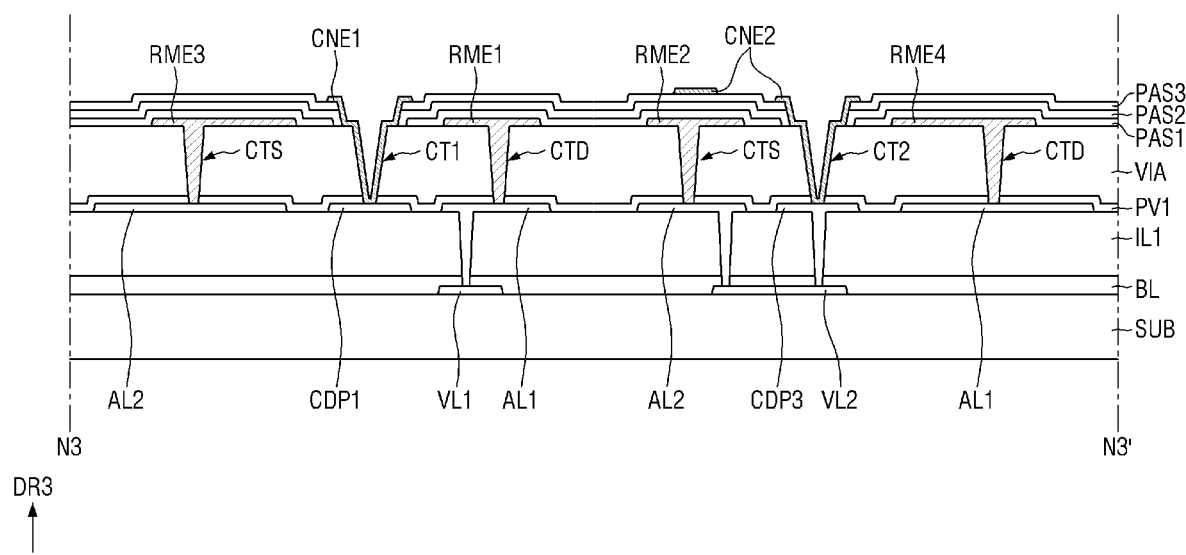
FIG. 9 is a schematic cross-sectional view taken along line N3-N3' of FIG. 6.
Figure 10:
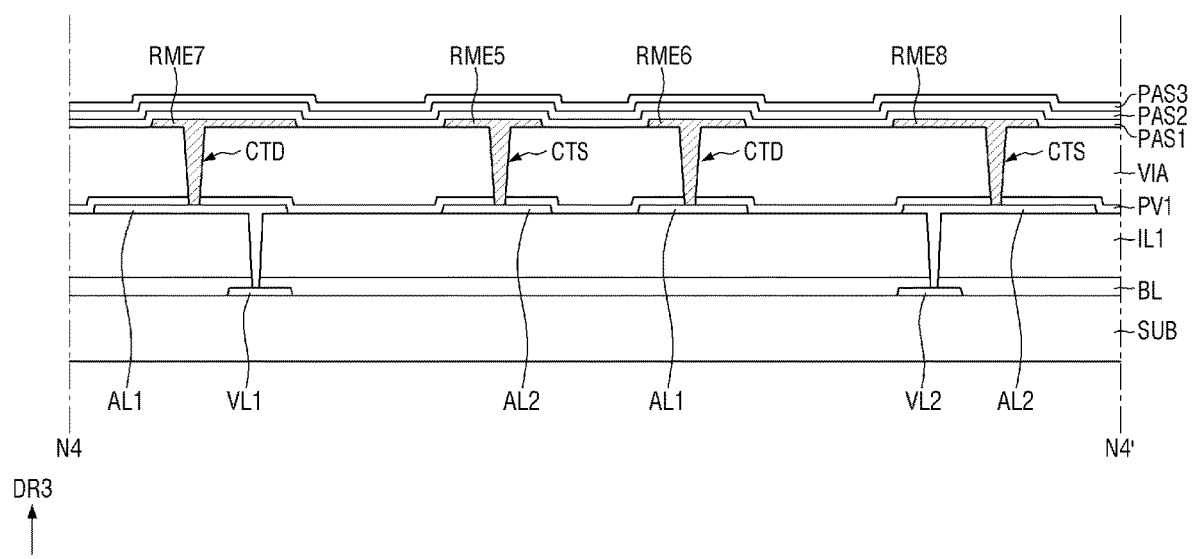
FIG. 10 is a schematic cross-sectional view taken along line N4-N4' of FIG. 6.

FIG. 7 is a schematic cross-sectional view taken along line N1-N1' of FIG. 6. FIG. 8 is a schematic cross-sectional view taken along line N2-N2' of FIG. 6. FIG. 9 is a schematic cross-sectional view taken along line N3-N3' of FIG. 6. FIG. 10 is a schematic cross-sectional view taken along line N4-N4' of FIG. 6.

FIG. 7 illustrates a cross section crossing the first electrode group RMG1 and both end portions (e.g., opposite end portions) of the first light emitting element ED1 and the second light emitting element ED2, and FIG. 8 illustrates a cross section crossing the second electrode group RMG2 and both end portions (e.g., opposite end portions) of the third light emitting element ED3 and the fourth light emitting element ED4. FIGS. 9 and 10 illustrate cross sections crossing electrode contact holes CTD and CTS through which the first electrode group RMG1 and the second electrode group RMG2 are connected to the signal lines AL1 and AL2, respectively.

A cross-sectional structure of the display device 10 will be described with reference to FIGS. 7 to 10 in addition to FIGS. 5 and 6. The display device 10 may include a first substrate SUB, and a semiconductor layer, conductive layers, and insulating layers disposed on the first substrate SUB. For example, the display device 10 may include the electrodes RME, the light emitting elements ED, and the connection electrodes CNE.

The first substrate SUB may be an insulating substrate. The first substrate SUB may be made of an insulating material such as glass, quartz, or a polymer resin. For example, the first substrate SUB may be a rigid substrate, but may also be a flexible substrate that may be bendable, foldable, or rollable. The first substrate SUB may include a display area DPA and a non-display area NDA surrounding the display area DPA, and the display area DPA may include an emission area EMA and a sub-area SA, which is a portion of a non-emission area.

A first conductive layer may include a lower metal layer BML, a first voltage line VL1, and a second voltage line VL2. The lower metal layer BML may be disposed to overlap a first active layer ACT1 of a first transistor T1. The lower metal layer BML may prevent light from being incident on the first active layer ACT1 of the first transistor or may be connected (e.g., electrically connected) to the first active layer ACT1 to function to stabilize electrical characteristics of the first transistor T1. In another example, the lower metal layer BML may be omitted.

A high potential voltage (or a first source voltage) transferred to the first electrode RME1 may be applied to the first voltage line VL1, and a low potential voltage (or a second source voltage) transferred to the second electrode RME2 may be applied to the second voltage line VL2. The first voltage line VL1 may be connected (e.g., electrically connected) to the first transistor T1 through a conductive pattern layer (e.g., a second conductive pattern layer CDP2) of the third conductive layer. The second voltage line VL2 may be connected (e.g., electrically connected) to the second electrode RME2 through a conductive pattern layer (e.g., the second signal line AL2) of the third conductive layer.

It has been illustrated in the drawings that the first voltage line VL1 and the second voltage line VL2 are formed of the first conductive layer, but embodiments are not limited thereto. In some embodiments, the first voltage line VL1 and the second voltage line VL2 may be formed of the third conductive layer and be connected (e.g., directly electrically connected) to the first transistor T1 and the second electrode RME2, respectively. For example, the first voltage line VL1 and the second voltage line VL2 may be the first signal line AL1 or the second signal line AL2 of FIGS. 5 and 6.

A buffer layer BL may be disposed on the first conductive layer and the first substrate SUB. The buffer layer BL may be formed on the first substrate SUB in order to protect transistors of the pixel PX from moisture permeating through the first substrate SUB vulnerable to moisture permeation, and may perform a surface planarization function.

The semiconductor layer may be disposed on the buffer layer BL. The semiconductor layer may include the first active layer ACT1 of the first transistor T1 and a second active layer ACT2 of a second transistor T2. A second conductive layer may include a first gate electrode G1 and a second gate electrode G2. The first active layer ACT1 and the second active layer ACT2 may overlap (e.g., partially overlap) the first gate electrode G1 and the second gate electrode G2 of the second conductive layer to be described below, respectively.

The semiconductor layer may include polycrystalline silicon, single crystal silicon, an oxide semiconductor, or the like. In an embodiment, the semiconductor layer may include polycrystalline silicon or an oxide semiconductor. The oxide semiconductor may include indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

It has been illustrated in FIG. 7 that a single first transistor T1 and a single second transistor T2 are disposed in the sub-pixel SPXn of the display device 10, but embodiments are not limited thereto, and the display device 10 may include a larger number of transistors.

A first gate insulating layer GI may be disposed on the semiconductor layer. The first gate insulating layer GI may function as a gate insulating film of each of the transistors T1 and T2. It has been illustrated in FIG. 7 that the first gate insulating layer GI is patterned together with the gate electrodes G1 and G2 of the second conductive layer to be partially disposed between the second conductive layer and the active layers ACT1 and ACT2 of the semiconductor layer, but embodiments are not limited thereto. In some embodiments, the first gate insulating layer GI may be disposed (e.g., entirely disposed) on the buffer layer BL with covering the semiconductor layer.

The second conductive layer may be disposed on the first gate insulating layer GI. The second conductive layer may include the first gate electrode G1 of the first transistor T1 and the second gate electrode G2 of the second transistor T2. The first gate electrode G1 may overlap a channel region of the first active layer ACT1 in a third direction DR3, which is a thickness direction, and the second gate electrode G2 may overlap a channel region of the second active layer ACT2 in the third direction DR3, which is the thickness direction. For example, the second conductive layer may further include an electrode of a storage capacitor.

A first interlayer insulating layer IL1 may be disposed on the second conductive layer. The first interlayer insulating layer IL1 may function as an insulating film between the second conductive layer and other layers disposed on the second conductive layer, and may protect the second conductive layer.

The third conductive layer may be disposed on the first interlayer insulating layer IL1. The third conductive layer may include conductive pattern layers CDP1, CDP2, and CDP3, source electrodes S1 and S2 and drain electrodes D1 and D2 of the respective transistors T1 and T2, and the signal lines AL1 and AL2. Some of the conductive pattern layers CDP1, CDP2, and CDP3 may connect (e.g., electrically connect) conductive layers or semiconductor layers (as different layers) to each other, and function as source/drain electrodes of the transistors T1 and T2.

A first conductive pattern layer CDP1 may be in contact (e.g., directly contact) with the first active layer ACT1 of the first transistor T1 through a contact hole passing through the first interlayer insulating layer IL1. The first conductive pattern layer CDP1 may be in contact (e.g., directly contact) with the lower metal layer BML, through a contact hole passing through the first interlayer insulating layer IL1 and the buffer layer BL. The first conductive pattern layer CDP1 may function as a first source electrode S1 of the first transistor T1. The first conductive pattern layer CDP1 may be connected (e.g., electrically connected) to the first electrode RME1 or the first connection electrode CNE1. The first transistor T1 may transfer the first source voltage applied from the first voltage line VL1 to the first electrode RME1 or the first connection electrode CNE1.

A second conductive pattern layer CDP2 may be in contact (e.g., directly contact) with the first voltage line VL1 through a contact hole passing through the first interlayer insulating layer IL1 and the buffer layer BL. For example, the second conductive pattern layer CDP2 may be in contact (e.g., directly contact) with the first active layer ACT1 of the first transistor T1 through a contact hole passing through the first interlayer insulating layer IL1. The second conductive pattern layer CDP2 may connect (e.g., electrically connect) the first voltage line VL1 to the first transistor T1, and function as a first drain electrode D1 of the first transistor T1.

A third conductive pattern layer CDP3 may be in contact (e.g., directly contact) with the second voltage line VL2 through a contact hole passing through the first interlayer insulating layer IL1 and the buffer layer BL. The second voltage line VL2 may transfer the second source voltage to the second connection electrode CNE2 through the third conductive pattern layer CDP3. However, in some embodiments, the third conductive pattern layer CDP3 may be omitted and replaced with the second signal line AL2.

A second source electrode S2 and a second drain electrode D2 of the second transistor T2 may be in contact (e.g., directly contact) with the second active layer ACT2 of the second transistor T2 through contact holes passing through the first interlayer insulating layer ILL respectively. The second transistor T2 may transfer a data signal to the first transistor T1 or transfer an initialization signal.

The first signal line AL1 and the second signal line AL2 may be connected (e.g., electrically connected) to the first voltage line VL1 and the second voltage line VL2, respectively. The first signal line AL1 may be in contact (e.g., directly contact) with the first voltage line VL1 through a contact hole passing through the first interlayer insulating layer IL1 and the buffer layer BL. The second signal line AL2 may be in contact (e.g., directly contact) with the second voltage line VL2 through a contact hole passing through the first interlayer insulating layer IL1 and the buffer layer BL. Electrical signals applied to the first voltage line VL1 and the second voltage line VL2 may be transferred to the first signal line AL1 and the second signal line AL2, respectively. However, embodiments are not limited thereto. The signal lines AL1 and AL2 may not be connected (e.g., electrically connected) to the voltage lines VL1 and VL2, respectively.

A first passivation layer PV1 may be disposed on the third conductive layer. The first passivation layer PV1 may function as an insulating film between the third conductive layer and other layers and protect the third conductive layer.

Each of the buffer layer BL, the first gate insulating layer GI, the first interlayer insulating layer ILL and the first passivation layer PV1 described above may be formed as inorganic layers that are alternately stacked. For example, each of the buffer layer BL, the first gate insulating layer GI, the first interlayer insulating layer ILL and the first passivation layer PV1 may be formed as a double layer in which inorganic layers including at least one of silicon oxide ($SiO_x$), silicon nitride ($SiN_x$), and silicon oxynitride ($SiO_xN_y$) are stacked or a multiple layer in which these layers are alternately stacked. However, embodiments are not limited thereto, and each of the buffer layer BL, the first gate insulating layer GI, the first interlayer insulating layer ILL and the first passivation layer PV1 may also be formed as an inorganic layer including the above-described insulating material. In some embodiments, the first interlayer insulating layer IL1 may also be made of an organic insulating material such as polyimide (PI).

A via layer VIA may be disposed on the third conductive layer in the display area DPA. The via layer VIA may include an organic insulating material, for example, an organic insulating material such as polyimide (PI) to compensate for a step difference due to lower conductive layers and make an upper surface flat. However, in some embodiments, the via layer VIA may be omitted.

The display device 10 may include the walls BP1, BP2, and BP3, the electrodes RME, the bank layer BNL, the light emitting elements ED, and the connection electrodes CNE, as a display element layer disposed on the via layer VIA. For example, the display device 10 may include the insulating layers PAS1, PAS2, and PASS.

The walls BP1, BP2, and BP3 may be disposed on the via layer VIA. For example, the walls BP1, BP2, and BP3 may be disposed (e.g., directly disposed) on the via layer VIA, and may have a structure in which at least portions thereof protrude from an upper surface of the via layer VIA. As described above, the first wall BP1 and the second wall BP2 may be spaced apart from each other, and the third wall BP3 may be disposed between the first wall BP1 and the second wall BP2. The protruding portions of the walls BP1, BP2, and BP3 may have side surfaces (or lateral surfaces) inclined or bent with a curvature (e.g., a predetermined curvature), and light emitted from the light emitting elements ED may be reflected by the electrodes RME disposed on the walls BP1, BP2, and BP3 and emitted in an upward direction of the via layer VIA. In another example, the walls BP1, BP2, and BP3 may have a shape of which outer surfaces are bent with a curvature (e.g., a predetermined curvature) in cross-sectional view, for example, a semi-circular or semi-elliptical shape. The walls BP1, BP2, and BP3 may include an organic insulating material such as polyimide (PI), but embodiments are not limited thereto.

The electrodes RME may be disposed on the walls BP1, BP2, and BP3 and the via layer VIA. For example, the respective electrodes RME may be disposed on at least the inclined side surfaces of the walls BP1, BP2, and BP3. Widths of the electrodes RME measured in the second direction DR2 may be smaller than widths of the walls BP1, BP2, and BP3 measured in the second direction DR2, and a distance (or a gap) between the electrodes RME spaced apart from each other in the second direction DR2 may be smaller than a distance (or a gap) between the walls BP1, BP2, and BP3. The electrodes RME may be disposed (e.g., directly disposed) on the via layer VIA at at least partial areas thereof, and may thus be disposed on the same plane.

As described above, the first electrode pair RMP1 and the second electrode pair RMP2, or the first electrode RME1 and the fifth electrode RME5, and the second electrode RME2 and the sixth electrode RME6 may be disposed on the third wall BP3. The third electrode RME3 and the seventh electrode RME7 of the third electrode pair RMP3 may be disposed on the first wall BP1, and the fourth electrode RME4 and the eighth electrode RME8 of the fourth electrode pair RMP4 may be disposed on the second wall BP2.

The light emitting elements ED disposed between the walls BP1, BP2, and BP3 may emit light toward both end portions (e.g., opposite end portions) thereof, and the emitted light may be directed to the electrodes RME disposed on the walls BP1, BP2, and BP3. The respective electrodes RME may have a structure in which portions thereof disposed on the walls BP1, BP2, and BP3 may reflect the light emitted from the light emitting elements ED. The electrodes RME may cover at least one side surfaces of the walls BP1, BP2, and BP3 to reflect the light emitted from the light emitting elements ED.

The electrodes RME may be in contact (e.g., direct contact) with the third conductive layer through the electrode contact holes CTD and CTS in the sub-area SA. For example, first electrode contact holes CTD may be formed in portions where the electrodes RME and the first signal line AL1 overlap each other, and second electrode contact holes CTS may be formed in portions in which the electrodes RME and the second signal line AL2 overlap each other. The first electrode RME1, the fourth electrode RME4, the sixth electrode RME6, and the seventh electrode RME7 may be connected (e.g., electrically connected) to the first signal line AL1 through the first electrode contact holes CTD passing through the via layer VIA and the first passivation layer PV1, respectively. The second electrode RME2, the third electrode RME3, the fifth electrode RME5, and the eighth electrode RME8 may be connected (e.g., electrically connected) to the first signal line AL1 through the second electrode contact holes CTS passing through the via layer VIA and the first passivation layer PV1, respectively. As described above, the two different electrodes RME adjacent to each other in the second direction DR2 may be connected (e.g., electrically connected) to the different signal lines AL1 and AL2, and the two different electrodes of each of the electrode pairs RMP1, RMP2, RMP3, and RMP4 may also be connected (e.g., electrically connected) to the different signal lines AL1 and AL2. An electrical signal applied to the first signal line AL1 may be transferred to the first electrode RME1, the fourth electrode RME4, the sixth electrode RME6, and the seventh electrode RME7, and an electrical signal applied to the second signal line AL2 may be transferred to the second electrode RME2, the third electrode RME3, the fifth electrode RME5, and the eighth electrode RME8.

However, the electrodes RME connected to specific signal lines AL1 and AL2 may not be limited to those illustrated in the drawings. For example, unlike an embodiment of FIG. 6, the first electrode RME1, the fourth electrode RME4, the sixth electrode RME6, and the seventh electrode RME7 may be connected (e.g., electrically connected) to the second signal line AL2, and the second electrode RME2, the third electrode RME3, the fifth electrode RME5, and the eighth electrode RME8 may be connected (e.g., electrically connected) to the first signal line AL1. Types of the signal lines AL1 and AL2 to which the electrodes RME are connected may be changed or modified as long as the electrodes RME adjacent to each other in the second direction DR2 are connected (e.g., electrically connected) to the different signal lines AL1 and AL2.

An embodiment in which the respective signal lines AL1 and AL2 are connected (e.g., electrically connected) to the voltage lines VL1 and VL2 has been illustrated in the drawings. Accordingly, the electrical signals applied to the voltage lines VL1 and VL2 may be transferred to the respective electrodes RME through the signal lines AL1 and AL2. However, embodiments are not limited thereto. In another example, the signal lines AL1 and AL2 may not be connected (e.g., electrically connected) to the voltage lines VL1 and VL2, and the electrical signals applied to the voltage lines VL1 and VL2 may not be transferred to the electrodes RME. In another example, only the electrical signals applied to the signal lines AL1 and AL2 may be transferred to the electrodes RME.

The electrodes RME may include a conductive material having high reflectivity. For example, the electrodes RME may include a metal such as silver (Ag), copper (Cu), or aluminum (Al), include an alloy including aluminum (Al), nickel (Ni), lanthanum (La), or the like, or have a structure in which a metal layer made of titanium (Ti), molybdenum (Mo), and niobium (Nb) and the alloy are stacked. In some embodiments, the electrodes RME may be formed as a double layer or a multiple layer in which an alloy including aluminum (Al) and one or more metal layers made of titanium (Ti), molybdenum (Mo), and niobium (Nb) are stacked.

Embodiments are not limited thereto, and each of the electrodes RME may further include a transparent conductive material. For example, each of the electrodes RME may include a material such as ITO, IZO, or ITZO. In some embodiments, each of the electrodes RME may have a structure in which one or more layers made of a transparent conductive material and one or more layers made of a metal having high reflectivity are stacked or may be formed as a layer including the transparent conductive material and the metal having the high reflectivity. For example, each of the electrodes RME may have a stacked structure such as ITO/Ag/ITO, ITO/Ag/IZO, or ITO/Ag/ITZO/IZO. The electrodes RME may reflect some of the light emitted from the light emitting elements ED in an upward direction of the first substrate SUB (e.g., in the third direction DR3) with being connected (e.g., electrically connected) to the light emitting elements ED.

A first insulating layer PAS1 may be disposed in the display area DPA, and may be disposed on the via layer VIA and the electrodes RME. For example, the first insulating layer PAS1 may entirely cover the display area DPA. The first insulating layer PAS1 may insulate different electrodes RME from each other with protecting the electrodes RME. The first insulating layer PAS1 may be disposed to cover the electrodes RME before the bank layer BNL is formed, and may thus prevent the electrodes RME from being damaged in a process of forming the bank layer BNL. For example, the first insulating layer PAS1 may prevent the light emitting elements ED disposed on the first insulating layer PAS1 from being in contact (e.g., direct contact) with and being damaged by other members.

In an embodiment, the first insulating layer PAS1 may have a step difference so that a portion of an upper surface of the first insulating layer PAS1 may be recessed between the electrodes RME spaced apart from each other in the second direction DR2. The light emitting elements ED may be disposed on the upper surface of the first insulating layer PAS1 in which the step difference is formed, and spaces may be formed between the light emitting elements ED and the first insulating layer PAS1.

The first insulating layer PAS1 may include contact holes CT1 and CT2 disposed in the sub-area SA. The contact holes CT1 and CT2 may be disposed so as not to overlap the electrodes RME, respectively, and may pass through the via layer VIA to expose conductive pattern layers of the third conductive layer. For example, a first contact hole CT1 may pass through the first insulating layer PAS1 and the via layer VIA to expose the first conductive pattern layer CDP1, and a second contact hole CT2 may pass through the first insulating layer PAS1 and the via layer VIA to expose the third conductive pattern layer CDP3. The first contact hole CT1 and the second contact hole CT2 may further pass through portions of the other insulating layers disposed on the first insulating layer PAS1, respectively. The conductive pattern layers exposed by the respective contact holes CT1 and CT2 may be in contact (e.g., directly contact) with connection electrodes CNE to be described below.

The bank layer BNL may be disposed on the first insulating layer PAS1. The bank layer BNL may include portions extending in the first direction DR1 and the second direction DR2, and surround each of the sub-pixels SPXn. The bank layer BNL may divide the emission area EMA and the sub-area SA of each sub-pixel SPXn with surrounding the emission area EMA and the sub-area SA of each sub-pixel SPXn, and may divide the display area DPA and the non-display area NDA with surrounding the outermost portion of the display area DPA.

The bank layer BNL may have a height (e.g., a predetermined height), similar to the walls BP1, BP2, and BP3. In some embodiments, a height of an upper surface of the bank layer BNL may be greater than those of the walls BP1, BP2, and BP3, and a thickness of the bank layer BNL may be substantially the same as or greater than those of the walls BP1, BP2, and BP3. The bank layer BNL may prevent ink from overflowing into adjacent sub-pixels SPXn in an inkjet printing process of processes of manufacturing the display device 10. The bank layer BNL may include an organic insulating material such as polyimide like the walls BP1, BP2, and BP3.

The light emitting elements ED may be disposed in the emission area EMA. The light emitting elements ED may be disposed on the first insulating layer PAS1 between the walls BP1, BP2, and BP3. The light emitting element ED may be disposed to be parallel to an upper surface of the first substrate SUB. As described below, the light emitting element ED may include semiconductor layers disposed along a direction, and the semiconductor layers may be sequentially disposed along a direction parallel to the upper surface of the first substrate SUB. However, embodiments are not limited thereto, and in case that the light emitting element ED has a different structure, the semiconductor layers may also be disposed in a direction perpendicular to the first substrate SUB.

The light emitting elements ED disposed in each sub-pixel SPXn may emit light of different wavelength bands according to materials of the above-described semiconductor layers. However, embodiments are not limited thereto, and the light emitting elements ED disposed in each sub-pixel SPXn may include semiconductor layers made of the same material to emit light of the same color.

The light emitting elements ED may be in contact (e.g., directly contact) with the connection electrodes CNE to be connected (e.g., electrically connected) to the electrodes RME and the conductive layers below the via layer VIA, and may receive electrical signals applied thereto to emit light of a specific wavelength band.

A second insulating layer PAS2 may be disposed on the light emitting elements ED, the first insulating layer PAS1, and the bank layer BNL. The second insulating layer PAS2 may include pattern parts extending in the first direction DR1 between the walls BP1, BP2, and BP3 and disposed on the light emitting elements ED. The pattern parts may surround (e.g., partially surround) outer surfaces of the light emitting elements ED, and may not cover both sides (e.g., opposite sides) or both end portions (e.g., opposite end portions) of the light emitting elements ED. The pattern parts may form a linear or island-shaped pattern in each sub-pixel SPXn in a plan view. The pattern parts of the second insulating layer PAS2 may fix the light emitting elements ED in the processes of manufacturing the display device 10 with protecting the light emitting elements ED. For example, the second insulating layer PAS2 may fill spaces between the light emitting elements ED and the first insulating layer PAS1 below the light emitting elements ED. For example, portions of the second insulating layer PAS2 may be disposed on the bank layer BNL and in the sub-areas SA.

The connection electrodes CNE may be disposed on the electrodes RME and the walls BP1, BP2, and BP3. The connection electrodes CNE may be divided into connection electrodes of a first connection electrode layer disposed between the second insulating layer PAS2 and a third insulating layer PAS3 to be described below and connection electrodes of a second connection electrode layer disposed on the third insulating layer PAS3. The third connection electrode CNE3 and the fourth connection electrode CNE4 may be connection electrodes of the first connection electrode layer, and the first connection electrode CNE1, the second connection electrode CNE2, and the fifth connection electrode CNE5 may be the connection electrodes of the second connection electrode layer.

The first connection electrode CNE1 may be disposed on the first electrode RME1 and the third wall BP3. The first connection electrode CNE1 may overlap (e.g., partially overlap) the first electrode RME1, and may be disposed from the emission area EMA to the sub-area SA beyond the bank layer BNL. The second connection electrode CNE2 may be disposed on the second electrode RME2 and the third wall BP3. The second connection electrode CNE2 may overlap (e.g., partially overlap) the second electrode RME2, and may be disposed from the emission area EMA to the sub-area SA beyond the bank layer BNL.

The third connection electrode CNE3 may be disposed on the third electrode RME3, the seventh electrode RME7, and the first wall BP1. The third connection electrode CNE3 may be disposed on the third electrode RME3 and the seventh electrode RME7 of the third electrode pair RMP3, and may be disposed in the emission area EMA. The fourth connection electrode CNE4 may be disposed on the fourth electrode RME4, the eighth electrode RME8, and the second wall BP2. The fourth connection electrode CNE4 may be disposed on the fourth electrode RME4 and the eighth electrode RME8 of the fourth electrode pair RMP4, and may be disposed in the emission area EMA. The fifth connection electrode CNE5 may be disposed on the fifth electrode RME5, the sixth electrode RME6, and the third wall BP3.

The first connection electrode CNE1 and the second connection electrode CNE2 may be in contact (e.g., directly contact) with the first light emitting elements ED1 and the second light emitting elements ED2, respectively. The first connection electrode CNE1 may be in contact (e.g., directly contact) with first end portions of the first light emitting elements ED1, and the second connection electrode CNE2 may be in contact (e.g., directly contact) with second end portions of the second light emitting elements ED2. The third connection electrode CNE3 may be in contact (e.g., directly contact) with the first light emitting elements ED1 and the third light emitting elements ED3. The third connection electrode CNE3 may be in contact (e.g., directly contact) with second end portions of the first light emitting elements ED1 and first end portions of the third light emitting elements ED3. The fourth connection electrode CNE4 may be in contact (e.g., directly contact) with the second light emitting elements ED2 and the fourth light emitting elements ED4. The fourth connection electrode CNE4 may be in contact (e.g., directly contact) with first end portions of the second light emitting elements ED2 and second end portions of the fourth light emitting elements ED4. The fifth connection electrode CNE5 may be in contact (e.g., directly contact) with the third light emitting elements ED3 and the fourth light emitting elements ED4. The fifth connection electrode CNE5 may be in contact (e.g., directly contact) with second end portions of the third light emitting elements ED3 and first end portions of the fourth light emitting elements ED4.

The first connection electrode CNE1 may be in contact (e.g., directly contact) with the first conductive pattern layer CDP1 through the first contact hole CT1 passing through the via layer VIA, the first insulating layer PAS1, the second insulating layer PAS2, and the third insulating layer PAS3 in the sub-area SA. The second connection electrode CNE2 may be in contact (e.g., directly contact) with the third conductive pattern layer CDP3 through the second contact hole CT2 passing through the via layer VIA, the first insulating layer PAS1, the second insulating layer PAS2, and the third insulating layer PAS3 in the sub-area SA. The first connection electrode CNE1 may be connected (e.g., electrically connected) to the first transistor T1 through the first conductive pattern layer CDP1 to receive the first source voltage transferred thereto, and the second connection electrode CNE2 may be connected (e.g., electrically connected) to the second voltage line VL2 through the third conductive pattern layer CDP3 to receive the second source voltage applied thereto. The light emitting elements ED may emit the light by the source voltages transferred through the first connection electrode CNE1 and the second connection electrode CNE2.

The connection electrodes CNE may include a conductive material. For example, the connection electrodes CNE may include ITO, IZO, ITZO, aluminum (Al), or the like. As an example, the connection electrodes CNE may include a transparent conductive material, and the light emitted from the light emitting elements ED may be transmitted through the connection electrodes CNE and emitted.

The third insulating layer PAS3 may be disposed on the connection electrodes of the second connection electrode layer and the second insulating layer PAS2. The third insulating layer PAS3 may be disposed (e.g., entirely disposed) on the second insulating layer PAS2 to cover the third connection electrode CNE3 and the fourth connection electrode CNE4, and the first connection electrode CNE1, the second connection electrode CNE2 and the fifth connection electrode CNE5 may be disposed on the third insulating layer PAS3. The third insulating layer PAS3 may be disposed (e.g., entirely disposed) on the via layer VIA except for areas in which the third connection electrode CNE3 and the fourth connection electrode CNE4 are disposed. The third insulating layer PAS3 may insulate the connection electrodes of the first connection electrode layer and the connection electrodes of the second connection electrode layer from each other so that the connection electrodes of the first connection electrode layer and the connection electrodes of the second connection electrode layer may not be direct contact with each other.

For example, another insulating layer may be further disposed on the third insulating layer PAS3. Such an insulating layer may function to protect members disposed on the first substrate SUB from an external environment.

Each of the first insulating layer PAS1, the second insulating layer PAS2, and the third insulating layer PAS3 described above may include an inorganic insulating material or an organic insulating material. As an example, each of the first insulating layer PAS1, the second insulating layer PAS2, and the third insulating layer PAS3 may include an inorganic insulating material, or the first insulating layer PAS1 and the third insulating layer PAS3 may include an inorganic insulating material, but the second insulating layer PAS2 may include an organic insulating material. Each or at least one of the first insulating layer PAS1, the second insulating layer PAS2, and the third insulating layer PAS3 may be formed in a structure in which insulating layers are alternately or repeatedly stacked. In an embodiment, each of the first insulating layer PAS1, the second insulating layer PAS2, and the third insulating layer PAS3 may be made of any one of silicon oxide ($SiO_x$), silicon nitride ($SiN_x$), and silicon oxynitride ($SiO_xN_y$). All of the first insulating layer PAS1, the second insulating layer PAS2, and the third insulating layer PAS3 may be made of the same material, some of the first insulating layer PAS1, the second insulating layer PAS2, and the third insulating layer PAS3 may be made of the same material and the others thereof may be made of a different material, or all of the first insulating layer PAS1, the second insulating layer PAS2, and the third insulating layer PAS3 may be made of different materials.

Figure 11:
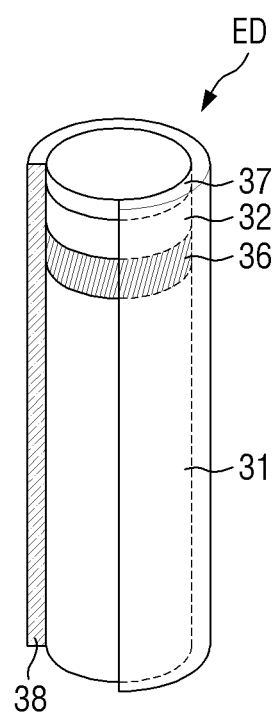
FIG. 11 is a schematic view of a light emitting element according to an embodiment.

FIG. 11 is a schematic view of a light emitting element according to an embodiment.

Referring to FIG. 11, the light emitting element ED may be a light emitting diode. For example, the light emitting element ED may be an inorganic light emitting diode having a size of a nanometer to a micrometer scale and made of an inorganic material. The light emitting element ED may be aligned between two electrodes having different polarities in case that an electric field is formed in a specific direction between the two electrodes facing each other.

The light emitting element ED according to an embodiment may have a shape extending in a direction. The light emitting element ED may have a shape such as a cylindrical shape, a rod shape, a wire shape, or a tube shape. However, the light emitting element ED is not limited to having the shape described above, and may have various shapes. For example, the light emitting element ED may have a polygonal prismatic shape such as a cubic shape, a rectangular parallelepiped shape, or a hexagonal prismatic shape or have a shape extending in a direction but having partially inclined outer surfaces.

The light emitting element ED may include a semiconductor layer doped with any conductivity-type (e.g., p-type or n-type) dopant. The semiconductor layer may receive an electrical signal applied from an external power source to emit light of a specific wavelength band. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material of the first semiconductor layer 31 may be one or more of AlGaInN, GaN, AlGaN, InGaN, AlN, and InN doped with an n-type dopant. The n-type dopant doped in the first semiconductor layer 31 may be Si, Ge, Sn, Se, or the like.

The second semiconductor layer 32 may be disposed on the first semiconductor layer 31 with the light emitting layer 36 interposed therebetween. The second semiconductor layer 32 may be a p-type semiconductor, and may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material of the second semiconductor layer 32 may be one or more of AlGaInN, GaN, AlGaN, InGaN, AlN, and InN doped with a p-type dopant. The p-type dopant doped in the second semiconductor layer 32 may be Mg, Zn, Ca, Ba, or the like.

It has been illustrated in FIG. 11 that each of the first semiconductor layer 31 and the second semiconductor layer 32 is configured as a layer, but embodiments are not limited thereto. Each of the first semiconductor layer 31 and the second semiconductor layer 32 may further include a larger number of layers, for example, a clad layer or a tensile strain barrier reducing (TSBR) layer, according to a material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be made of one or more of AlGaInN, GaN, AlGaN, InGaN, AlN, InN, and SLs doped with an n-type dopant, and the semiconductor layer disposed between the second semiconductor layer 32 and the light emitting layer 36 may be made of one or more of AlGaInN, GaN, AlGaN, InGaN, AlN, and InN doped with a p-type dopant.

The light emitting layer 36 may be disposed between the first semiconductor layer 31 and the second semiconductor layer 32. The light emitting layer 36 may include a material having a single or multiple quantum well structure. In case that the light emitting layer 36 includes the material having the multiple quantum well structure, the light emitting layer 36 may have a structure in which quantum layers and well layers are alternately stacked. The light emitting layer 36 may emit light by a combination of electron-hole pairs according to electrical signals applied through the first semiconductor layer 31 and the second semiconductor layer 32. The light emitting layer 36 may include a material such as AlGaN, AlGaInN, or InGaN. In case that the light emitting layer 36 has the multiple quantum well structure, the structure in which the quantum layers and the well layers are alternately stacked, the quantum layers may include a material such as AlGaN or AlGaInN, and the well layers may include a material such as GaN or AlInN.

The light emitting layer 36 may have a structure in which semiconductor materials having large band gap energy and semiconductor materials having small band gap energy are alternately stacked, and may include other Group III to Group V semiconductor materials according to a wavelength band of emitted light. The light emitted by the light emitting layer 36 is not limited to light of a blue wavelength band, and in some cases, the light emitting layer 36 may also emit light of red and green wavelength bands.

The electrode layer 37 may be an ohmic connection electrode. However, embodiments are not limited thereto, and the electrode layer 37 may also be a Schottky connection electrode. The light emitting element ED may include at least one electrode layer 37. The light emitting element ED may include one or more electrode layers 37, but embodiments are not limited thereto. In another example, the electrode layers 37 may also be omitted.

The electrode layer 37 may decrease resistance between the light emitting element ED and the electrode or the connection electrode in case that the light emitting element ED is connected (e.g., electrically connected) to the electrode or the connection electrode in the display device 10. The electrode layer 37 may include a metal having conductivity. The electrode layer 37 may include at least one of aluminum (Al), titanium (Ti), indium (In), gold (Au), silver (Ag), ITO, IZO, and ITZO.

The insulating film 38 may be disposed to surround outer surfaces of the semiconductor layers and the electrode layer described above. For example, the insulating film 38 may surround at least an outer surface of the light emitting layer 36, but may be formed to expose both end portions (e.g., opposite end portions) of the light emitting element ED in a length direction. For example, the insulating film 38 may also be formed so that an upper surface thereof may be rounded in cross section in an area adjacent to at least one end portion of the light emitting element ED.

The insulating film 38 may include at least one of materials having insulating properties, such as silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). It has been illustrated in FIG. 11 that the insulating film 38 is formed as a single layer, but embodiments are not limited thereto, and in some embodiments, the insulating film 38 may also be formed in a multilayer structure in which layers are stacked.

The insulating film 38 may function to protect the semiconductor layers and the electrode layer of the light emitting element ED. The insulating film 38 may prevent an electrical short-circuit that may occur in the light emitting layer 36 in case that the light emitting layer 36 is in direct contact with an electrode through which an electrical signal is transferred to the light emitting element ED. For example, the insulating film 38 may prevent luminous efficiency of the light emitting element ED from being decreased or degraded.

For example, an outer surface of the insulating film 38 may be surface-treated. The light emitting elements ED may be injected or sprayed onto and be aligned on electrodes in a state in which they are dispersed in ink (e.g., predetermined ink). Here, in order to maintain the light emitting elements ED in a state in which the light emitting elements ED are dispersed without being agglomerated (or coagulated) with other adjacent light emitting elements ED in the ink, a hydrophobic or hydrophilic treatment may be performed on a surface of the insulating film 38.

In the light emitting element ED included in the display device 10, an end portion at which the first semiconductor layer 31 is disposed and another end portion at which the second semiconductor layer 32 and the electrode layer 37 are disposed may be distinguished from each other. Both end portions (e.g., opposite end portions) of the light emitting element ED in a direction in which the light emitting element ED extends may be distinguished from each other, and orientation directions of the light emitting elements ED disposed on the electrodes RME may be different from each other.

Figure 12:
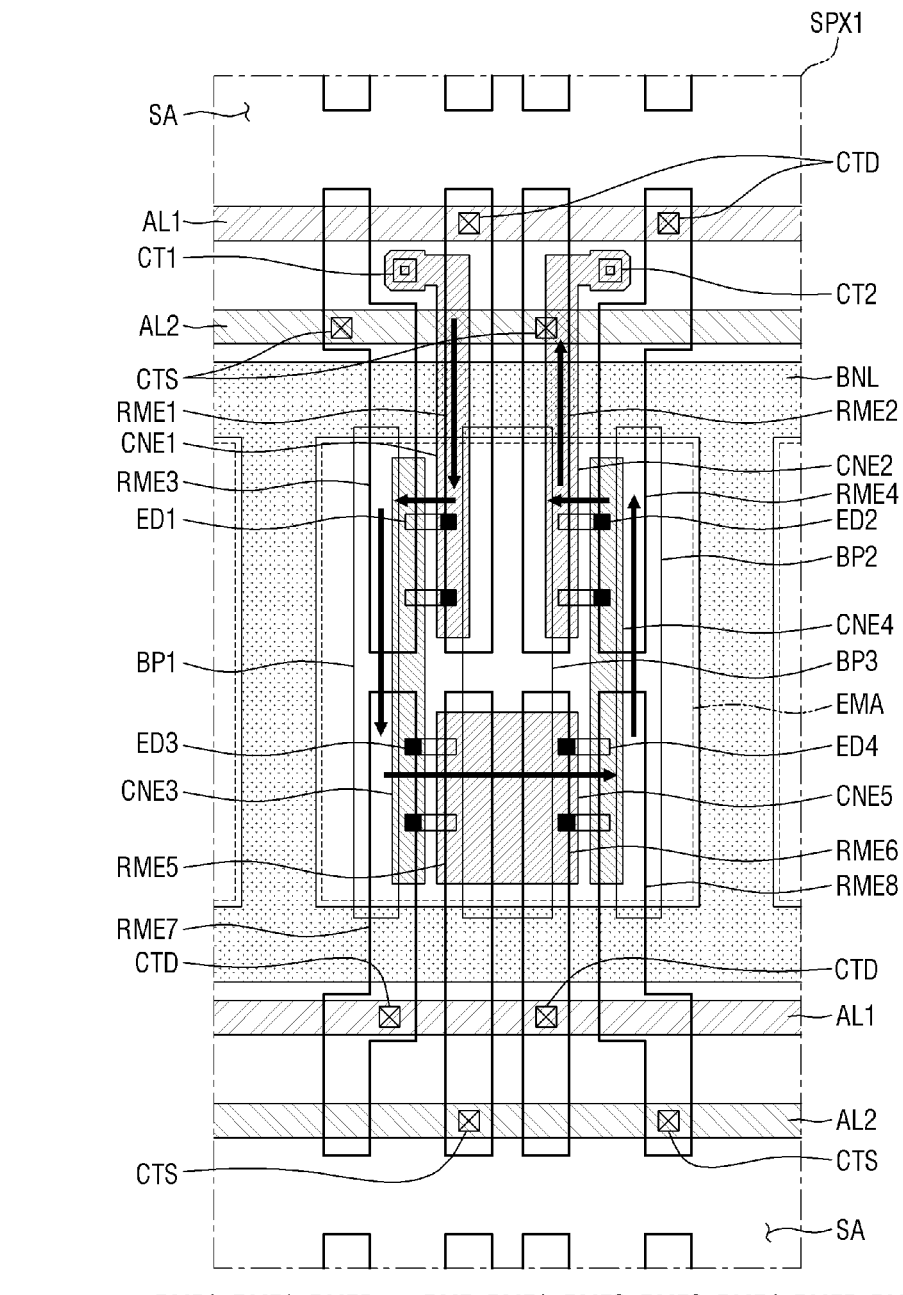
FIG. 12 is a schematic plan view illustrating orientation directions of light emitting elements disposed in a sub-pixel of the display device according to an embodiment.

FIG. 12 is a schematic plan view illustrating orientation directions of light emitting elements disposed in a sub-pixel of the display device according to an embodiment. FIG. 12 illustrates orientation directions of the light emitting elements ED (e.g., ED1, ED2, ED3, and ED4) in the first sub-pixel SPX1 of FIG. 6.

Referring to FIG. 12, each of the light emitting elements ED may include a first end portion (e.g., a black portion in FIG. 12) and a second end portion (e.g., a white portion in FIG. 12). In an embodiment such as the light emitting element ED of FIG. 11, the first end portion of the light emitting elements ED may be a portion where the second semiconductor layer 32 and the electrode layer 37 are disposed, and the second end portion of the light emitting element ED may be a portion where the first semiconductor layer 31 is disposed. The light emitting elements ED disposed on the electrodes RME spaced apart in the second direction DR2 between the walls BP1, BP2, and BP3 may be disposed so that first end portions thereof may be oriented in specific directions, and orientation directions of different light emitting elements ED1, ED2, ED3, and ED4 may be the same as or different from each other.

For example, the first light emitting elements ED1 may be disposed so that first end portions thereof may be oriented toward the right side of the emission area EMA (e.g., toward a forward direction of the second direction DR2), and the second light emitting elements ED2 may also be disposed so that first end portions thereof may be oriented toward the right side of the emission area EMA (e.g., toward the forward direction of the second direction DR2). The third light emitting elements ED3 may be disposed so that first end portions thereof may be oriented toward the left side of the emission area EMA (e.g., toward a backward direction of the second direction DR2), and the fourth light emitting elements ED4 may also be disposed so that first end portions thereof may be oriented toward the left side of the emission area EMA (e.g., toward the backward direction of the second direction DR2). The first light emitting elements ED1 and the second light emitting elements ED2 disposed on the electrodes of the first electrode group RMG1 and spaced apart from each other in the second direction DR2 may have the first end portions oriented in the same direction, respectively. The third light emitting elements ED3 and the fourth light emitting elements ED4 disposed on the electrodes of the second electrode group RMG2 and spaced apart from each other in the second direction DR2 may have the first end portions oriented in the same direction, respectively. For example, the first light emitting elements ED1 and the third light emitting elements ED3 disposed between the first wall BP1 and the third wall BP3 and spaced apart from each other in the first direction DR1 may have the first end portions oriented in directions opposite to each other, respectively. The second light emitting elements ED2 and the fourth light emitting elements ED4 disposed between the third wall BP3 and the second wall BP2 and spaced apart from each other in the first direction DR1 may have the first end portions oriented in directions opposite to each other, respectively.

The orientation directions of the light emitting elements ED may affect pattern shapes of the connection electrodes CNE. For example, the first connection electrode CNE1 and the second connection electrode CNE2 may be disposed on the first electrode RME1 and the second electrode RME2, respectively, the first connection electrode CNE1 may be in contact (e.g., directly contact) with the first end portions of the first light emitting elements ED1, and the second connection electrode CNE2 may be in contact (e.g., directly contact) with second end portions of the second light emitting elements ED2. The first connection electrode CNE1 and the second connection electrode CNE2 may be in contact (e.g., directly contact) with any one type of light emitting elements ED, respectively, and may be in contact (e.g., directly contact) with the conductive pattern layers of the third conductive layer in the sub-area SA. The first connection electrode CNE1 may be connected (e.g., electrically connected) to the first light emitting elements ED1 and the first voltage line VL1, and the second connection electrode CNE2 may be connected (e.g., electrically connected) to the second light emitting elements ED2 and the second voltage line VL2.

The first light emitting elements ED1 and the third light emitting elements ED3 may be disposed so that second end portions of the first light emitting elements ED1 and the first end portions of the third light emitting elements ED3 may be oriented toward the left side of the emission area EMA (e.g., toward the backward direction of the second direction DR2), and the third connection electrode CNE3 may have a shape extending in the first direction DR1 and may be in contact (e.g., directly contact) with the second end portions of the first light emitting elements ED1 and the first end portions of the third light emitting element ED3. Although the third connection electrode CNE3 does not have a shape being partially bent or bypassed and has a pattern shape extending in a direction, the third connection electrode CNE3 may be in contact (e.g., directly contact) with the second end portions of the first light emitting elements ED1 and the first end portions of the third light emitting element ED3. The first light emitting elements ED1 and the third light emitting elements ED3 may be connected (e.g., electrically connected) to each other through the third connection electrode CNE3.

For example, the second light emitting elements ED2 and the fourth light emitting elements ED4 may be disposed so that the first end portions of the second light emitting elements ED2 and second end portions of the fourth light emitting elements ED4 may be oriented toward the right side of the emission area EMA (e.g., toward the forward direction of the second direction DR2), and the fourth connection electrode CNE4 may have a shape extending in the first direction DR1 and may be in contact (e.g., directly contact) with the first end portions of the second light emitting elements ED2 and the second end portions of the fourth light emitting element ED4. Although the fourth connection electrode CNE4 does not have a shape being partially bent or bypassed and has a pattern shape extending in a direction, the fourth connection electrode CNE4 may be in contact (e.g., directly contact) with the first end portions of the second light emitting elements ED2 and the second end portions of the fourth light emitting element ED4. The second light emitting elements ED2 and the fourth light emitting element ED4 may be connected (e.g., electrically connected) to each other through the fourth connection electrode CNE4.

The third light emitting elements ED3 may be disposed so that second end portions thereof may be oriented toward the right side of the emission area EMA (e.g., toward the forward direction of the second direction DR2), and the fourth light emitting elements ED4 may be disposed so that first end portions thereof may be oriented toward the left side of the emission area EMA (e.g., toward the backward direction of the second direction DR2). The fifth connection electrode CNE5 may be formed on the fifth electrode RME5 and the sixth electrode RME6 in the second direction DR2 so as to have a greater width in the second direction DR2 than the other connection electrodes CNE, and thus, may be in contact (e.g., directly contact) with the second end portions of the third light emitting elements ED3 and the first end portions of the fourth light emitting elements ED4. Although the fifth connection electrode CNE5 does not have a shape being partially bent or bypassed and has a pattern shape extending in a direction, the fifth connection electrode CNE5 may be in contact (e.g., directly contact) with the second end portions of the third light emitting elements ED3 and the first end portions of the fourth light emitting elements ED4. The third light emitting elements ED3 and the fourth light emitting elements ED4 may be connected (e.g., electrically connected) to each other through the fifth connection electrode CNE5.

The electrical signal of the first voltage line VL1 transferred to the first connection electrode CNE1 may flow through the first light emitting elements ED1, the third connection electrode CNE3, the third light emitting elements ED3, the fifth connection electrode CNE5, the fourth light emitting elements ED4, the fourth connection electrode CNE4, the second light emitting elements ED2, and the second connection electrode CNE2.

Such orientation directions of the light emitting elements ED may be changed according to the signal lines AL1 and AL2 connected to the electrodes RME on which both end portions (e.g., opposite end portions) of the light emitting elements ED are disposed. The electrodes RME on which the first end portions of the light emitting elements ED are disposed may be electrodes connected (e.g., electrically connected) to the first signal line AL1, and the electrodes RME, on which the second end portions of the light emitting elements ED are disposed, may be electrodes connected (e.g., electrically connected) to the second signal line AL2. For example, the first electrode RME1, the fourth electrode RME4, the fifth electrode RME5, and the seventh electrode RME7 may be electrodes connected (e.g., electrically connected) to the first signal line AL1, and the first end portions of the light emitting elements ED may be disposed on the first electrode RME1, the fourth electrode RME4, the fifth electrode RME5, and the seventh electrode RME7. The second electrode RME2, the third electrode RME3, the sixth electrode RME6, and the eighth electrode RME8 may be electrodes connected (e.g., electrically connected) to the second signal line AL2, and the second end portions of the light emitting elements ED may be disposed on the second electrode RME2, the third electrode RME3, the sixth electrode RME6, and the eighth electrode RME8.

In the display device 10 according to an embodiment, the orientation directions of the light emitting elements ED may be designed so that the connection electrodes CNE may have a shape extending in a direction, and the connection electrodes CNE do not have a shape being bent or bypassed, and thus, a space for disposing the connection electrodes CNE in the emission area EMA may be decreased. Accordingly, areas between the first electrode group RMG1 and the second electrode group RMG2 in spaces between the walls BP1, BP2, and BP3 may be further decreased, and the number of effective light emitting elements that may be connected to the connection electrodes CNE to emit the light among the light emitting element ED disposed in the emission area EMA may be increased. The display device 10 may have an advantage that luminance per unit area may be increased and the number of light emitting elements disposed in the emission area EMA to have luminance required in the processes of manufacturing the display device 10 may be decreased.

Figure 13:
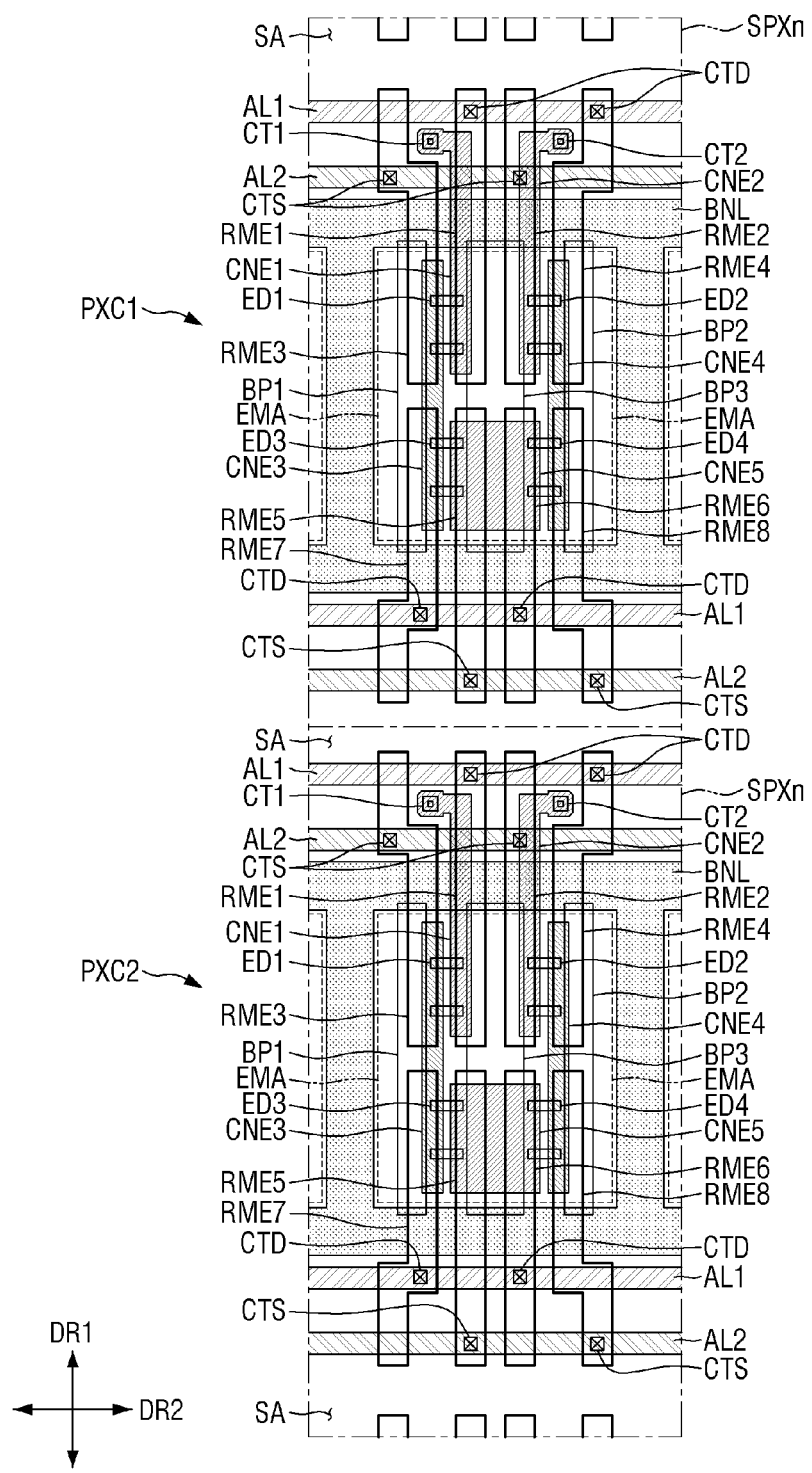
FIG. 13 is a schematic plan view illustrating a layout of electrodes, light emitting elements, and connection electrodes of pixel rows adjacent to each other in a first direction in the display device according to an embodiment.

FIG. 13 is a schematic plan view illustrating a layout of electrodes, light emitting elements, and connection electrodes of pixel rows adjacent to each other in a first direction in the display device according to an embodiment.

FIG. 13 illustrates a sub-pixel SPXn of each of two pixel rows PXC1 and PXC2 adjacent to each other in the first direction DR1.

Referring to FIG. 13, in a sub-pixel SPXn of a first pixel row PXC1, the respective electrodes RME of the first electrode group RMG1 and the second electrode group RMG2 may be connected (e.g., electrically connected), respectively, to two pairs of signal lines AL1 and AL2 disposed on the lower side and the upper side of the first pixel row PXC1. In a sub-pixel SPXn of a second pixel row PXC2, the respective electrodes RME of the first electrode group RMG1 and the second electrode group RMG2 may also be connected (e.g., electrically connected), respectively, to two pairs of signal lines AL1 and AL2 disposed on the lower side and the upper side of the second pixel row PXC2.

Each of the electrodes RME of the first pixel row PXC1 and the second pixel row PXC2 may be connected (e.g., electrically connected) to the signal lines AL1 and AL2 connected to the corresponding pixel rows PXC1 and PXC2. For example, the signal lines AL1 and AL2 to which the electrodes RME of the second electrode group RMG2 of the first pixel row PXC1 are connected (e.g., electrically connected) and the signal lines AL1 and AL2 to which the electrodes RME of the first electrode group RMG1 of the second pixel row PXC2 are connected (e.g., electrically connected) may be distinguished from each other. Accordingly, two pairs of signal lines AL1 and AL2, a total of four signal lines AL1 and AL2 may be disposed between the first pixel row PXC1 and the second pixel row PXC2 and in the other sub-areas SA.

Accordingly, electrical connection relationships between the respective electrodes RME of the first pixel row PXC1 and the second pixel row PXC2 and the signal lines AL1 and AL2 may be substantially the same as each other. This means that orientation directions of the light emitting elements ED and pattern shapes of the connection electrodes CNE of the first pixel row PXC1 and the second pixel row PXC2 are substantially the same as each other. For example, the first electrode RME1 of the first pixel row PXC1 and the first electrode RME1 of the second pixel row PXC2 may be connected (e.g., electrically connected) to the first signal lines AL1 distinguished from each other, respectively, and the first light emitting elements ED1 of each of the pixel rows PXC1 and PXC2 may be disposed so that first end portions thereof may be oriented to the right side of the emission area EMA. The first connection electrode CNE1 of each of the pixel rows PXC1 and PXC2 may be disposed on the first electrode RME1, and may be connected (e.g., electrically connected) to the first transistor T1 through the first contact hole CT1. Arrangements and pattern shapes of the other light emitting elements ED and the connection electrodes CNE may be substantially the same as that described above.

However, embodiments are not limited thereto. It has been illustrated in an embodiment of FIG. 13 that two pairs of signal lines AL1 and AL2 are disposed in a sub-area SA between the first pixel row PXC1 and the second pixel row PXC2, such that the sub-area SA has a sufficient area. In some embodiments, the signal lines AL1 and AL2 disposed in the same sub-area SA and connected to different pixel rows PXC1 and PXC2 may be formed of different layers or the signal lines AL1 and AL2 disposed in the same sub-area SA may be connected (e.g., electrically connected) to the electrodes RME of the different pixel rows PXC1 and PXC2. For example, the electrical connection relationships between the same electrodes RME of the different pixel rows PXC1 and PXC2 and the signal lines AL1 and AL2 may be changed, and accordingly, the orientation directions of the light emitting elements ED and the arrangements of the connection electrodes CNE may be changed. This will be described with reference to other embodiments.

Hereinafter, other embodiments of the display device 10 will be described with reference to other drawings.

Figure 14:
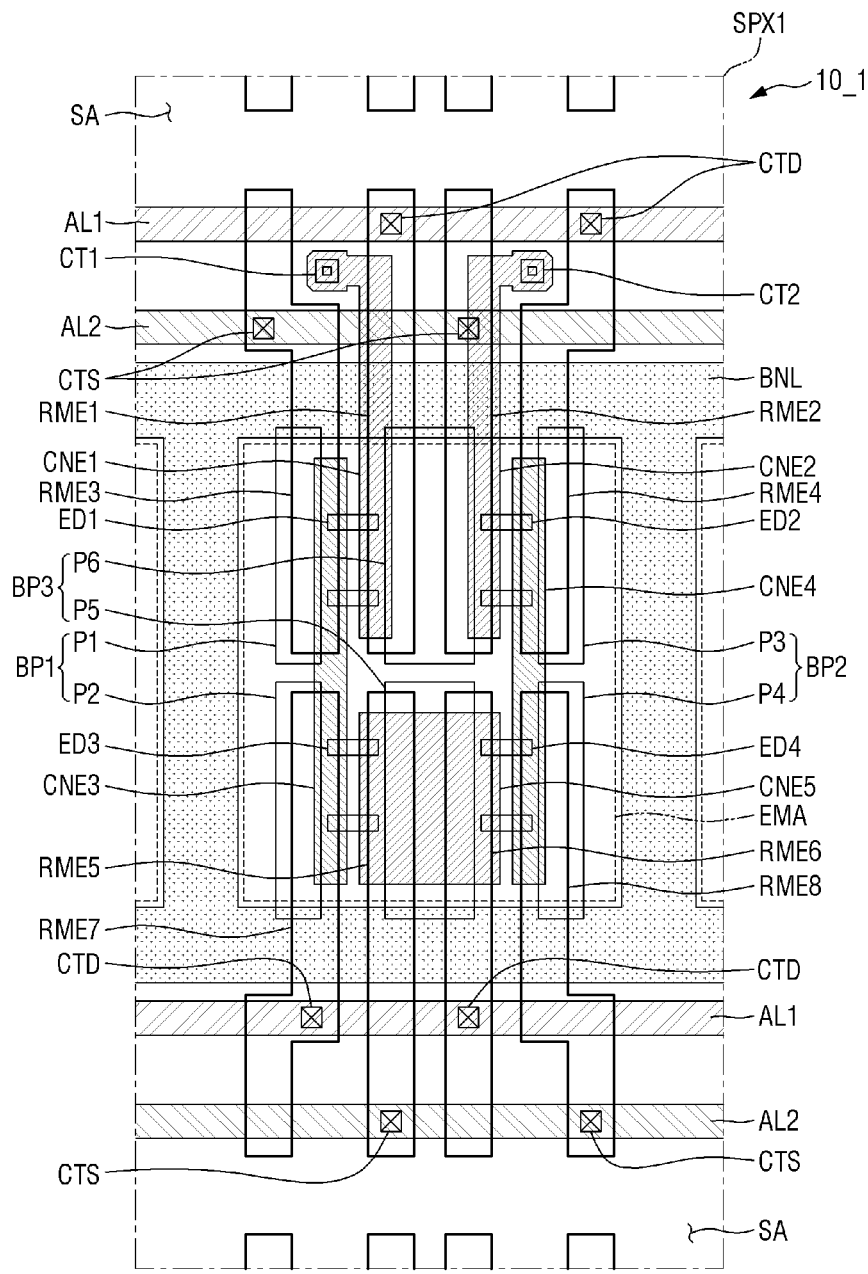
FIG. 14 is a schematic plan view illustrating a sub-pixel of a display device according to an embodiment.

FIG. 14 is a schematic plan view illustrating a sub-pixel of a display device according to an embodiment.

Referring to FIG. 14, in a display device 10_1 according to an embodiment, each of the walls BP1, BP2, and BP3 may include wall pattern layers P1, P2, P3, P4, P5, and P6 spaced apart from each other in the first direction DR1. The first wall BP1 may include a first wall pattern layer P1 and a second wall pattern layer P2 spaced apart from each other in the first direction DR1, and the second wall BP2 may include a third wall pattern P3 and a fourth wall pattern layer P4 spaced apart from each other in the first direction DR1. The third wall BP3 may include a fifth wall pattern layer P5 and a sixth wall pattern layer P6 that are spaced apart from each other in the first direction DR1. The embodiment of FIG. 14 is different from an embodiment of FIG. 6 in that the walls BP1, BP2, and BP3 are also divided into the wall pattern layers P1, P2, P3, P4, P5, and P6 spaced apart from each other in the first direction DR1, similar to the electrodes RME divided into two electrode groups RMG1 and RMG2 spaced apart from each other in the first direction DR1.

The electrodes RME included in the electrode pairs RMP1, RMP2, RMP3, and RMP4 may be disposed on different wall pattern layers P1, P2, P3, P4, P5, and P6. The first electrode RME1 and the second electrode RME2 may be disposed on a fifth wall pattern layer P5 of the third wall BP3, and the fifth electrode RME5 and the sixth electrode RME6 may be disposed on a sixth wall pattern layer P6 of the third wall BP3. For example, the third electrode RME3 may be disposed on a first wall pattern layer P1 of the first wall BP1, and the seventh electrode RME7 may be disposed on a second wall pattern layer P2 of the first wall BP1. The fourth electrode RME4 may be disposed on a third wall pattern layer P3 of the second wall BP2, and the eighth electrode RME8 may be disposed on a fourth wall pattern layer P4 of the second wall BP2.

In the display device 10_1, the walls BP1, BP2, and BP3 may include the wall pattern layers P1, P2, P3, P4, P5, and P6 spaced apart from each other in the first direction DR1 in the emission area EMA, similar to the electrodes RME, and the electrodes RME and the wall pattern layers P1, P2, P3, P4, P5, and P6 may have corresponding arrangement structures.

Figure 15:
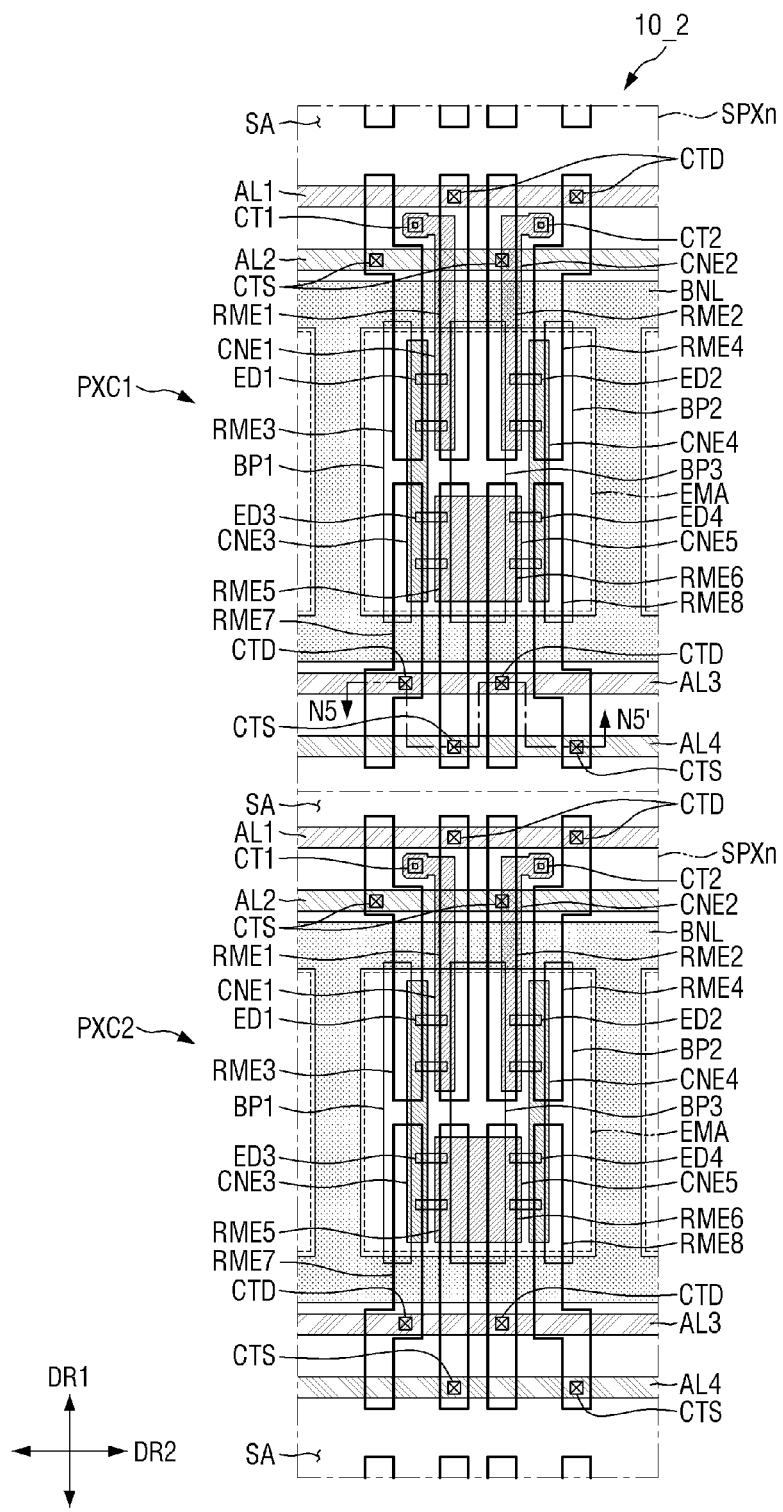
FIG. 15 is a schematic plan view illustrating a layout of electrodes, light emitting elements, and connection electrodes of pixel rows adjacent to each other in the first direction in the display device according to an embodiment.
Figure 16:
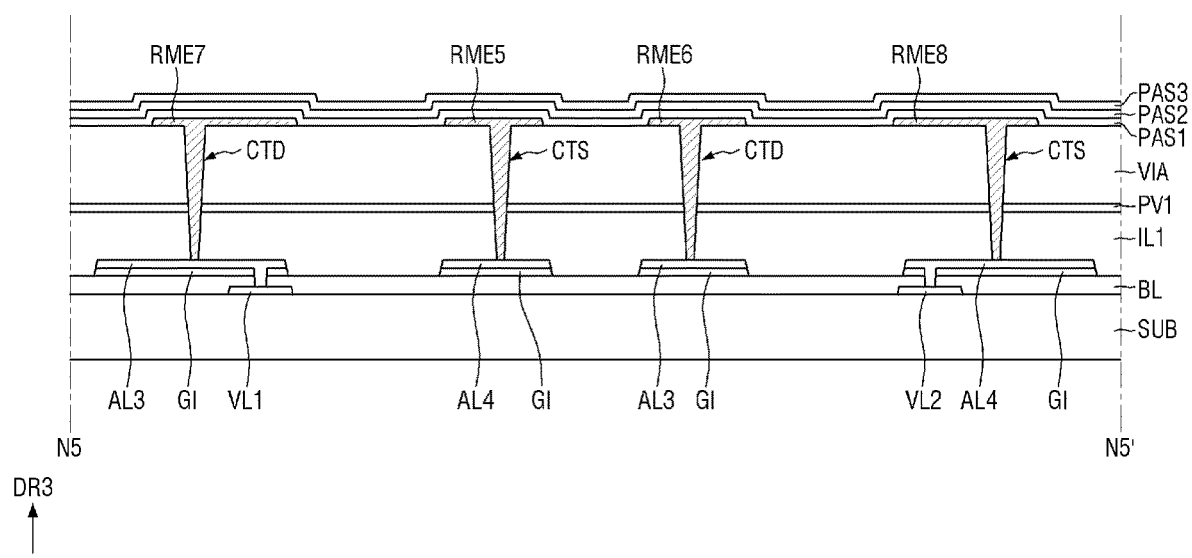
FIG. 16 is a schematic cross-sectional view taken along line N5-N5' of FIG. 15.

FIG. 15 is a schematic plan view illustrating a layout of electrodes, light emitting elements, and connection electrodes of pixel rows adjacent to each other in the first direction in the display device according to an embodiment. FIG. 16 is a schematic cross-sectional view taken along line N5-N5' of FIG. 15.

Referring to FIGS. 15 and 16, in a display device 10_2 according to an embodiment, the electrodes RME1 to RME4 of the first electrode group RMG1 may be in contact (e.g., directly contact) with signal lines AL1 and AL2 of the third conductive layer and the electrodes RME5 to RME8 of the second electrode group RMG2 may be in contact (e.g., directly contact) with signal lines AL3 and AL4 of the second conductive layer.

The electrodes of the first electrode group RMG1 of each of the pixel rows PXC1 and PXC2 may be connected (e.g., electrically connected) to a first signal line AL1 or a second signal line AL2 formed of the third conductive layer. The electrodes of the second electrode group RMG2 may be connected (e.g., electrically connected) to a third signal line AL3 or a fourth signal line AL4 formed of the second conductive layer. The sixth electrode RME6 and the seventh electrode RME7 may be connected (e.g., electrically connected) to the third signal line AL3 through first electrode contact holes CTD, respectively, and the fifth electrode RME5 and the eighth electrode RME8 may be connected (e.g., electrically connected) to the fourth signal line AL4 through second electrode contact holes CTS, respectively.

The third signal line AL3 may be connected (e.g., electrically connected) to the first voltage line VL1 through a contact hole passing through the first gate insulating layer GI and the buffer layer BL. The same electrical signal as an electrical signal applied to the first signal line AL1 may be applied to the third signal line AL3. The fourth signal line AL4 may be connected (e.g., electrically connected) to the second voltage line VL2 through a contact hole passing through the first gate insulating layer GI and the buffer layer BL. The same electrical signal as an electrical signal applied to the second signal line AL2 may be applied to the fourth signal line AL4.

The electrodes of the first electrode group RMG1 and the second electrode group RMG2 may be connected (e.g., electrically connected) to different signal lines AL1, AL2, AL3, and AL4, but electrical signals applied to the electrodes of the first electrode group RMG1 and the second electrode group RMG2 may be substantially the same as each other. Accordingly, orientation directions of the light emitting elements ED disposed on the electrodes of the first electrode group RMG1 and the second electrode group RMG2 may be substantially the same as those in an embodiment of FIG. 12. For example, arrangements and pattern shapes of the connection electrodes CNE of each of the pixel rows PXC1 and PXC2 may be substantially the same as those in an embodiment of FIG. 12.

In the display device 10_2 according to an embodiment, two pairs of signal lines AL1 and AL2, and AL3 and AL4 may be disposed in the sub-area SA between the first pixel row PXC1 and the second pixel row PXC2, but the two pairs of signal lines AL1 and AL2, and AL3 and AL4 may be formed of different conductive layers. Accordingly, it has been illustrated in FIG. 15 that a space of the sub-area SA is almost similar to that in an embodiment of FIG. 12, but the first signal line AL1 and the second signal line AL2, and the third signal line AL3 and the fourth signal line AL4 may be formed to overlap (e.g., partially overlap) each other, and the space of the sub-area SA may be decreased. The display device 10_2 may have an advantage that the space of the sub-area SA may be decreased without changing arrangements and pattern shapes of the light emitting elements ED, the electrodes RME, and the connection electrodes CNE.

Figure 17:
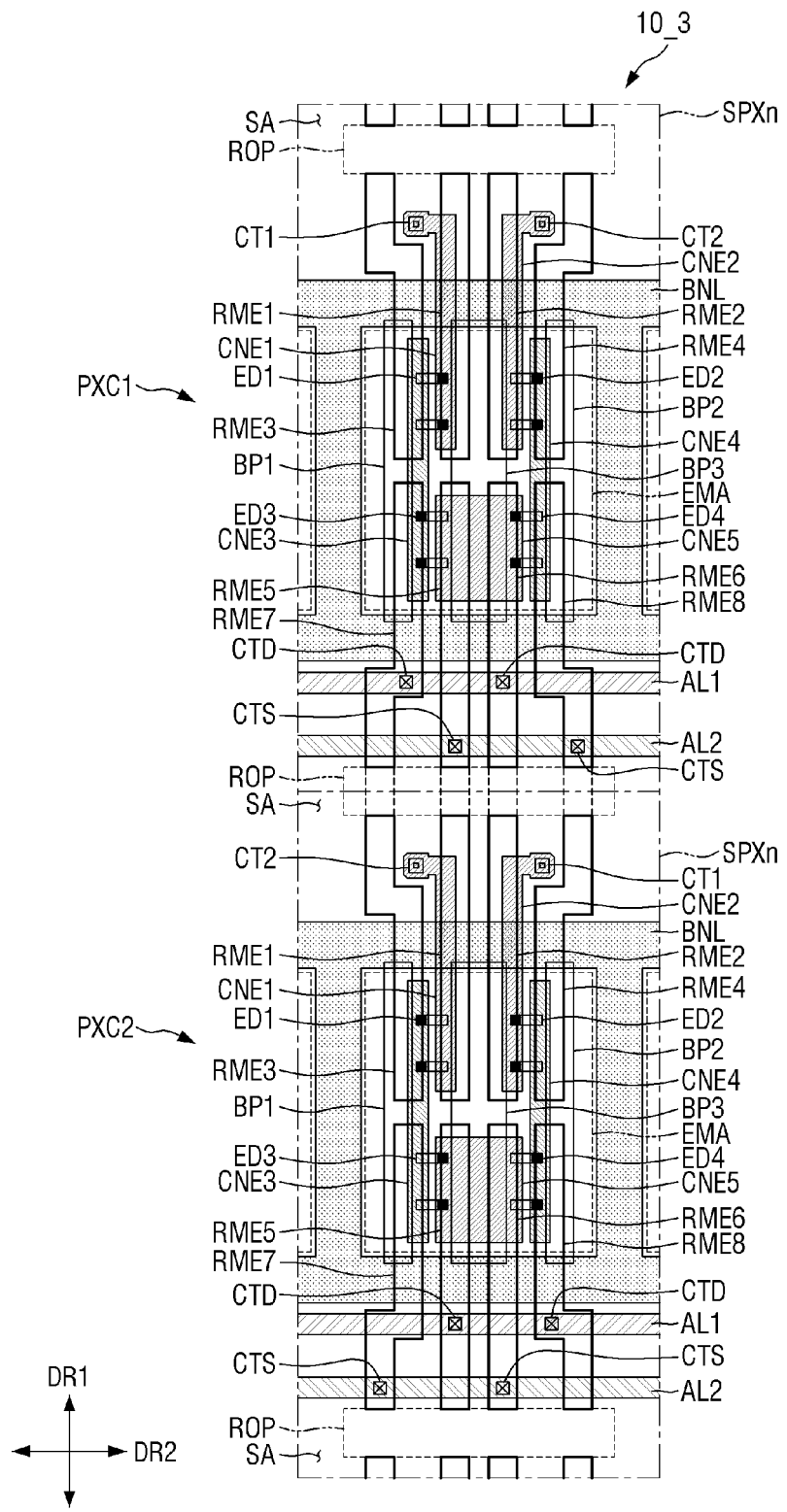
FIG. 17 is a schematic plan view illustrating a layout of electrodes, light emitting elements, and connection electrodes of pixel rows adjacent to each other in the first direction in a display device according to still another embodiment.

FIG. 17 is a schematic plan view illustrating a layout of electrodes, light emitting elements, and connection electrodes of pixel rows adjacent to each other in the first direction in a display device according to an embodiment.

Referring to FIG. 17, in a display device 10_3 according to an embodiment, the electrodes RME of any one of the first electrode group RMG1 and the second electrode group RMG2 may be connected to the signal lines AL1 and AL2, and electrodes of the other of the first electrode group RMG1 and the second electrode group RMG2 may not be connected (e.g., electrically connected) to the signal lines AL1 and AL2. The electrodes RME of two adjacent electrode groups RMG1 and RMG2 of different pixel rows PXC1 and PXC2 may be formed in a state in which they are connected to each other, and be separated from each other in the separation part ROP of the sub-area SA in a subsequent process. In the display device 10_3, even though only a pair of signal lines AL1 and AL2 are disposed in the sub-area SA, the signal lines AL1 and AL2 may transfer electrical signals to the electrodes RME of each of the pixel rows PXC1 and PXC2 disposed on the upper side and the lower side of the display device 10_3. In FIG. 17, an embodiment in which the electrodes of the first electrode group RMG1 are not connected (e.g., electrically connected) to the signal lines AL1 and AL2 and the electrodes of the second electrode group RMG2 are connected (e.g., electrically connected) to the signal lines AL1 and AL2 is illustrated. However, embodiments are not limited thereto, and the following descriptions may be similarly applied to an opposite case.

In processes of manufacturing the display device 10_3, the electrodes RME of the first electrode group RMG1 and the second electrode group RMG2 of the different pixel rows PXC1 and PXC2 may be formed as an electrode lines connected to each other (see dotted line portions within the separation part ROP of FIG. 17), and be separated from each other in a subsequent process. For example, in the processes of manufacturing the display device 10_3, the electrodes of the second electrode group RMG2 of the first pixel row PXC1 may be integral with the electrodes of the first electrode group RMG1 of the second pixel row PXC2 and separated from the electrodes of the first electrode group RMG1 of the second pixel row PXC2. The fifth electrode RME5, the sixth electrode RME6, the seventh electrode RME7, and the eighth electrode RME8 of the second electrode group RMG2 of the first pixel row PXC1 may be electrodes derived (or formed) from electrode lines that are integral with the first electrode RME1, the second electrode RME2, the third electrode RME3, and the fourth electrode RME4 of the first electrode group RMG1 of the second pixel row PXC2, respectively. In case that the electrodes of the second electrode group RMG2 of the first pixel row PXC1 are connected (e.g., electrically connected) to the first signal line AL1 or the second signal line AL2, electrical signals may also be transferred to the electrodes of the first electrode group RMG1 of the second pixel row PXC2. In case that the light emitting elements ED are disposed in a state in which the electrodes of the adjacent electrode groups RMG1 and RMG2 of the different pixel rows PXC1 and PXC2 are integral with each other, the electrodes of the adjacent electrode groups RMG1 and RMG2 of the different pixel rows PXC1 and PXC2 may be separated into different electrodes by performing a process of separating the electrode lines in the separation part ROP of the sub-area SA.

In the display device 10_3, the pair of signal lines AL1 and AL2 may simultaneously transfer the electrical signals to the electrodes RME disposed in the different pixel rows PXC1 and PXC2, and the number of signal lines AL1 and AL2 disposed in the sub-area SA may be decreased. However, accordingly, orientation directions of the light emitting elements ED disposed in the different pixel rows PXC1 and PXC2 may be different from each other, and arrangements and connection relationships of the connection electrodes CNE may be changed accordingly.

For example, in an embodiment in which in the first pixel row PXC1, the sixth electrode RME6 and the seventh electrode RME7 are connected (e.g., electrically connected) to the first signal line AL1 and the fifth electrode RME5 and the eighth electrode RME8 are connected (e.g., electrically connected) to the second signal line AL2, the third light emitting elements ED3 may be disposed so that the first end portions thereof may be oriented toward the left side of the emission area EMA (e.g., toward the backward direction of the second direction DR2), and the fourth light emitting elements ED4 may be disposed so that the first end portions thereof may be oriented toward the left side of the emission area EMA (e.g., toward the backward direction of the second direction DR2).

The first electrode RME1 and the fourth electrode RME4 of the second pixel row PXC2 may be electrodes that are integral with the fifth electrode RME5 and the eighth electrode RME8 of the first pixel row PXC1, respectively, and may be connected (e.g., electrically connected) to the second signal line AL2 in a process of aligning the light emitting elements ED. The second electrode RME2 and the third electrode RME3 of the second pixel row PXC2 may be electrodes that are integral with the sixth electrode RME6 and the seventh electrode RME7 of the first pixel row PXC1, respectively, and may be connected (e.g., electrically connected) to the first signal line AL1 in the process of aligning the light emitting elements ED. The first light emitting elements ED1 and the second light emitting elements ED2 of the second pixel row PXC2 may be disposed so that the first end portions thereof may be oriented toward the left side of the emission area EMA (e.g., toward the backward direction of the second direction DR2), like the third light emitting elements ED3 and the fourth light emitting elements ED4 of the first pixel row PXC1.

Considering that the electrodes of the electrode pairs RMP1, RMP2, RMP3, and RMP4 in each sub-pixel SPXn are connected (e.g., electrically connected) to the different signal lines AL1 and AL2, the electrodes of the first electrode group RMG1 of the first pixel row PXC1 may be connected (e.g., electrically connected) to the signal lines AL1 and AL2 opposite to the signal lines to which the electrodes spaced apart from the electrodes of the first electrode group RMG1 in the first direction DR1 among the electrodes of the second electrode group RMG2 are connected (e.g., electrically connected). For example, in the first electrode group RMG1 of the first pixel row PXC1, the first electrode RME1 and the fourth electrode RME4 may be connected (e.g., electrically connected) to the first signal line AL1, and the second electrode RME2 and the third electrode RME3 may be connected (e.g., electrically connected) to the second signal line AL2. In the second electrode group RMG2 of the second pixel row PXC2, the fifth electrode RME5 and the eighth electrode RME8 may be connected (e.g., electrically connected) to the first signal line AL1, and the sixth electrode RME6 and the seventh electrode RME7 may be connected (e.g., electrically connected) to the second signal line AL2.

The first light emitting elements ED1 and the second light emitting elements ED2 disposed on the first electrode group RMG1 of the first pixel row PXC1 may be disposed so that the first end portions thereof are oriented (or face) toward the right side of the emission area EMA (e.g., toward the forward direction of the second direction DR2). For example, the third light emitting elements ED3 and the fourth light emitting elements ED4 disposed on the second electrode group RMG2 of the second pixel row PXC2 may be disposed so that the first end portions thereof may be oriented (or face) toward the right side of the emission area EMA (e.g., toward the forward direction of the second direction DR2). In the display device 10_3, orientation directions of the light emitting elements ED disposed in the first pixel row PXC1 and the second pixel row PXC2 may be opposite to each other. For example, the first light emitting elements ED1 of the first pixel row PXC1 and the first light emitting elements ED1 of the second pixel row PXC2 may have the first end portions oriented toward opposite directions, respectively.

According to the orientation directions of the light emitting elements ED, contact relationships between the connection electrodes CNE of the first pixel row PXC1 and the second pixel row PXC2 and the light emitting elements ED and connection relationships between these connection electrodes CNE and the third conductive layer may be changed. For example, arrangements relationship and contact relationships of the connection electrodes CNE of the first pixel row PXC1 may be substantially the same as those described above with reference to FIG. 12. Describing the connection electrodes CNE of the second pixel row PXC2 based on those described above, the first connection electrode CNE1 may be disposed on the first electrode RME1 and be in contact (e.g., directly contact) with the second end portions of the first light emitting elements ED1. The second connection electrode CNE2 may be disposed on the second electrode RME2 and be in contact (e.g., directly contact) with the first end portions of the second light emitting elements ED2. The third connection electrode CNE3 may be disposed on the third electrode RME3 and the seventh electrode RME7 and be in contact (e.g., directly contact) with the first end portions of the first light emitting elements ED1 and the second end portions of the third light emitting elements ED3, and the fourth connection electrode CNE4 may be disposed on the fourth electrode RME4 and the eighth electrode RME8 and be in contact (e.g., directly contact) with the second end portions of the second light emitting element ED2 and the first end portions of the fourth light emitting elements ED4. The fifth connection electrode CNE5 may be disposed on the fifth electrode RME5 and the sixth electrode RME6 and be in contact (e.g., directly contact) with the first end portions of the third light emitting elements ED and the second end portions of the fourth light emitting elements ED4.

Types of the electrodes RME that the connection electrodes CNE of the second pixel row PXC2 overlap may be substantially the same as those of the electrodes RME that the connection electrodes CNE of the first pixel row PXC1 overlap, but the end portions of the light emitting elements ED with which the connection electrodes CNE of the second pixel row PXC2 are in contact may be different from the end portions of the light emitting elements ED with which the connection electrodes CNE of the first pixel row PXC1 are in contact. For example, the first connection electrode CNE1 of the first pixel row PXC1 may be connected (e.g., electrically connected) to the first transistor T1 through the first contact hole CT1, and the second electrode CNE2 of the first pixel row PXC1 may be connected (e.g., electrically connected) to the second voltage line VL2 through the second contact hole CT2. For example, the first connection electrode CNE1 of the second pixel row PXC2 may be connected (e.g., electrically connected) to the second voltage line VL2 through the second contact hole CT2, and the second electrode CNE2 of the second pixel row PXC2 may be connected (e.g., electrically connected) to the first transistor T1 through the first contact hole CT1. In the first pixel row PXC1, the first source voltage may be transferred to the light emitting elements ED through the first connection electrode CNE1, in case that in the second pixel row PXC2, the first source voltage may be transferred to the light emitting elements ED through the second connection electrode CNE2. In the display device 10_3, in the display area DPA, odd-numbered pixel rows may have orientation directions of the light emitting elements ED and arrangements of the connection electrodes that are substantially the same as those in the first pixel row PXC1, and even-numbered pixel rows may have orientation directions of the light emitting elements ED and arrangements of the connection electrodes that are substantially the same as those in the second pixel row PXC2.

In an embodiment of FIG. 17, arrangements of the connection electrodes CNE in the first pixel row PXC1 and the second pixel row PXC2 may be substantially the same as each other, and only connection relationships between the first and second connection electrodes CNE1 and CNE2 and lower conductive layers in the first pixel row PXC1 and the second pixel row PXC2 may be different from each other. However, embodiments are not limited thereto, and the arrangements of the connection electrodes CNE in the first pixel row PXC1 and the second pixel row PXC2 may also be different from each other.

Figure 18:
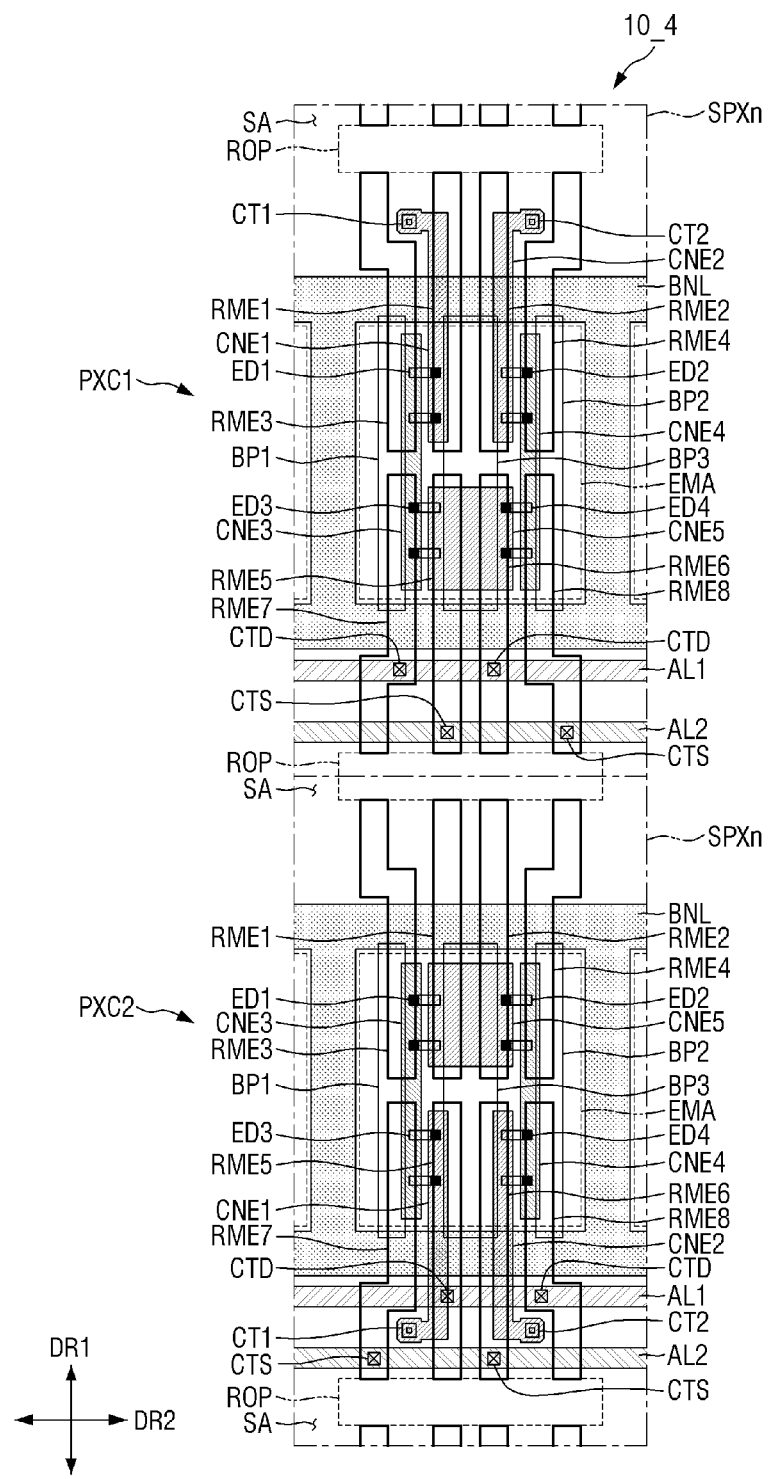
FIG. 18 is a schematic plan view illustrating a layout of electrodes, light emitting elements, and connection electrodes of pixel rows adjacent to each other in the first direction in a display device according to an embodiment.

FIG. 18 is a schematic plan view illustrating a layout of electrodes, light emitting elements, and connection electrodes of pixel rows adjacent to each other in the first direction in a display device according to an embodiment.

Referring to FIG. 18, in a display device 10_4 according to an embodiment, arrangements of the connection electrodes CNE of the first pixel row PXC1 may be different from arrangements of the connection electrodes CNE of the second pixel row PXC2. The embodiment of FIG. 18 is different in the arrangements of the connection electrodes CNE of the second pixel row PXC2 from an embodiment of FIG. 17.

A description of arrangements of the electrodes RME and the light emitting elements ED of the first pixel row PXC1 and the second pixel row PXC2 is substantially the same as that in an embodiment of FIG. 17. For example, in each of the first pixel row PXC1 and the second pixel row PXC2, only the electrodes RME of the second electrode group RMG2 may be connected (e.g., electrically connected) to the signal lines AL1 and AL2. Accordingly, orientation directions of the light emitting elements ED of the first pixel row PXC1 and the second pixel row PXC2 may be opposite to each other.

The arrangements of the connection electrodes CNE of the first pixel row PXC1 may be substantially the same as that in an embodiment of FIG. 17, in case that the arrangements of the connection electrodes CNE of the second pixel row PXC2 are different from those of the first pixel row PXC1. For example, the first connection electrode CNE1 and the second connection electrode CNE2 may be disposed on the fifth electrode RME5 and the sixth electrode RME6, respectively. The first connection electrode CNE1 may extend in the first direction DR1 on the fifth electrode RME5 and be disposed in the sub-area SA disposed on the lower side of the emission area EMA. The second connection electrode CNE2 may extend in the first direction DR1 on the sixth electrode RME6 and be disposed in the sub-area SA disposed on the lower side of the emission area EMA.

The fifth connection electrode CNE5 may be spaced apart from the first connection electrode CNE1 and the second connection electrode CNE2 in the first direction DR1 and be disposed on the first electrode RME1 and the second electrode RME2. The connection electrodes CNE of the second pixel row PXC2 are different in arrangements of the first connection electrode CNE1, the second connection electrode CNE2, and the fifth connection electrode CNE5 from those in an embodiment of FIG. 17. In the first pixel row PXC1, the first connection electrode CNE1 and the second connection electrode CNE2 may be disposed on the first electrode group RMG1 on the upper side of the emission area EMA, and the fifth connection electrode CNE5 may be disposed on the second electrode group RMG2 on the lower side of the emission area EMA. In the second pixel row PXC2, the first connection electrode CNE1 and the second connection electrode CNE2 may be disposed on the second electrode group RMG2 on the lower side of the emission area EMA, and the fifth connection electrode CNE5 may be disposed on the first electrode group RMG1 on the upper side of the emission area EMA.

In the second pixel row PXC2, positions at which the third connection electrode CNE3 and the fourth connection electrode CNE4 are disposed may be substantially the same as those in the first pixel row PXC1. The third connection electrode CNE3 may extend in the first direction DR1 and be disposed on the third electrode RME3 and the seventh electrode RME7. The fourth connection electrode CNE4 may extend in the first direction DR1 and be disposed on the fourth electrode RME4 and the eighth electrode RME8.

In an embodiment of FIG. 17, the first connection electrode CNE1 and the second connection electrode CNE2, which are the first-type connection electrodes, may be spaced apart from the fifth connection electrode CNE5, which is the third-type connection electrode and disposed on the lower portion of the second pixel row PXC2, in the first direction DR1. For example, in an embodiment of FIG. 18, the first connection electrode CNE1 and the second connection electrode CNE2, which are the first-type connection electrodes, may be spaced apart from the fifth connection electrode CNE5, which is the third-type connection electrode and disposed on the upper portion of the second pixel row PXC2, in the first direction DR1.

In the second pixel row PXC2, the first connection electrode CNE1 may be in contact (e.g., directly contact) with the first end portions of the third light emitting elements ED3, and the second connection electrode CNE2 may be in contact (e.g., directly contact) with the second end portions of the fourth light emitting elements ED4. The first connection electrode CNE1 may be in contact (e.g., directly contact) with the first conductive pattern layer CDP1 through the first contact hole CT1 disposed in the sub-area SA. The first connection electrode CNE1 may be connected (e.g., electrically connected) to the first transistor T1. The second connection electrode CNE2 may be in contact (e.g., directly contact) with the third conductive pattern layer CDP3 through the second contact hole CT2. The second connection electrode CNE2 may be connected (e.g., electrically connected) to the second voltage line VL2.

The third connection electrode CNE3 may be in contact (e.g., directly contact) with the second end portions of the third light emitting elements ED3 and the first end portions of the first light emitting elements ED1. The fourth connection electrode CNE4 may be in contact (e.g., directly contact) with the first end portions of the fourth light emitting elements ED4 and the second end portions of the second light emitting elements ED2. The fifth connection electrode CNE5 may be in contact (e.g., directly contact) with the second end portions of the third light emitting elements ED3 and the first end portions of the second light emitting elements ED2.

In the display devices 10_3 and 10_4 of FIGS. 17 and 18, the number of signal lines AL1 and AL2 disposed in the sub-area SA may be decreased as compared with an embodiment of FIG. 12. Accordingly, electrical connections between the electrodes RME disposed in the first pixel row PXC1 and the second pixel row PXC2 and the signal lines AL1 and AL2, orientation directions of the light emitting elements ED, and arrangements of the connection electrodes CNE may be changed. However, in each of the display devices 10_3 and 10_4, the connection electrodes CNE may have pattern shapes extending in a direction, and a space in which the connection electrodes CNE are disposed in the emission area EMA may be decreased. For example, in the display devices 10_3 and 10_4, the arrangements of the electrodes RME and the orientation direction of the light emitting elements ED may be appropriately changed as long as the pattern shapes of the connection electrodes CNE may be maintained.

For example, the display device 10 may be used in a process of aligning the light emitting elements ED by applying the electrical signals to the electrodes RME through the signal lines AL1 and AL2. Since the connection electrodes CNE are connected (e.g., directly connected) to the third conductive layer to be connected (e.g., electrically connected) to the voltage lines VL1 and VL2, the electrodes RME may not be connected (e.g., electrically connected) to the light emitting elements ED. Accordingly, the electrodes RME of the different pixel rows PXC1 and PXC2 may also be disposed in a state in which they are connected to each other.

Figure 19:
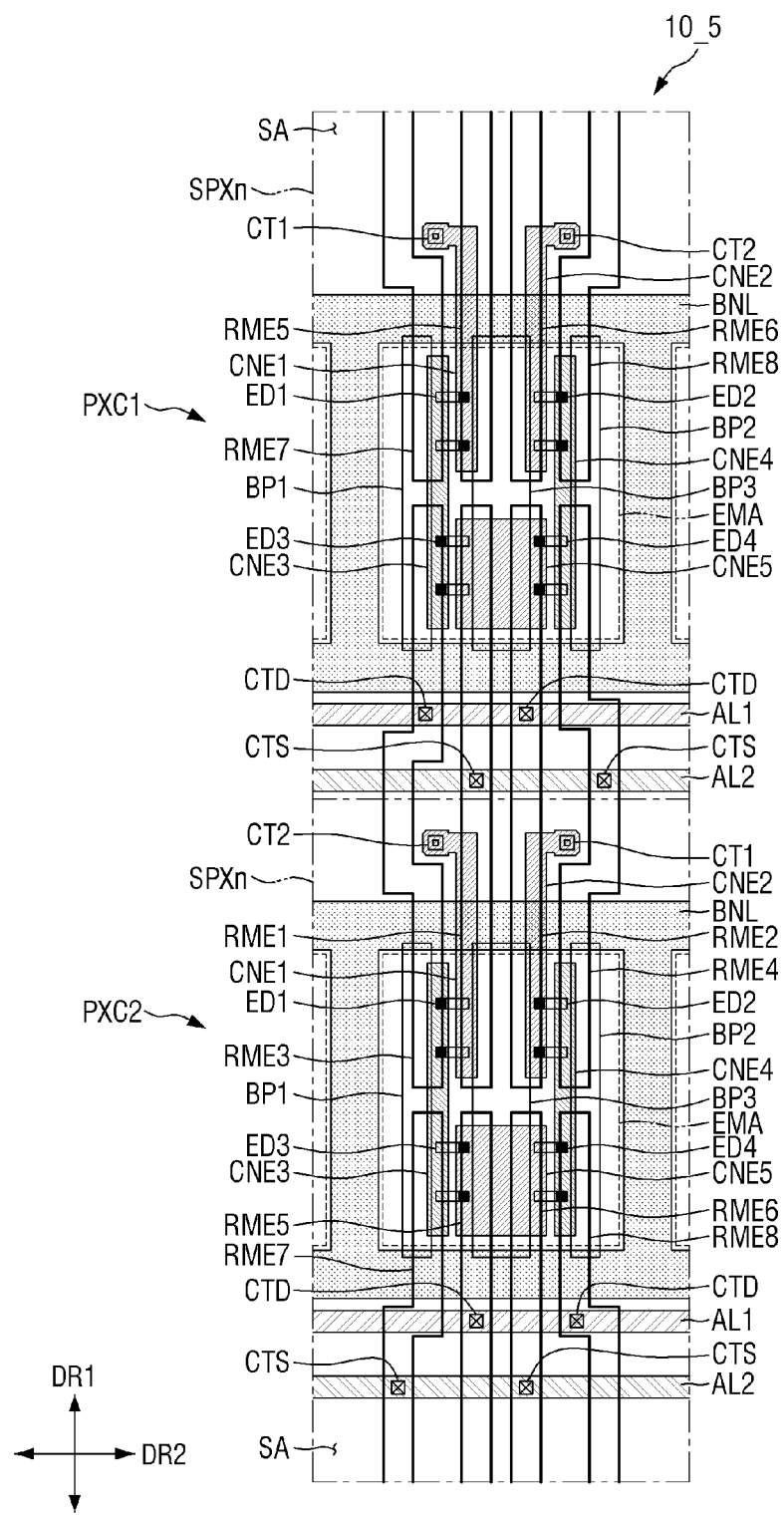
FIGS. 19 and 20 are schematic plan views illustrating layouts of electrodes, light emitting elements, and connection electrodes of pixel rows adjacent to each other in the first direction in a display device according to other embodiments.
Figure 20:
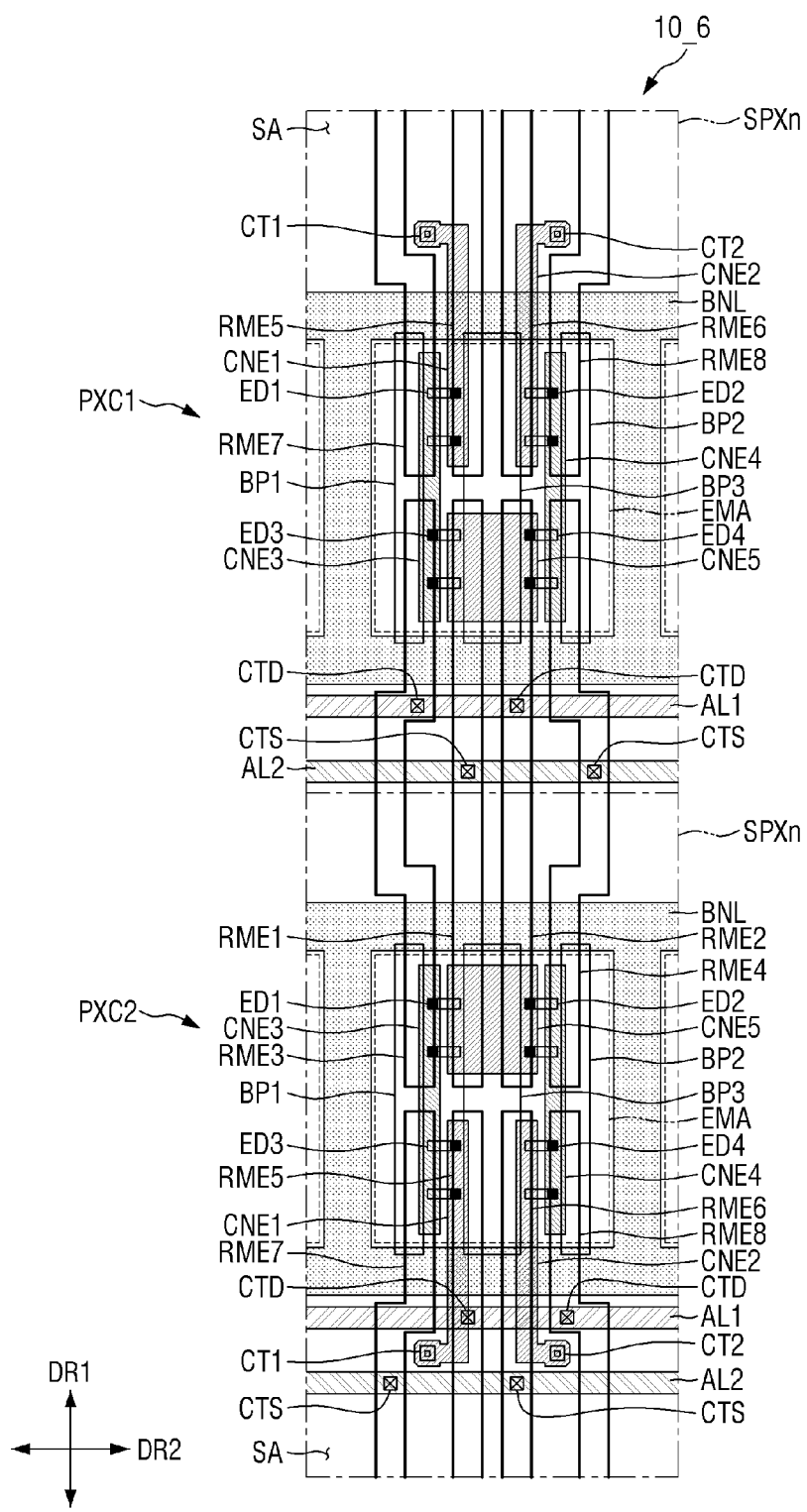

FIGS. 19 and 20 are schematic plan views illustrating layouts of electrodes, light emitting elements, and connection electrodes of pixel rows adjacent to each other in the first direction in a display device according to other embodiments.

Referring to FIGS. 19 and 20, in display devices 10_5 and 10_6 according to an embodiment, the respective electrodes RME may be disposed across different pixel rows PXC. The electrodes RME included in one electrode group may be disposed across two pixel rows PXC1 and PXC2 adjacent to each other in the first direction DR1, and electrodes RME of different electrode groups may be disposed in one pixel row PXC1 or PXC2. An embodiment of FIG. 19 and an embodiment of FIG. 20 are different from each other in that arrangements of the connection electrodes CNE are similar to those in embodiments of FIGS. 17 and 18, respectively. Hereinafter, arrangement of the electrodes RME of the display devices 10_5 and 10_6 of FIGS. 19 and 20 will be described.

Each of the display devices 10_5 and 10_6 may include a first electrode RME1, a second electrode RME2, a third electrode RME3, and a fourth electrode RME4 disposed in the first pixel row PXC1 and the second pixel row PXC2, as a first electrode group RMG1. The first to fourth electrodes RME1, RME2, RME3, and RME4 may be disposed in emission areas EMA of the pixel rows PXC1 and PXC2 adjacent to each other in the first direction DR1 and a sub-area SA between the pixel rows PXC1 and PXC2. Any one electrode RME of the first electrode group RMG1 may extend from the emission area EMA of the first pixel row PXC1 in the first direction DR1 and be disposed up to the sub-area SA and the emission area EMA of the second pixel row PXC2. In the emission area EMA of each of the pixel rows PXC1 and PXC2, electrodes RME of different electrode groups may be spaced apart from each other in the first direction DR1.

Each of the display devices 10_5 and 10_6 may include a fifth electrode RME5, a sixth electrode RME6, and a seventh electrode RME7, and an eighth electrode RME8 as a second electrode group RMG2 spaced apart from the first electrode group RMG1 in the first direction DR1. The fifth to eighth electrodes RME5, RME6, RME7, and RME8 may be disposed in the emission area EMA of the pixel rows PXC1 and PXC2 adjacent to each other in the first direction DR1 and the sub-area SA between the pixel rows PXC1 and PXC2. Any one electrode RME of the second electrode group RMG2 may extend from the emission area EMA of the first pixel row PXC1 in the first direction DR1 and be disposed up to a sub-area SA and an emission area EMA of another pixel row disposed on the upper side of the first pixel row PXC1. In another example, any one electrode RME of the second electrode group RMG2 may extend from the emission area EMA of the second pixel row PXC2 in the first direction DR1 and be disposed up to a sub-area SA and an emission area EMA of another pixel row disposed on the lower side of the second pixel row PXC2.

The first electrode RME1 and the fourth electrode RME4 of the first electrode group RMG1 may be connected (e.g., electrically connected) to the second signal line AL2 disposed in the sub-area SA between the first pixel row PXC1 and the second pixel row PXC2. The second electrode RME2 and the third electrode RME3 of the first electrode group RMG1 may be connected (e.g., electrically connected) to the first signal line AL1 disposed in the sub-area SA between the first pixel row PXC1 and the second pixel row PXC2. The fifth electrode RME5 and the eighth electrode RME8 of the second electrode group RMG2 may be connected (e.g., electrically connected) to the first signal line AL1 disposed in the sub-area SA on the lower side of the second pixel row PXC2. The sixth electrode RME6 and the seventh electrode RME7 of the second electrode group RMG2 may be connected (e.g., electrically connected) to the second signal line AL2 disposed in the sub-area SA on the lower side of the second pixel row PXC2.

Orientation directions of light emitting elements ED disposed on the first electrode group RMG1 of the first pixel row PXC1 may be substantially the same as orientation directions of light emitting elements ED disposed on the first electrode group RMG1 of the second pixel row PXC2. For example, orientation directions of third light emitting elements ED3 and fourth light emitting elements ED4 disposed on the lower side in the emission area EMA of the first pixel row PXC1 may be substantially the same as orientation directions of first light emitting elements ED1 and second light emitting elements ED2 disposed on the upper side in the emission area EMA of the second pixel row PXC2. The first end portions of these light emitting elements ED may be oriented (or face) toward the left side of the emission area EMA (e.g., toward the backward direction of the second direction DR2).

Orientation directions of light emitting elements ED disposed on the second electrode group RMG2 of the first pixel row PXC1 may be substantially the same as orientation directions of light emitting elements ED disposed on the second electrode group RMG2 of the second pixel row PXC2. For example, orientation directions of first light emitting elements ED1 and second light emitting elements ED2 disposed on the upper side in the emission area EMA of the first pixel row PXC1 may be substantially the same as orientation directions of third light emitting elements ED3 and fourth light emitting elements ED4 disposed on the lower side in the emission area EMA of the second pixel row PXC2. The first end portions of these light emitting elements ED may be oriented (or face) toward the right side of the emission area EMA (e.g., toward the forward direction of the second direction DR2).

In the display device 10_5 of FIG. 19, arrangements of the connection electrodes CNE and connection relationships between the connection electrodes CNE and the light emitting elements ED in the first pixel row PXC1 and the second pixel row PXC2 may be substantially the same as those in an embodiment of FIG. 17. In the display device 10_6 of FIG. 20, arrangements of the connection electrodes CNE and connection relationships between the connection electrodes CNE and the light emitting elements ED in the first pixel row PXC1 and the second pixel row PXC2 may be substantially the same as those in an embodiment of FIG. 18.

Figure 21:
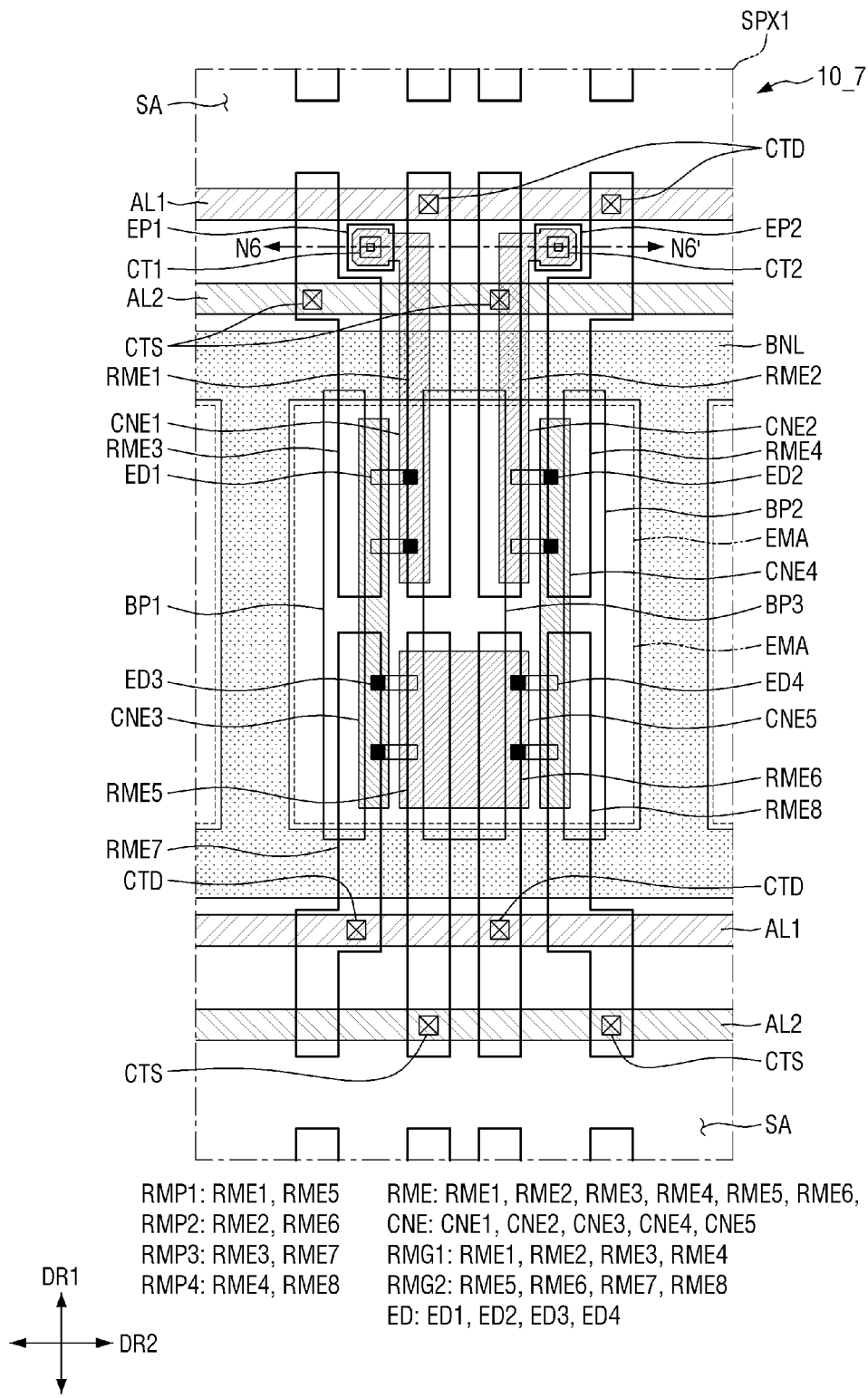
FIG. 21 is a schematic plan view illustrating a sub-pixel of a display device according to an embodiment.
Figure 22:
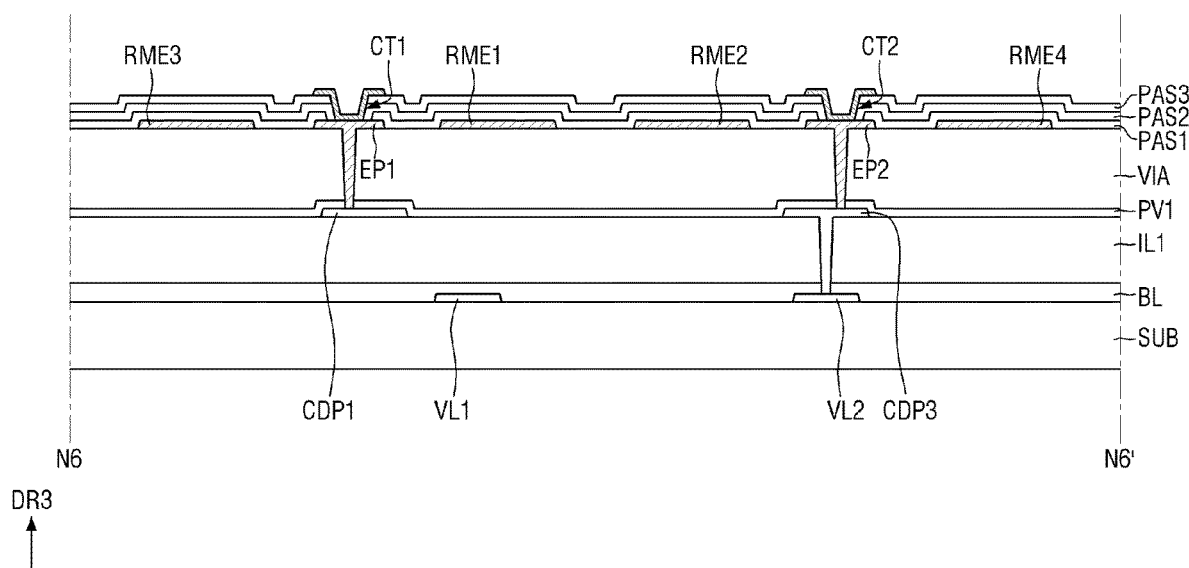
FIG. 22 is a schematic cross-sectional view taken along line N6-N6' of FIG. 21.

FIG. 21 is a schematic plan view illustrating a sub-pixel of a display device according to an embodiment. FIG. 22 is a schematic cross-sectional view taken along line N6-N6' of FIG. 21.

Referring to FIGS. 21 and 22, a display device 10_7 according to an embodiment may further include line connection electrodes EP1 and EP2 connected to the connection electrodes CNE and the conductive pattern layers of the third conductive layer. The display device 10_7 may further include a first line connection electrode EP1 disposed in the sub-area SA and disposed to overlap the first connection electrode CNE1 and a second line connection electrode EP2 disposed in the sub-area SA and disposed to overlap the second connection electrode CNE2.

The first line connection electrode EP1 and the second line connection electrode EP2 and the electrodes RME may be disposed on the same layer. For example, the first and second line connection electrodes EP1 and EP2 and the electrodes RME may include the same material. The first line connection electrode EP1 and the second line connection electrode EP2 may be disposed (e.g., directly disposed) on the via layer VIA, and the first insulation layer PAS1, the second insulation layer PAS2, and the third insulating layer PAS3 may be disposed on the first line connection electrode EP1 and the second line connection electrode EP2. The first line connection electrode EP1 and the second line connection electrode EP2 may be spaced apart from the electrodes RME adjacent to the first and second line connection electrodes EP1 and EP2, respectively.

The first line connection electrode EP1 may be in contact (e.g., directly contact) with the first conductive pattern layer CDP1 through a contact hole passing through the via layer VIA and the first passivation layer PV1. The first connection electrode CNE1 may be in contact (e.g., directly contact) with the first line connection electrode EP1 through a first contact hole CT1 passing through the first to third insulating layers PAS1, PAS2, and PAS3. The second line connection electrode EP2 may be in contact (e.g., directly contact) with the third conductive pattern layer CDP3 through a contact hole passing through the via layer VIA and the first passivation layer PV1. The second connection electrode CNE2 may be in contact (e.g., directly contact) with the second line connection electrode EP2 through a second contact hole CT2 passing through the first to third insulating layers PAS1, PAS2, and PAS3. The embodiment of FIG. 21 is different from the above-described embodiments in that the connection electrodes CNE are not in direct contact with the conductive pattern layers of the third conductive layer, and are connected (e.g., electrically connected) to the third conductive layer through the line connection electrodes EP1 and EP2, which are formed of the same layer as the electrodes RME.

Figure 23:
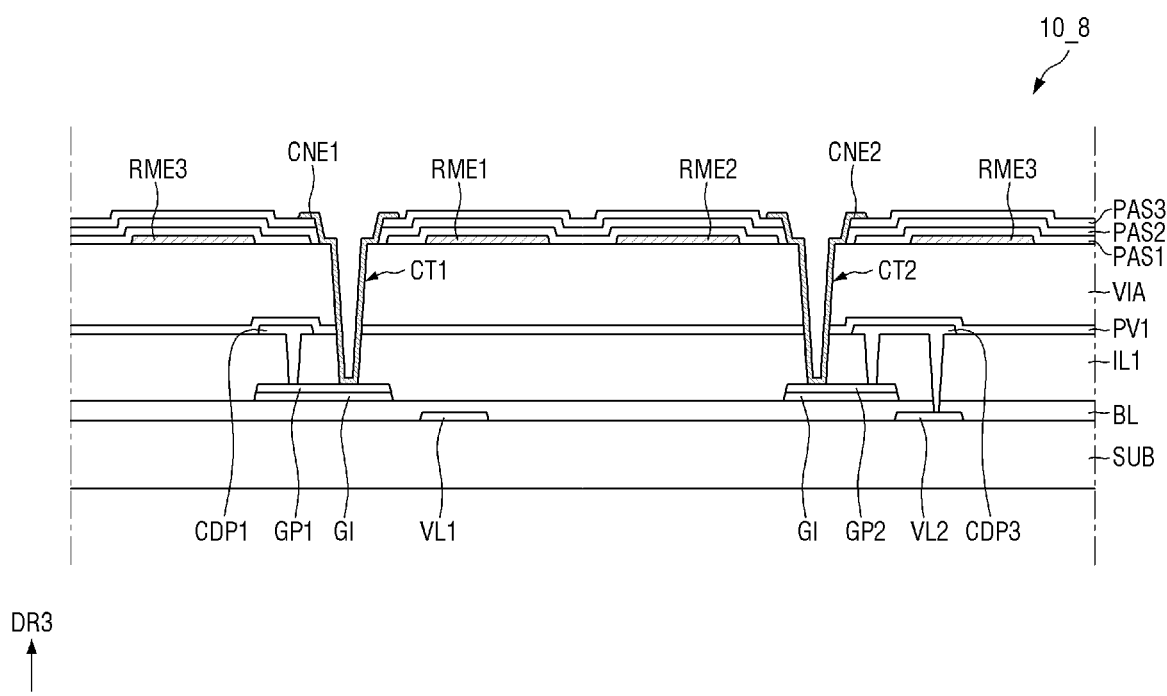
FIG. 23 is a schematic cross-sectional view illustrating a portion of a display device according to an embodiment.

FIG. 23 is a schematic cross-sectional view illustrating a portion of a display device according to an embodiment.

Referring to FIG. 23, in a display device 10_8 according to an embodiment, the connection electrodes CNE may be connected (e.g., electrically connected) to the first transistor T1 or the second voltage line VL2 through bridge pattern layers GP1 and GP2 of the second conductive layer. The display device 10_8 may further include the bridge pattern layers GP1 and GP2 formed of the second conductive layer and connected (e.g., electrically connected) to the conductive pattern layers of the third conductive layer. The first connection electrode CNE1 and the second connection electrode CNE2 may be connected (e.g., electrically connected) to the conductive pattern layers of the third conductive layer or the first transistor T1 and the second voltage line VL2 through the bridge pattern layers GP1 and GP2, respectively.

The first bridge pattern layer GP1 may be in contact (e.g., directly contact) with the first conductive pattern layer CDP1. The first connection electrode CNE1 may be connected (e.g., directly connected) to the first bridge pattern layer GP1 through the first contact hole CT1, and may be connected (e.g., electrically connected) to the first conductive pattern layer CDP1 and the first transistor T1. The second bridge pattern layer GP2 may be in contact (e.g., directly contact) with the third conductive pattern layer CDP3. The second connection electrode CNE2 may be connected (e.g., directly connected) to the second bridge pattern layer GP2 through the second contact hole CT2, and may be connected (e.g., electrically connected) to the third conductive pattern layer CDP3 and the second voltage line VL2.

Figure 24:
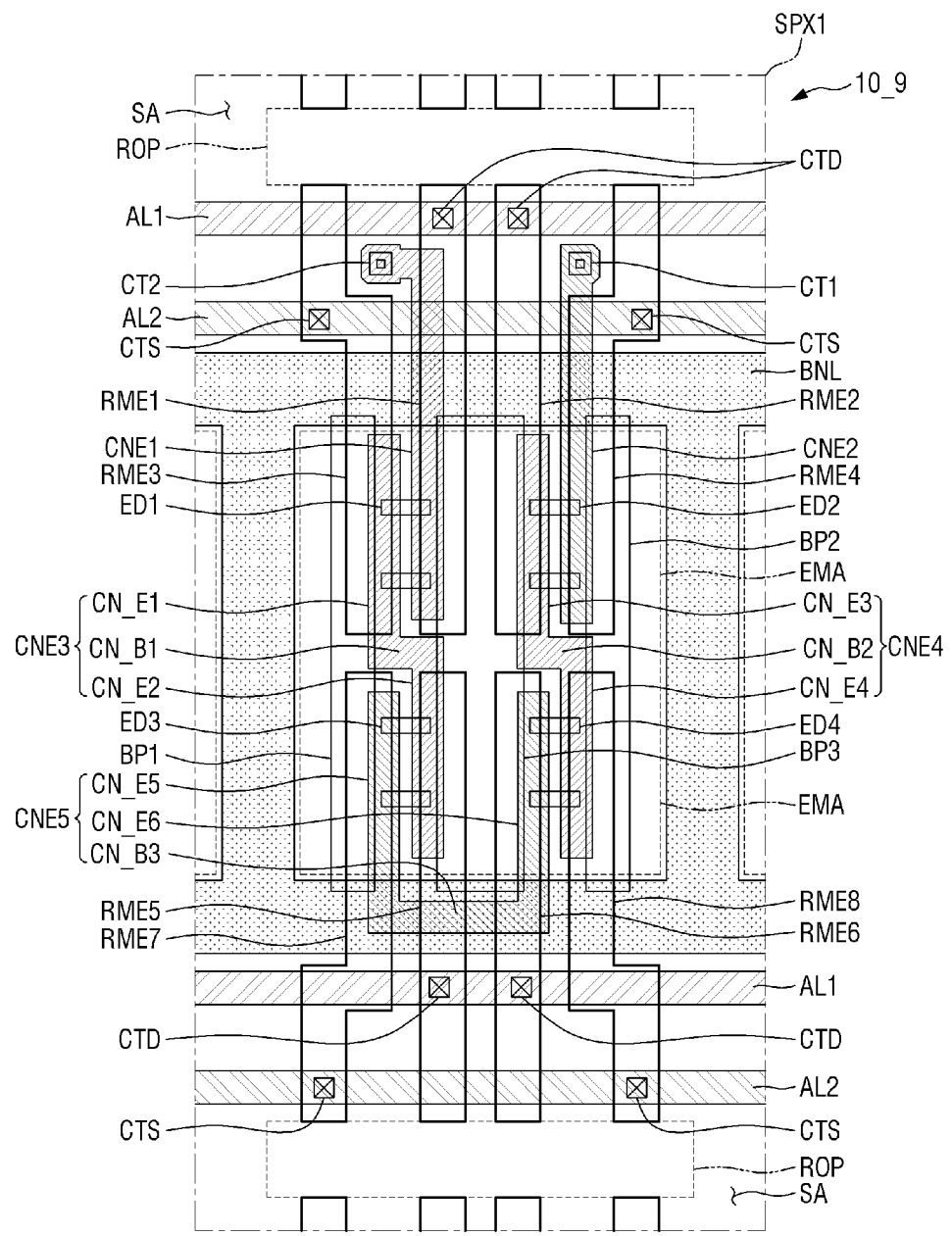
FIG. 24 is a schematic plan view illustrating a sub-pixel of a display device according to an embodiment.

FIG. 24 is a schematic plan view illustrating a sub-pixel of a display device according to an embodiment.

Referring to FIG. 24, in a display device 10_9 according to an embodiment, connections between the electrodes RME and the signal lines AL1 and AL2 and arrangements of the connection electrodes CNE may be different from those in the above-described embodiments.

In the above-described embodiments, different electrodes RME constituting the electrode pairs RMP1, RMP2, RMP3, and RMP4 may be connected (e.g., electrically connected) to different signal lines AL1 and AL2, respectively. For example, the first electrode RME1 and the fifth electrode RME5 of the first electrode pair RMP1 may be connected to the first signal line AL1 and the second signal line AL2, respectively. However, embodiments are not limited thereto, and the electrode pairs RMP1, RMP2, RMP3, and RMP4 may be respectively connected to the same signal lines AL1 and AL2.

Referring to FIG. 24, each of the first electrode RME1 and the fifth electrode RME5 of the first electrode pair RMP1 may be connected to the first signal line AL1. Each of the second electrode RME2 and the sixth electrode RME6 of the second electrode pair RMP2 may also be connected (e.g., electrically connected) to the first signal line AU. Each of the third electrode RME3 and the seventh electrode RME7 of the third electrode pair RMP3 may be connected (e.g., electrically connected) to the second signal line AL2, and each of the fourth electrode RME4 and the eighth electrode RME8 of the fourth electrode pair RMP4 may also be connected (e.g., electrically connected) to the second signal line AL2.

According to connections between the electrodes RME and the signal lines AL1 and AL2, orientation directions of the light emitting elements ED may be different from those of the above-described embodiments. For example, the first light emitting elements ED1 and the third light emitting elements ED3 may be disposed so that first end portions thereof may be oriented in the same direction, and the second light emitting elements ED2 and the fourth light emitting elements ED4 may be so that the first end portions thereof may be oriented in the same direction. For example, a direction in which the first end portions of the first light emitting elements ED1 and the third light emitting elements ED3 are oriented may be different from a direction in which the first end portions of the second light emitting elements ED2 and the fourth light emitting elements ED4 are oriented.

Pattern shapes and arrangements of the connection electrodes CNE may be changed according to the orientation directions of the light emitting elements ED. The first connection electrode CNE1 and the second connection electrode CNE2 may be disposed on the upper side with respect to the center of the emission area EMA. The first connection electrode CNE1 and the second connection electrode CNE2 may be disposed across the emission area EMA and the sub-area SA of the corresponding sub-pixel SPXn, and may be in direct contact with the third conductive layer through the contact holes CT1 and CT2 formed in the sub-area SA, respectively. The first connection electrode CNE1 may be disposed on the first electrode RME1 and be in contact (e.g., directly contact) with the first end portions of the first light emitting elements ED1, and the second connection electrode CNE2 may be disposed on the fourth electrode RME4 and be in contact (e.g., directly contact) with the second end portions of the second light emitting elements ED2.

The third connection electrode CNE3 may include a first extension part CN_E1 disposed on the third electrode RME3, a second extension part CN_E2 disposed on the fifth electrode RME5, and a first connection part CN_B1 connecting the first extension part CN_E1 and the second extension part CN_E2 to each other. The first extension part CN_E1 may be spaced apart from and face the first connection electrode CNE1 in the second direction DR2, and the second extension part CN_E2 may be spaced apart from the first connection electrode CNE1 in the first direction DR1. The first extension part CN_E1 may be disposed on the upper side of the emission area EMA of the corresponding sub-pixel SPXn, and the second extension part CN_E2 may be disposed on the lower side of the emission area EMA of the corresponding sub-pixel SPXn. The first extension part CN_E1 and the second extension part CN_E2 may be disposed in the emission area EMA. The first connection part CN_B1 may be disposed between the first electrode group RMG1 and the second electrode group RMG2 at a central portion of the emission area EMA. The third connection electrode CNE3 may have a shape substantially extending in the first direction DR1, but may have a shape being bent in the second direction DR2, and then extending again in the first direction DR1. The third connection electrode CNE3 may be disposed across the third electrode RME3 and the fifth electrode RME5. The first extension part CN_E1 may be in contact (e.g., directly contact) with the second end portions of the first light emitting elements ED1, and the second extension part CN_E2 may be in contact (e.g., directly contact) with the first end portions of the third light emitting elements ED3.

The fourth connection electrode CNE4 may include a third extension part CN_E3 disposed on the second electrode RME2, a fourth extension part CN_E4 disposed on the eighth electrode RME8, and a second connection part CN_B2 connecting the third extension part CN_E3 and the fourth extension part CN_E4 to each other. The third extension part CN_E3 may be spaced apart from and face the second connection electrode CNE2 in the second direction DR2, and the fourth extension part CN_E4 may be spaced apart from the second connection electrode CNE2 in the first direction DR1. The third extension part CN_E3 may be disposed on the upper side of the emission area EMA of the corresponding sub-pixel SPXn, and the fourth extension part CN_E4 may be disposed on the lower side of the emission area EMA of the corresponding sub-pixel SPXn. The third extension part CN_E3 and the fourth extension part CN_E4 may be disposed in the emission area EMA. The second connection part CN_B2 may be disposed between the first electrode group RMG1 and the second electrode group RMG2 to be adjacent to the center of the emission area EMA. The fourth connection electrode CNE4 may have a shape substantially extending in the first direction DR1, but may have a shape being bent in the second direction DR2, and then extending again in the first direction DR1. The fourth connection electrode CNE4 may be disposed across the second electrode RME2 and the eighth electrode RME8. The third extension part CN_E3 may be in contact (e.g., directly contact) with the first end portions of the second light emitting elements ED2, and the fourth extension part CN_E4 may be in contact (e.g., directly contact) with the second end portions of the fourth light emitting elements ED4.

The fifth connection electrode CNE5 may include a fifth extension part CN_E5 disposed on the seventh electrode RME7, a sixth extension part CN_E6 disposed on the sixth electrode RME6, and a third connection part CN_B3 connecting the fifth extension part CN_E5 and the sixth extension part CN_E6 to each other. The fifth extension part CN_E5 may be spaced apart from and face the second extension part CN_E2 of the third connection electrode CNE3 in the second direction DR2, and the sixth extension part CN_E6 may be spaced apart from and face the fourth extension part CN_E4 of the fourth connection electrode CNE4 in the second direction DR2. Each of the fifth extension part CN_E5 and the sixth extension part CN_E6 may be disposed on the lower side of the emission area EMA, and the third connection part CN_B3 may extend in the second direction DR2 on the bank layer BNL. The fifth connection electrode CNE5 may have a shape surrounding the second extension part CN_E2 of the third connection electrode CNE3 in a plan view, and may be disposed across the seventh electrode RME7 and the sixth electrode RME6. The fifth extension part CN_E5 may be in contact (e.g., directly contact) with the second end portions of the third light emitting elements ED3, and the sixth extension part CN_E6 may be in contact (e.g., directly contact) with the first end portions of the fourth light emitting elements ED4.

The third connection electrode CNE3 and the fourth connection electrode CNE4, which are the second-type connection electrodes, may be connection electrodes of which electrode extension parts extending in the first direction DR1 are not parallel to each other in the second direction DR2, and the fifth connection electrode CNE5, which is the third-type connection electrode, may be a connection electrode of which electrode extension parts extending in the first direction DR1 are parallel to each other in the second direction DR2. The third connection electrode CNE3 and the fourth connection electrode CNE4 may have a shape extending in the first direction DR1, but being bent, and the fifth connection electrode CNE5 may have a shape surrounding a portion of the other connection electrode.

Figure 25:
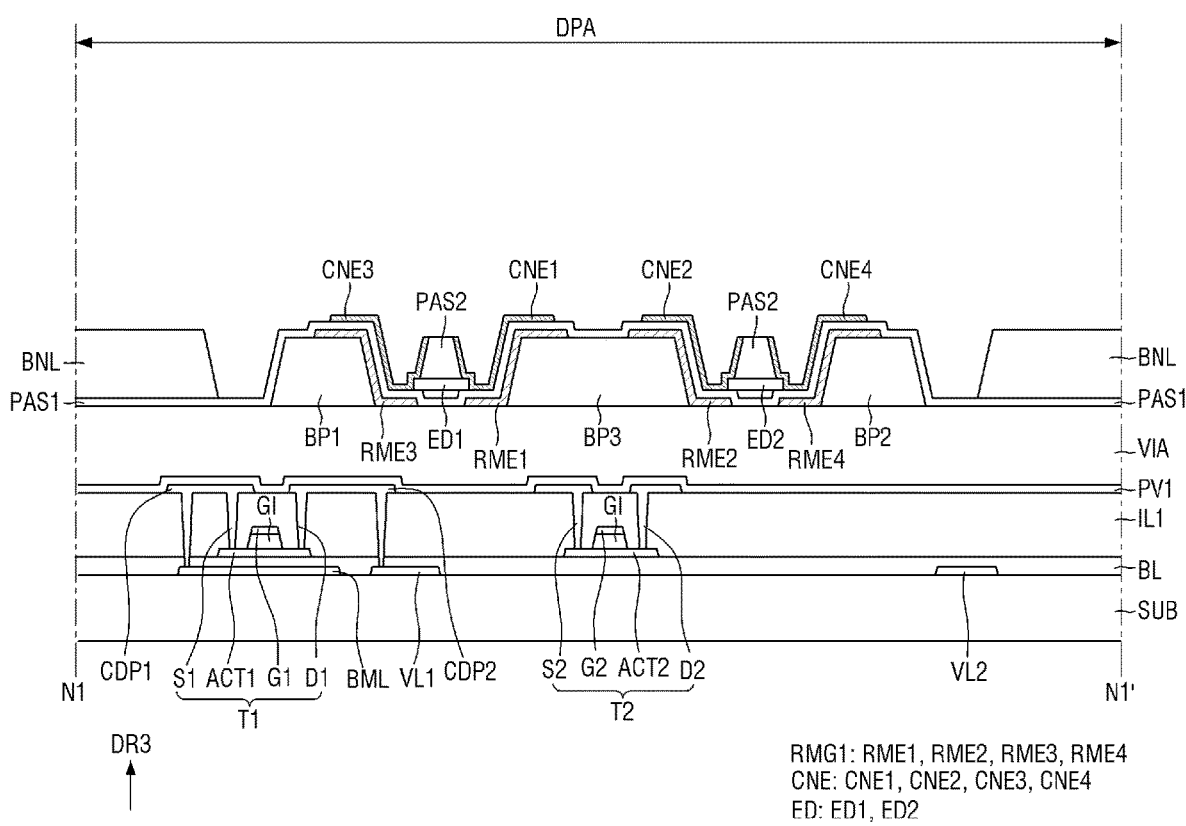
FIG. 25 is a schematic cross-sectional view of a portion of a display device according to an embodiment.

FIG. 25 is a schematic cross-sectional view of a portion of a display device according to an embodiment.

Referring to FIG. 25, in a display device 10, the third insulating layer PAS3 may be omitted, and connection electrodes CNE1, CNE2, CNE3, and CNE4 may be disposed on the same layer. The embodiment of FIG. 25 is different in arrangements of the connection electrode layers from an embodiment of FIG. 7.

In the display device 10 according to an embodiment, the second insulating layer PAS2 may be disposed only on the light emitting elements ED1 and ED2. As compared with an embodiment of FIG. 7, the second insulating layer PAS2 may have a shape of patterns extending in the first direction DR1 between the walls BP1, BP2, and BP3. The second insulating layer PAS2 may be disposed so as not to overlap the electrodes RME and the bank layer BNL. In some embodiments, the second insulating layer PAS2 may include an organic insulating material, and may have a greater thickness than an embodiment of FIG. 7.

The connection electrodes CNE1, CNE2, CNE3, and CNE4 may be in contact (e.g., directly contact) with the light emitting elements ED1 and ED2, and be disposed on side surfaces of the second insulating layer PAS2. As compared with an embodiment of FIG. 7, the connection electrodes CNE1, CNE2, CNE3, and CNE4 spaced apart from each other may be formed in the same process, and may be disposed on substantially the same layer or at the same level. For example, the fifth connection electrode CNE5 of FIG. 8 and the other connection electrodes may also be disposed on the same layer or at the same level.

The embodiment may have an advantage that the connection electrodes CNE1, CNE2, CNE3, and CNE4 may be disposed on the same layer by changing the material of the second insulating layer PAS2, and the number of manufacturing processes may be decreased because the third insulating layer PAS3 is omitted.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
    a plurality of first group electrodes extending in a first direction and spaced apart from each other in a second direction;
    a plurality of second group electrodes extending in the first direction and spaced apart from each other in the second direction, the plurality of second group electrodes spaced apart from the plurality of first group electrodes in the first direction, respectively;
    a plurality of light emitting elements disposed on the plurality of first group electrodes and the plurality of second group electrodes, the plurality of light emitting elements spaced apart from each other in the second direction;
    a first connection electrode and a second connection electrode disposed on at least one of the plurality of first group electrodes and extending in the first direction;
    a third connection electrode and a fourth connection electrode disposed on the at least one of the plurality of first group electrodes and at least one of the plurality of second group electrodes and extending in the first direction; and
    a fifth connection electrode disposed on at least two electrodes of the plurality of second group electrodes and spaced apart from the first connection electrode and the second connection electrode in the first direction,
    wherein
    each of the first connection electrode, the second connection electrode, the third connection electrode, the fourth connection electrode, and the fifth connection electrode is in contact with at least one of the light emitting elements, and
    each of the first connection electrode, the second connection electrode, and the fifth connection electrode is disposed between the third connection electrode and the fourth connection electrode in the second direction,
    wherein
    the plurality of first group electrodes include:
        a first electrode;
        a second electrode spaced apart from the first electrode in the second direction;
        a third electrode spaced apart from the first electrode in an opposite direction of the second direction; and
        a fourth electrode spaced apart from the second electrode in second direction, and
    the plurality of second group electrodes includes:
        a fifth electrode spaced apart from the first electrode in the first direction;
        a sixth electrode spaced apart from the second electrode in the first direction;
        a seventh electrode spaced apart from the third electrode in the first direction; and
        an eighth electrode spaced apart from the fourth electrode in the first direction,
    the light emitting elements include:
        first light emitting elements disposed on the first electrode and the third electrode;
        second light emitting elements disposed on the second electrode and the fourth electrode;
        third light emitting elements disposed on the fifth electrode and the seventh electrode; and
        fourth light emitting elements disposed on the sixth electrode and the eighth electrode,
    the first connection electrode is in contact with first end portions of the first light emitting elements,
    the second connection electrode is in contact with second end portions of the second light emitting elements,
    the third connection electrode is in contact with second end portions of the first light emitting elements and first end portions of the third light emitting elements,
    the fourth connection electrode is in contact with first end portions of the second light emitting elements and second end portions of the fourth light emitting elements, and
    the fifth connection electrode is in contact with second end portions of the third light emitting elements and first end portions of the fourth light emitting elements.

2. The display device of claim 1, wherein a width of the fifth connection electrode in the second direction is greater than widths of the first connection electrode, the second connection electrode, the third connection electrode, and the fourth connection electrode in the second direction.

3. The display device of claim 1, wherein lengths of the third connection electrode and the fourth connection electrode in the first direction are greater than lengths of the first connection electrode, the second connection electrode, and the fifth connection electrode in the first direction.

4. The display device of claim 1, further comprising:
a bank layer surrounding an emission area in which the light emitting elements are disposed, the bank layer including portions extending in the first direction and the second direction, wherein
the first connection electrode and the second connection electrode extend from the emission area beyond the bank layer in the first direction.

5. The display device of claim 1, wherein
the first connection electrode is disposed on the first electrode,
the second connection electrode is disposed on the second electrode,
the third connection electrode is disposed on the third electrode and the seventh electrode,
the fourth connection electrode is disposed on the fourth electrode and the eighth electrode, and
the fifth connection electrode is disposed on the fifth electrode and the sixth electrode.

6. The display device of claim 1, further comprising:
a first wall and a second wall extending in the first direction and spaced apart from each other in the second direction; and
a third wall disposed between the first wall and the second wall, wherein
the light emitting elements are disposed between the first wall and the third wall or between the third wall and the second wall.

7. The display device of claim 6, wherein
the first electrode, the second electrode, the fifth electrode, and the sixth electrode overlap the third wall,
the third electrode and the seventh electrode overlap the first wall, and
the fourth electrode and the eighth electrode overlap the second wall.

8. The display device of claim 1, wherein
the first light emitting elements and the second light emitting elements include first end portions oriented toward the second direction, and
the third light emitting elements and the fourth light emitting elements include first end portions oriented toward the opposite direction of the second direction.

9. The display device of claim 1, further comprising:
a first signal line and a second signal line extending in the second direction and spaced apart from each other in the first direction, wherein
each of the plurality of first group electrodes and the plurality of second group electrodes is electrically connected to the first signal line or the second signal line.

10. The display device of claim 9, wherein
one electrode of two adjacent electrodes, among the plurality of first group electrodes and the plurality of second group electrodes, adjacent to each other in the second direction is electrically connected to the first signal line, and
another electrode of the two adjacent electrodes is electrically connected to the second signal line.

11. The display device of claim 9, wherein
a pair of electrodes, among the plurality of first group electrodes and the plurality of second group electrodes, parallel to each other in the first direction,
one electrode of the pair of electrodes is electrically connected to the first signal line, and
another electrode of the pair of electrodes is electrically connected to the second signal line.

12. The display device of claim 1, wherein the first connection electrode, the second connection electrode, and the fifth connection electrode are disposed on a layer different from a layer on which the third connection electrode and the fourth connection electrode are disposed.

13. The display device of claim 1, wherein the first connection electrode, the second connection electrode, the third connection electrode, the fourth connection electrode, and the fifth connection electrode are disposed on a same layer.

14. A display device comprising:
a plurality of pixels arranged in a first direction and a second direction intersecting the first direction, wherein
each of the plurality of pixels includes:
a plurality of electrode pairs spaced apart from each other in the second direction, each of the plurality of electrode pairs including a pair of electrodes extending in the first direction and spaced apart from each other in the first direction;
a plurality of light emitting elements disposed on the plurality of electrodes pairs;
first-type connection electrodes disposed on one electrode of the pair of electrodes of each of the plurality of electrode pairs;
second-type connection electrodes disposed on another electrode of the pair of electrodes of each of the plurality of electrode pairs; and
a third-type connection electrode spaced apart from the first-type connection electrodes in the first direction,
the first-type connection electrodes and the third-type connection electrode are disposed between the second-type connection electrodes in the second direction,
the first-type connection electrodes are in contact with end portions of some of the light emitting elements,
the second-type connection electrodes are disposed on the pair of electrodes of each of the plurality of electrode pairs and are in contact with the light emitting elements spaced apart from each other in the first direction,
the third-type connection electrode is disposed on two different electrode pairs and is in contact with the light emitting elements spaced apart from each other in the second direction,
the plurality of electrode pairs include:
a first electrode pair;
a second electrode pair spaced apart from the first electrode pair in the second direction;
a third electrode pair spaced apart from the first electrode pair in an opposite direction of the second direction; and
a fourth electrode pair spaced apart from the second electrode pair in the second direction,
the light emitting elements include:
first light emitting elements disposed on one electrode of each of the first electrode pair and the third electrode pair;

second light emitting elements disposed on one electrode of each of the second electrode pair and the fourth electrode pair;

third light emitting elements disposed on another electrode of each of the first electrode pair and the third electrode pair; and fourth light emitting elements disposed on another electrode of each of the second electrode pair and the fourth electrode pair, the first-type connection electrodes include:

a first connection electrode in contact with the first light emitting elements, and a second connection electrode in contact with the second light emitting elements, the second-type connection electrodes include:

a third connection electrode in contact with the first light emitting elements and the third light emitting elements; and a fourth connection electrode in contact with the second light emitting elements and the fourth light emitting elements, and the third-type connection electrode is in contact with the third light emitting elements and the fourth light emitting elements.

15. The display device of claim 14, wherein the plurality of pixels include a first pixel row in which first end portions of the first light emitting elements and first end portions of the second light emitting elements are oriented toward the second direction and first end portions of the third light emitting elements and first end portions of the fourth light emitting elements are oriented toward the opposite direction of the second direction.

16. A display device comprising:

a plurality of pixels arranged in a first direction and a second direction intersecting the first direction, wherein each of the plurality of pixels includes:

a plurality of electrode pairs spaced apart from each other in the second direction, each of the plurality of electrode pairs including a pair of electrodes extending in the first direction and spaced apart from each other in the first direction;

a plurality of light emitting elements disposed on the plurality of electrodes pairs;

first-type connection electrodes disposed on one electrode of the pair of electrodes of each of the plurality of electrode pairs;

second-type connection electrodes disposed on another electrode of the pair of electrodes of each of the plurality of electrode pairs; and a third-type connection electrode spaced apart from the first-type connection electrodes in the first direction, the first-type connection electrodes and the third-type connection electrode are disposed between the second-type connection electrodes in the second direction, the first-type connection electrodes are in contact with end portions of some of the light emitting elements, the second-type connection electrodes are disposed on the pair of electrodes of each of the plurality of electrode pairs and are in contact with the light emitting elements spaced apart from each other in the first direction, the third-type connection electrode is disposed on two different electrode pairs and is in contact with the light emitting elements spaced apart from each other in the second direction, the plurality of electrode pairs include:

a first electrode pair;

a second electrode pair spaced apart from the first electrode pair in the second direction;

a third electrode pair spaced apart from the first electrode pair in an opposite direction of the second direction; and a fourth electrode pair spaced apart from the second electrode pair in the second direction, the light emitting elements include:

first light emitting elements disposed on one electrode of each of the first electrode pair and the third electrode pair;

second light emitting elements disposed on one electrode of each of the second electrode pair and the fourth electrode pair;

third light emitting elements disposed on another electrode of each of the first electrode pair and the third electrode pair; and fourth light emitting elements disposed on another electrode of each of the second electrode pair and the fourth electrode pair, the plurality of pixels include a first pixel row in which first end portions of the first light emitting elements and first end portions of the second light emitting elements are oriented toward the second direction and first end portions of the third light emitting elements and first end portions of the fourth light emitting elements are oriented toward the opposite direction of the second direction, and the plurality of pixels include a second pixel row adjacent to the first pixel row, the second pixel row in which first end portions of the first light emitting elements and first end portions of the second light emitting elements are oriented toward the opposite direction of the second direction and first end portions of the third light emitting elements and first end portions of the fourth light emitting elements are oriented toward the second direction.

17. The display device of claim 14, wherein the plurality of pixels include:

a first pixel row in which the first-type connection electrodes are disposed on one side of the third-type connection electrode in the first direction; and a second pixel row in which the first-type connection electrodes are disposed on another side of the third-type connection electrode in the first direction.

* * * * *